(12) United States Patent
Ueda et al.

(10) Patent No.: US 7,795,801 B2
(45) Date of Patent: Sep. 14, 2010

(54) ORGANIC ELECTROLUMINESCENT ELEMENT, ILLUMINATOR, DISPLAY AND COMPOUND

(75) Inventors: Noriko Ueda, Hino (JP); Taketoshi Yamada, Saitama (JP); Hiroshi Kita, Hachioji (JP); Mitsuhiro Fukuda, Chofu (JP)

(73) Assignee: Konica Minolta Holdings, Inc., Tokyo (JP)

( * ) Notice: Subject to any disclaimer, the term of this patent is extended or adjusted under 35 U.S.C. 154(b) by 404 days.

(21) Appl. No.: 10/946,499

(22) Filed: Sep. 21, 2004

(65) Prior Publication Data

US 2005/0069729 A1   Mar. 31, 2005

(30) Foreign Application Priority Data

Sep. 30, 2003   (JP) ............................... 2003-339583

(51) Int. Cl.
*H01L 51/54* (2006.01)
*C09K 11/06* (2006.01)
*C07D 209/82* (2006.01)

(52) U.S. Cl. ................. 313/504; 428/690; 428/917; 313/506; 257/40; 257/E51.049; 257/E51.05; 257/E51.051; 548/440; 548/448

(58) Field of Classification Search .......... None
See application file for complete search history.

(56) References Cited

U.S. PATENT DOCUMENTS

| 6,551,723 | B1 * | 4/2003 | Okada et al. | 428/690 |
| 6,709,772 | B2 * | 3/2004 | Hasegawa et al. | 548/440 |
| 2003/0091861 | A1 * | 5/2003 | Okada et al. | 428/690 |
| 2004/0058194 | A1 * | 3/2004 | Stossel et al. | 428/690 |
| 2004/0086745 | A1 * | 5/2004 | Iwakuma et al. | 428/690 |
| 2004/0115476 | A1 * | 6/2004 | Oshiyama et al. | 428/690 |

FOREIGN PATENT DOCUMENTS

JP   2003-231692   *   8/2003

OTHER PUBLICATIONS

Machine assisted translation, JP 2003-231692, Tokito et al.*

* cited by examiner

*Primary Examiner*—D. Lawrence Tarazano
*Assistant Examiner*—Brett A Crouse
(74) *Attorney, Agent, or Firm*—Frishauf, Holtz, Goodman & Chick, P.C.

(57) ABSTRACT

An organic electroluminescent element comprising a light emission layer and a hole blocking layer adjacent to the light emission layer, wherein, (i) the light emission layer contains a compound having a specified partial structure and having a molecular weight of not more than 1700; and (ii) the hole blocking layer contains a derivative selected from the group consisting of a styryl derivative, a boron derivative and a carboline derivative.

14 Claims, 5 Drawing Sheets

LIGHT

LIGHT

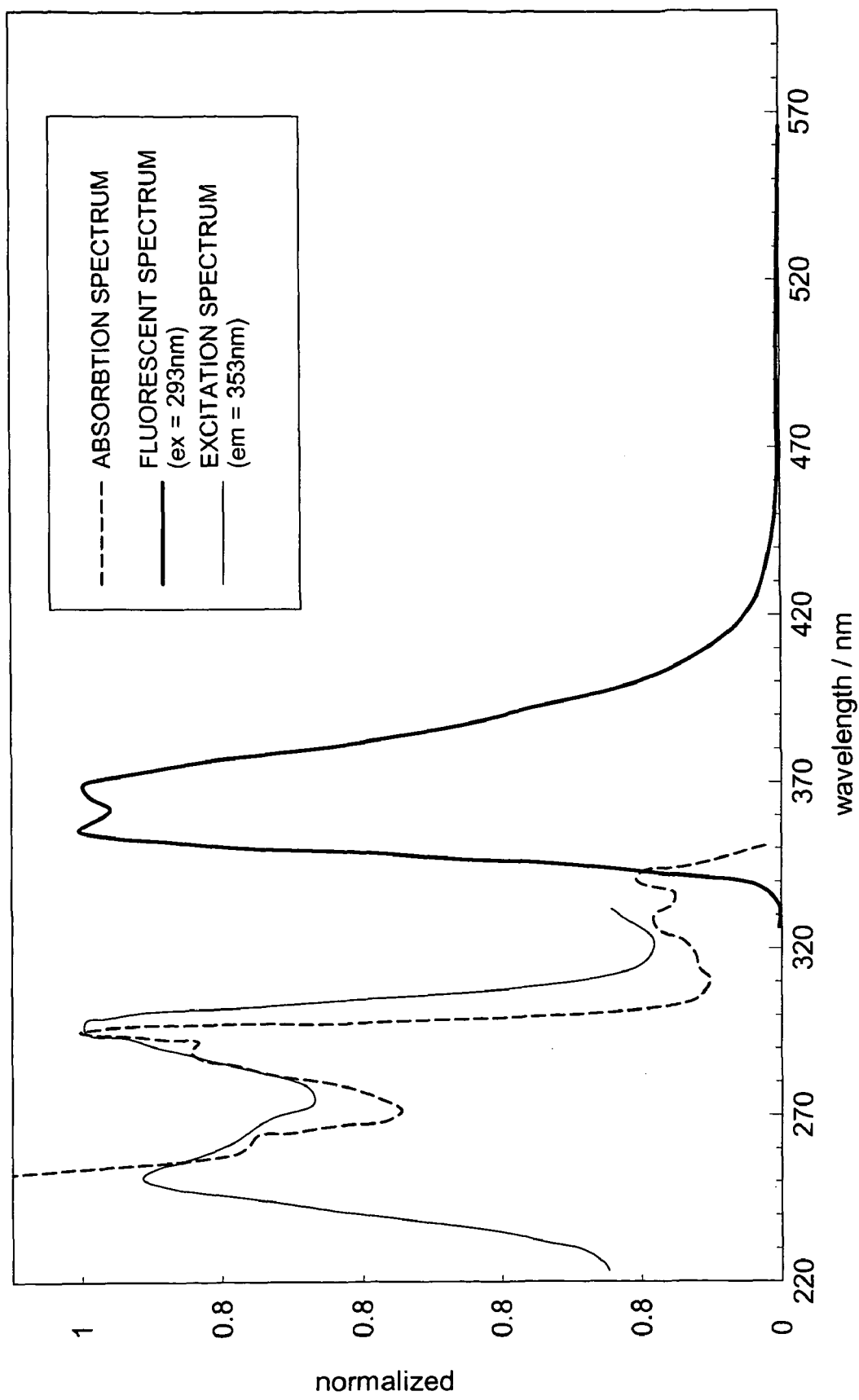

ORGANIC ELECTROLUMINESCENT ELEMENT, ILLUMINATOR, DISPLAY AND COMPOUND

TECHNICAL FIELD

The present invention relates to an organic electroluminescent element, an illuminator and display using the organic electroluminescent element and to compounds for materials of the electroluminescent element.

BACKGROUND OF THE INVENTION

As an emission type electronic displaying device, there is an electroluminescent device (ELD). As elements constituting the ELD, there is an inorganic electroluminescent element or an organic electroluminescent element (hereinafter referred to also as organic EL element). The inorganic electroluminescent element has been used for a surface illuminant, however a high voltage alternating electric power has been required to drive the element.

An organic EL element has a structure in which a light emission layer containing a light emission compound is provides between a cathode and an anode, and an electron and a hole are injected into the light emission layer and recombined to form an exciton. The element emits light utilizing light (fluorescent light or phosphorescent light) generated by inactivation of the exciton, and the element can emit light only by applying a relatively low voltage of from several volts to several decade volts. A display using an organic EL element has a wide viewing angle and a high visuality since the element is of self light emission type. Further, the element is a thin, complete solid element, and therefore, the element has attracted attention from the viewpoint of space saving and portability.

For practical use in the near future, an organic EL element exhibiting high emission intensity, high efficiency and low power consumption is required. For example, the following methods are disclosed in the prior art: (i) an EL element using stilbene derivatives, distyrylarylene derivatives or tristyrylarylene derivatives, doped with a slight amount of a fluorescent compound, to increase emission intensity and to attain long life of the element (for example, Patent Document 1); (ii) an EL element which comprises an organic light emission layer containing an 8-hydroxyquinoline aluminum complex as a host compound doped with a slight amount of a fluorescent compound (for example, Patent Document 2); and (iii) an EL element which comprises an organic light emission layer containing an 8-hydroxyquinoline aluminum complex as a host compound doped with a quinacridone type dye (for example, Patent Document 3).

When light emitted through excited singlet state is used in the element disclosed in the above Patent documents, the upper limit of the external quantum efficiency ($\eta_{ext}$) is considered to be at most 5%, since the generation ratio of singlet excited species to triplet excited species is 1 to 3, which results in that the generation probability of excited species capable of emitting light is 25%, and further, external light emission efficiency is 20%.

Since an organic EL element, employing phosphorescence through the excited triplet, was reported by Princeton University (for example, see M. A. Baldo et al., Nature, 395, p. 151-154 (1998)), study on materials emitting phosphorescence at room temperature has been actively made (for example, see Non-Patent Document 2 or Patent Document 4).

As the upper limit of the internal quantum efficiency of the excited triplet is 100%, the light emission efficiency of the exited triplet is theoretically four times that of the excited singlet. Accordingly, light emission employing the excited triplet exhibits almost the same performance as a cold cathode tube, and can be applied to illumination.

In order to improve the emission intensity and the emission life of an organic EL element, formation of a positive hole (hereinafter also referred to as a hole) blocking layer between an cathode and a light emission layer has been proposed. The formation of a hole blocking layer helps accumulating holes in a light emission layer resulting in improving a recombination rate of a hole and an electron which also results in attaining a higher emission efficiency. It has been reported that a single use of a phenanthroline derivative or a triazole derivative is effective as a hole blocking material (for example, Patent Documents 5 and 6). Also, a long life organic EL element have been prepared by using a certain specified aluminum complex as a hole blocking layer (for example, Patent Document 7).

By introducing a hole blocking layer in an green organic EL element using a phosphorescent material, an internal quantum efficiency of almost 100% and a life of 20,000 hours have been attained (for example, Non-Patent Document 3), however, problems still remain in view of emission intensity.

In a case when a blue—blue green phosphorescent compound is used as a dopant, an organic EL element in which a carbazole derivative like CBP is used as a host material have been reported (non-Patent Document 4), however, the external quantum efficiency is around 6%, which is not fully satisfactory, so that an improvement is required. As for a blue organic EL element in which an emission of a fluorescent compound is used and a connecting group is introduced in a biaryl site of a carbazole derivative existing in a center of the molecule, an organic EL element being excellent in color purity and exhibiting a long life has been prepared (for example, Patent Document 8). A longer life of an organic EL element has been attained when a certain specified five-coordinate metal complex is used in a hole blocking layer in addition to the above mentioned compound and a phosphorescent compound is used as a dopant (for example, Patent Document 9).

Other organic EL elements using a carbazole derivative have been proposed (for example Patent Documents 10-21), however, the carbazole derivatives disclosed in the above patent documents have not been fully satisfactory in giving an organic EL element exhibiting an emission efficiency and a heat resistance suitable for practical use. Development of an organic EL element giving a higher emission intensity with a lower electric power consumption and giving a longer life is desired.

(Patent Documents 1)
Japanese Pat. No. 3093796
(Patent Documents 2)
Japanese Patent Publication Open to Public Inspection (hereinafter referred to as JP-A) No. 63-264692
(Patent Documents 3)
JP-A No. 3-255190
(Patent Documents 4)
U.S. Pat. No. 6,097,147
(Patent Documents 5)
JP-A No. 8-109373
(Patent Documents 6)
JP-A No. 10-233284
(Patent Documents 7)
JP-A No. 2001-284056
(Patent Documents 8)
JP-A No. 2000-21572

(Patent Documents 9)
JP-A No. 2002-8860
(Patent Documents 10)
JP-A No. 2002-203663
(Patent Documents 11)
JP-A No. 8-3547
(Patent Documents 12)
JP-A No. 8-143861
(Patent Documents 13)
JP-A No. 8-143862
(Patent Documents 14)
JP-A No. 9-249876
(Patent Documents 15)
JP-A No. 11-144866
(Patent Documents 16)
JP-A No. 11-144867
(Patent Documents 17)
JP-A No. 8-60144
(Patent Documents 18)
JP-A No. 2002-8860
(Patent Documents 19)
JP-A No. 2003-77674
(Patent Documents 20)
WO No. 03/50201
(Patent Documents 21)
JP-A No. 2003-231692
(Non-Patent Documents 1)
M. A. Baldo et al., Nature, 395, 151-154 (1998)
(Non-Patent Documents 2)
M. A. Baldo et al., Nature, 403(17), 750-753 (2000)
(Non-Patent Documents 3)
The 62nd Japan Society of Applied Physics academic Meeting, draft 12-a-M7; and Pioneer technical-information magazine, Vol. 11, No. 1
(Non-Patent Documents 4)
The 62nd Japan Society of Applied Physics academic Meeting, draft 12-a-M8

SUMMARY OF THE INVENTION

An object of the present invention is to provide an organic EL element exhibiting a high emission intensity, a high emission efficiency, a long life and a superior heat resistance when the organic EL element kept under a higher temperature and to provide an illuminator and a display using the organic EL element.

One embodiment of the present invention is an organic electroluminescent element containing a light emission layer and a hole blocking layer adjacent to the light emission layer, wherein, (i) the light emission layer contains a specific compound and (ii) the hole blocking layer contains another specific compound.

BRIEF DESCRIPTION OF THE DRAWINGS

FIG. 8 is a chart giving spectra of a compound of the present invention.

DESCRIPTION OF THE PREFERRED EMBODIMENTS

Figure 1:
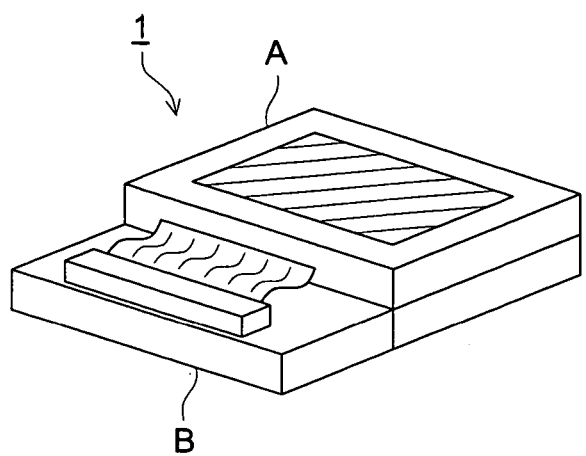
FIG. 1 is a schematic drawing of one example of a display including an organic EL element.

The object of the present invention is achieved by the following structures:

1. An embodiment of the present invention includes an organic electroluminescent element comprising a light emission layer and a hole blocking layer adjacent to the light emission layer, wherein:

(i) the light emission layer contains a compound having a partial structure represented by Formula (1) and having a molecular weight of not more than 1700; and (ii) the hole blocking layer contains a derivative selected from the group consisting of a styryl derivative, a boron derivative and a carboline derivative,

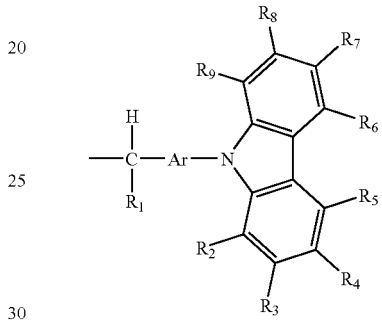

Formula (1)

wherein:

Ar represents an aryl group or a heteroaryl group;

$R_2$-$R_9$ independently represent a hydrogen atom or a substituent, provided that any groups of $R_2$-$R_9$ may be combined with each other to form a ring; and $R_1$ represents a hydrogen atom, an alkyl group or a cycloalkyl group.

2. Another embodiment of the present invention includes the organic electroluminescent element of Item 1, wherein Ar in Formula (1) represents a phenyl group.

3. Another embodiment of the present invention includes the organic electroluminescent element of Item 1 or Item 2, wherein $R_1$ in Formula (1) represents a hydrogen atom.

4. Another embodiment of the present invention includes an organic electroluminescent element comprising a light emission layer and a hole blocking layer adjacent to the light emission layer, wherein:

(i) the light emission layer contains a compound having a partial structure represented by following Formula (1a) and having a molecular weight of not more than 1700; and (ii) the hole blocking layer contains a derivative selected from the group consisting of a styryl derivative, a boron derivative a carboline derivative,

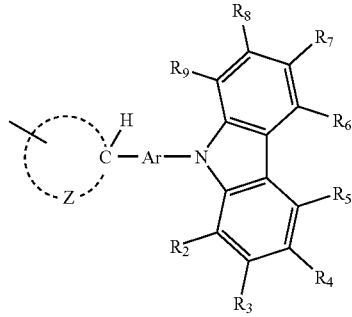

Formula (1a)

wherein:

Ar represents an aryl group or a heteroaryl group;

$R_2$-$R_9$ independently represent a hydrogen atom or a substituent, provided that any groups of $R_2$-$R_9$ may be combined with each other to form a ring; and Z represents an group of atoms which form a saturated hydrocarbon ring having 3-8 carbon atoms.

5. Another embodiment of the present invention includes the organic electroluminescent element of Item 4, wherein Ar in Formula (1a) represents a phenyl group.

6. Another embodiment of the present invention includes the organic electroluminescent element of Item 4 or Item 5, wherein Z in Formula (1a) represents a cyclohexane ring.

7. Another embodiment of the present invention includes the organic electroluminescent element of any one of Items 1-6, wherein the hole blocking layer contains a compound selected the group consisting of compounds represented in Formulae (2)-(10):

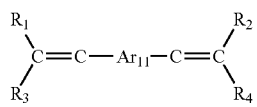

Formula (2)

wherein:

$R_1$ and $R_2$ independently represent an alkyl group, an alkoxyl group, a cyano group or an aryl group;

$R_3$ and $R_4$ independently represent a heterocyclic group or an aryl group;

$R_1$ and $R_3$, or $R_2$ and $R_4$ may be combined with each other to form a ring; and $Ar_{11}$ represents an arylene group,

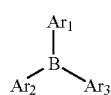

Formula (3)

wherein $R_1$-$R_3$ independently represent an aryl group or an aromatic heterocyclic group,

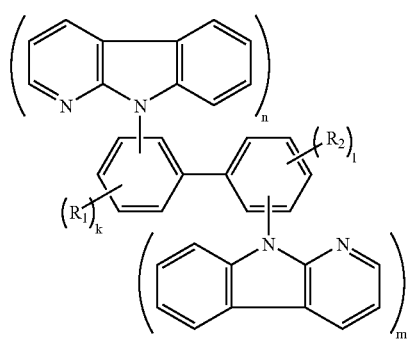

Formula (4)

wherein:

$R_1$ and $R_2$ independently represent a hydrogen atom or a substituent; and n and m independently represent an integer of 1-2 and k and l independently represent an integer of 3-4, provided that the following equations are satisfied:

$n+k=5$ and $l+m=5$,

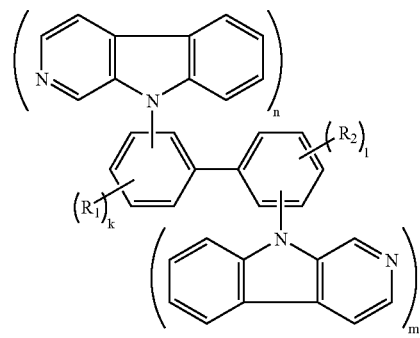

Formula (5)

wherein:

$R_1$ and $R_2$ independently represent a hydrogen atom or a substituent; and n and m independently represent an integer of 1-2 and k and l independently represent an integer of 3-4, provided that the following equations are satisfied:

$n+k=5$ and $l+m=5$,

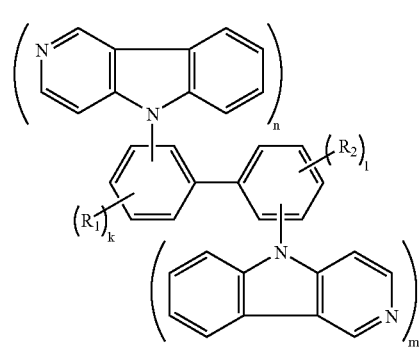

Formula (6)

wherein:

$R_1$ and $R_2$ independently represent a hydrogen atom or a substituent; and n and m independently represent an integer of 1-2 and k and l independently represent an integer of 3-4, provided that the following equations are satisfied:

$n+k=5$ and $l+m=5$,

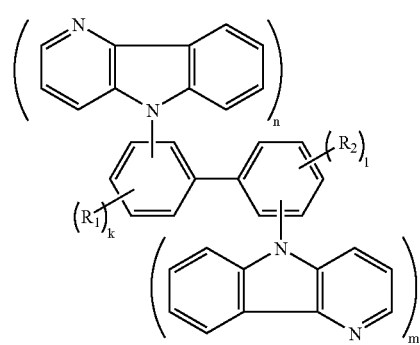

Formula (7)

wherein:

$R_1$ and $R_2$ independently represent a hydrogen atom or a substituent; and n and m independently represent an integer of 1-2 and k and l independently represent an integer of 3-4, provided that the following equations are satisfied:

$n+k=5$ and $l+m=5$,

Formula (8)

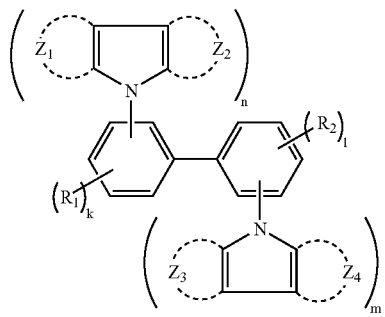

wherein:

$R_1$ and $R_2$ independently represent a hydrogen atom or a substituent;

n and m independently represent an integer of 1-2 and k and l independently represent an integer of 3-4, provided that the following equations are satisfied:

$n+k=5$ and $l+m=5$; and $Z_1$, $Z_2$, $Z_3$ and $Z_4$ independently represent a group of atoms which form a 6 membered aromatic heterocycle containing a nitrogen atom, Formula (9)

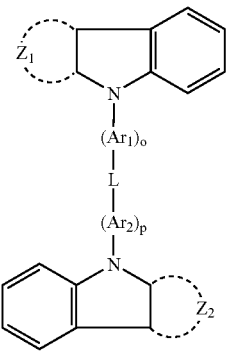

wherein o and p independently represent an integer of 1-3;

$Ar_1$ and $Ar_2$ independently represent an arylene group or a divalent aromatic heterocyclic group;

$Z_1$ and $Z_2$ independently represent a group of atoms which form a 6 membered aromatic heterocycle containing a nitrogen atom; and L represents a divalent connecting group, and Formula (10)

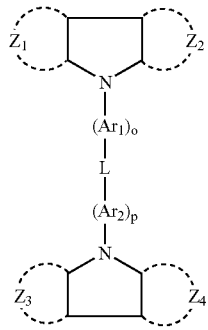

wherein:

o and p independently represent an integer of 1-3;

$Ar_1$ and $Ar_2$ independently represent an arylene group or a divalent aromatic heterocyclic group;

$Z_1$, $Z_2$, $Z_3$ and $Z_4$ independently represent a group of atoms which form a 6 membered aromatic heterocycle containing a nitrogen atom; and L represents a divalent connecting group.

8. Another embodiment of the present invention includes an organic electroluminescent element comprising a light emission layer, wherein the light emission layer contains a compound having a partial structure represented by Formula (1) and having a molecular weight of not less than 500 and not more than 1700.

9. Another embodiment of the present invention includes the organic electroluminescent element of Item 8, wherein Ar in Formula (1) represents a phenyl group.

10. Another embodiment of the present invention includes the organic electroluminescent element of Item 8 or Item 9, wherein $R_1$ in Formula (1) represents a hydrogen atom.

11. Another embodiment of the present invention includes the organic electroluminescent element of any one of Items 8-10 comprising a hole blocking layer, wherein the hole blocking layer contains a compound selected from the group consisting of Formulae (2)-(10)

12. Another embodiment of the present invention includes an organic electroluminescent element comprising a light emission layer, wherein the light emission layer contains a compound having a partial structure represented by Formula (1a) and having a molecular weight of not less than 500 and not more than 1700.

13. Another embodiment of the present invention includes the organic electroluminescent element of Item 12, wherein Ar in Formula (1a) represents a phenyl group.

14. Another embodiment of the present invention includes the organic electroluminescent element of Item 12 or Item 13, wherein Z in Formula (1a) represents a cyclohexane ring.

15. Another embodiment of the present invention includes the organic electroluminescent element of any one of Items 12-14 comprising a hole blocking layer, wherein the hole blocking layer contains a compound selected from the group consisting of Formulae (2)-(10).

16. Another embodiment of the present invention includes the organic electroluminescent element of any one of Items 1-15, wherein the light emitting layer contains a phosphorescent compound.

17. Another embodiment of the present invention includes the organic electroluminescent element of Item 16, wherein the phosphorescent compound is a complex of osmium, iridium, rhodium or platinum.

18. Another embodiment of the present invention includes the organic electroluminescent element of any one of Items 1-17, wherein light emitted from the element is a white light.

19. Another embodiment of the present invention includes a display comprising the organic electroluminescent element of any one of Items 1-18.

20. Another embodiment of the present invention includes an illuminator comprising the organic electroluminescent element of any one of Items 1 to 18.

21. Another embodiment of the present invention includes a display comprising the illuminator of Item 20, and a liquid crystal element as a displaying means.

Details of the present invention will be described below.

The organic electroluminescent element of the present invention includes a light emission layer and a hole blocking layer adjacent thereto, wherein:

(i) the light emission layer contains a compound having a partial structure represented by Formula (1) or (1a) and having a molecular weight of not more than 1700; and (ii) the hole blocking layer contains a derivative selected from the group consisting of a styryl derivative, a boron derivative and a carboline derivative. It was found that the organic electroluminescent element of the present invention exhibited a high emission intensity, a high emission efficiency and a long life. Further, the organic electroluminescent element including a light emission layer which contains a compound having a partial structure represented by Formula (1) or (1a) and having a molecular weight of not less than 500 and not more than 1700 has found to exhibit smaller degradation of emission intensity even when the organic electroluminescent element is kept under a higher temperature.

Herein, (i) the styryl derivative indicates a compound which contains a styryl benzene structure in the molecule and is preferably represented by Formula (2); (ii) the boron derivative indicates a compound which contains a boron atom in the molecule and is preferably represented by Formula (3); (iii) the carboline derivative indicates a compound which contains a carboline structure in the molecule and is preferably represented by one of Formula (4) to (7); and (iv) the carboline derivative may be a compound of which one of carbon atoms of the carboline moiety is substituted with a nitrogen atom and the compound is preferably represented by one of Formulae (8) to (10).

<Compound Having a Partial Structure Represented by Formula (1)>

In the above mentioned Formula (1), $R_1$ represents a hydrogen atom, an alkyl group or a cycloalkyl group. In order to improve an emission intensity and to obtain a high emission efficiency, a hydrogen atom is the most preferable.

Examples of an alkyl group represented by $R_1$ in Formula (1) include, a methyl group, an ethyl group, a propyl group, an isopropyl group, a tert-butyl group, a pentyl group, a hexyl group, an octyl group, a dodecyl group, a tridecyl group, a tetradecyl group, a penta decyl group, a trifluoro methyl group, a penta fluoro methyl group, a trifluoro methyl methyl group. The above mentioned alkyl group may be replaced by an aryl group (for example, a phenyl group, a tolyl group, a xylyl group, a biphenyl group, a naphthyl group, the anthryl group, a phenanthryl group), or may form a ring together with a group bound to a neighboring carbon atom. Examples of a cycloalkyl group represented by $R_1$ in Formula (1) include, a cyclopentyl group and a cyclohexyl group. The above-mentioned cycloalkyl group may be replaced by an aryl group as same as the above alkyl, or may form a ring together with a group bound to a neighboring carbon atom.

Examples of an arylene group represented by Ar in Formula (1) include, phenylene groups (for example, an o-phenylene group, a m-phenylene group and a p-phenylene group), a naphthalene diyl group, an anthracene diyl group, a naphthacene diyl group, a pyrene diyl group, an anthracene diyl group, a phenanthrene diyl group, a naphthyl naphthalene diyl group, a biphenyl diyl group (for example, a [1,1'-biphenyl]-4,4-diylgroup; a 3,3'-biphenyl diyl group; and a 3,6-biphenyl diyl group), a terphenyl diyl group, a quaterphenyl diyl group, a quinquephenyl diyl group, a sexiphenyl diyl group, a septiphenyl diyl group, a octiphenyl diyl group, a noviphenyl diyl group and a deciphenyl diyl group. The above-mentioned arylene group may have a substituent of any one of $R_2$-$R_9$ which is mentioned later.

Examples of an heteroarylene group represented by Ar in Formula (1) include, divalent groups originated from the following rings of: a carbazole ring, a triazole ring, a pyrrole ring, a pyridine ring, a pyrazine ring, a quinoxaline ring, a thiophene ring, an oxadiazole ring, a dibenzofuran ring, a dibenzothiophene ring, and an indole ring. The above-mentioned heteroarylene group may have a substituent of any one of $R_2$-$R_9$ which is mentioned later.

Among the above-mentioned groups represented by Ar, the most preferable group is a phenylene group.

In Formula (1), $R_2$-$R_9$ independently represent a hydrogen atom or a substituent. These groups may be same or individually different. Each pair of $R_2$-$R_3$, $R_3$-$R_4$, $R_4$-$R_5$, $R_6$-$R_7$, $R_7$-$R_8$ and $R_8$-$R_9$ may be bound to form a ring.

Examples of substituents represented by $R_2$-$R_9$ include, alkyl groups (for example, a methyl group, an ethyl group, a propyl group, an isopropyl group, a tert-butyl group, a pentyl group, a hexyl group, an octyl group, a dodecyl group, a tridecyl group, a tetradecyl group and penta decyl), cycloalkyl groups (for example, a cyclopentyl group and a cyclohexyl group), alkenyl groups (for example, a vinyl group, and an allyl group, alkynyl groups (for example, an ethynyl group, a propergyl group), an aryl group (for example, a phenyl group and a naphthyl group), an aromatic heterocyclic group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group and a pfthalazinyl group), heterocyclic groups (for example, a pyrrolidyl group, an imidazolysyl group, a morpholyl group and a oxazolidyl group), alkoxyl groups (for example, a methoxy group, an ethoxy group, a propyloxy group, a pentyloxy group, a hexyloxy group, an octyloxy group and a dodecyloxy group), cycloalkoxyl groups (for example, a cyclopentyloxy group, a cyclohexyloxy group), aryloxy groups (for example, a phenoxy group and a naphthyloxy group), alkylthio groups (for example, a methylthio group, an ethylthio group, a propylthio group, a pentylthio group, a hexylthio group, an octylthio group and a dodecyl thio group), cyclo alkylthio groups (for example, a cyclopentylthio group and a cyclohexylthio group, arylthio groups (for example, a phenylthio group and a naphthylthio group), alkoxy carbonyl groups (for example, a methyl oxycarbonyl group, an ethyl oxycarbonyl group, a butyl oxycarbonyl group, an octyl oxycarbonyl group and a dodecyl oxycarbonyl group), an aryl oxycarbonyl groups (for example, a phenyl oxycarbonyl group and a naphthyl oxycarbonyl group), sulfamoyl groups (for example, an amino sulfonyl group, a methyl amino sulfonyl group, a dimethyl amino sulfonyl group, a butyl amino sulfonyl group, a hexyl amino sulfonyl group, a cyclohexyl amino sulfonyl group, an octyl amino sulfonyl group, a dodecyl amino sulfonyl group, a phenyl amino sulfonyl group, a naphthyl amino sulfonyl group and a 2-pyridyl amino sulfonyl group), acyl groups (for example, an acetyl group, an ethyl carbonyl group, a propyl carbonyl group, a pentyl carbonyl group, a cyclohexyl carbonyl group, an octyl carbonyl group, 2-ethyl hexyl carbonyl group, a dodecyl carbonyl group, a phenyl carbonyl group, a naphthyl carbonyl group and a pyridyl carbonyl group), acyloxy groups (for example, an acetyl oxy group, an ethyl carbonyl oxy group, a butyl carbonyl oxy group, an octyl carbonyl oxygroup, a dodecyl carbonyl oxygroup and a phenyl carbonyl oxygroup), amide groups (for example, a methyl carbonyl amino group, an ethyl carbonyl amino group, a dimethyl carbonyl amino group, a propyl carbonyl amino group, a pentyl carbonyl amino group, a cyclohexyl carbonyl amino group, a 2-ethyl hexyl carbonyl amino group, an octyl carbonyl amino group, a dodecyl carbonyl amino group, a phenyl carbonyl amino group and a naphthyl carbonyl amino group), carbamoyl groups (for example, an amino carbonyl group, a methyl amino carbonyl group, a dimethylamino carbonyl group, a propyl amino carbonyl group, a pentyl amino carbonyl group, a cyclohexyl amino carbonyl group, an octyl amino carbonyl group, a 2-ethyl hexyl amino carbonyl group, a dodecyl amino carbonyl group, a phenylamino carbonyl group, a naphthyl amino carbonyl group and a 2-pyridyl amino carbonyl group), ureide groups (for example, a methyl ureide group, an ethyl ureide group, a pentyl ureide group, a cyclohexyl ureide group, an octyl ureide group, a dodecyl ureide group, a phenyl ureide group, a naphthyl ureide group and a 2-pyridyl amino ureide group), sulfinyl groups (for example, a methyl sulfinyl group, an ethyl sulfinyl group, a butyl sulfinyl group, a cyclohexyl sulfinyl group, a 2-ethyl hexyl sulfinyl group, a dodecyl sulfinyl group, a phenyl sulfinyl group, a naphthyl sulfinyl group and a 2-pyridyl sulfinyl group), alkyl sulfonyl groups (for example, a methyl sulfonyl group, an ethyl sulfonyl group, a butyl sulfonyl group, a cyclohexyl sulfonyl group, a 2-ethyl hexyl sulfonyl group and a dodecyl sulfonyl group) aryl sulfonyl groups (for example, a phenyl sulfonyl group, a naphthyl sulfonyl group and a 2-pyridyl sulfonyl group), amino groups (for example, an amino group, an ethyl amino group, a dimethyl amino group, a butyl amino group, a cyclopentyl amino group, a 2-ethyl hexyl amino group, a dodecyl amino group, an anilino group, a naphthyl amino group and a 2-pyridyl amino group), halogen atoms (for example, a fluorine atom, a chlorine atom and a bromine atom), fluorocarbon groups (for example, a fluoro methyl group, a trifluoro methyl group, a pentafluoro ethyl group and a pentafluorophenyl group), a cyano group, a nitro group, a hydroxy group, a mercapto group, silyl groups (for example, a trimethyl silyl group, a triisopropyl silyl group, a triphenyl silyl group and a phenyl diethyl silyl group).

These substituents may be further replaced by the above-mentioned substituent. A plurality of the substituents may be combine with each other to form a ring.

<Compound Which has the Partial Structure Expressed by Formula (1a)>

The arylene group and the hetero arylene group represented by Ar in Formula (1a) are respectively the same as the arylene group and hetero arylene group represented by Ar in Formula (1).

The substituents represented by $R_2$-$R_9$ in Formula (1a) are the same as the substituents represented by $R_2$-$R_9$ in Formula (1).

Examples of a saturated hydrocarbon ring having 3-8 carbon atoms formed by the atoms represented by Z in Formula (1a) include, a cyclopropane ring, a cyclobutane ring, a cyclopentane ring, a cyclohexane ring, a cycloheptan ring and a cyclooctane ring. These saturated hydrocarbon rings may be unsubstituted or may be substituted with a substituent which may be one of $R_2$-$R_9$ of Formula (1).

<Compound Represented by Formula (11)>

Among the compounds having a partial structure represented by Formula (1), a compound represented by Formula (11) is preferably used.

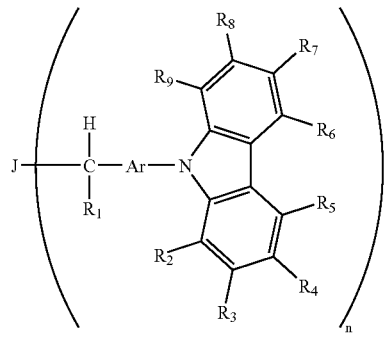

Formula (11)

The substituents represented by $R_1$-$R_9$ in Formula (11) have respectively the same meaning as the substituents represented by $R_1$-$R_9$ in Formula (1). n represents an integer of 1-6. In the case of n=1, J represents one of aryl groups (for example, a phenyl group, a tolyl group, a xylyl group, a biphenyl group, a naphthyl group, an anthryl group and a phenanthryl group), and preferably represents a 4-(N-carbazolyl) phenyl group which may be substituted or unsubstituted.

In the case of n=2-6, J represents a n-valets connecting group and is selected from one of an aliphatic hydrocarbon group which may have a direct coupling, an oxygen atom, a sulfur atom and a substituent, an aliphatic heterocyclic group which may have a substituent, an aromatic hydrocarbon group which may have a substituent, and an aromatic heterocyclic group which may have a substituent.

The partial structures represented by Formula (1) contained in Formula (11) may be the same each other or may be individually different.

Specific examples of the compounds are shown as follows, however, the present invention is not limited thereto:

H-1

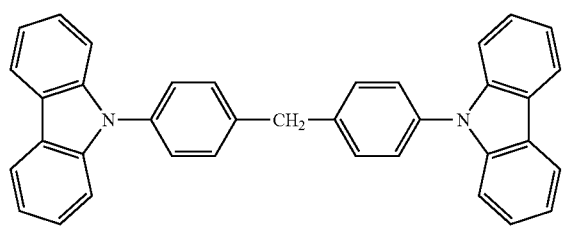

-continued
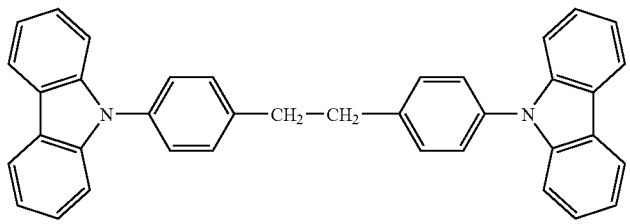
H-2
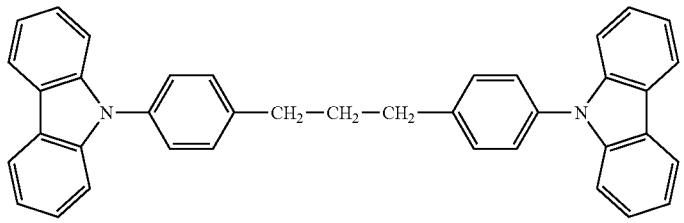
H-3
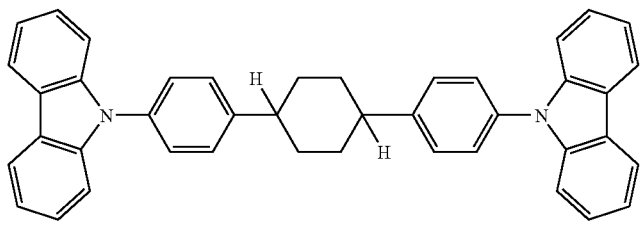
H-4
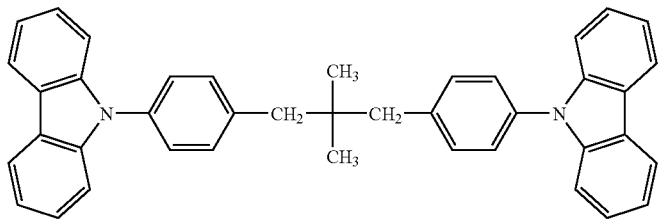
H-5
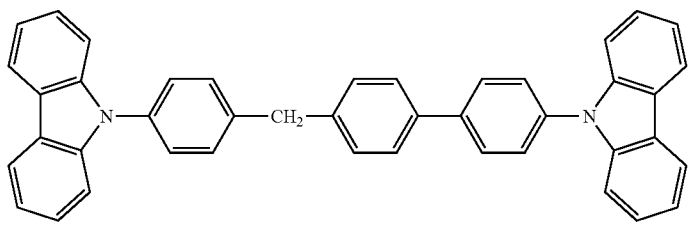
H-6
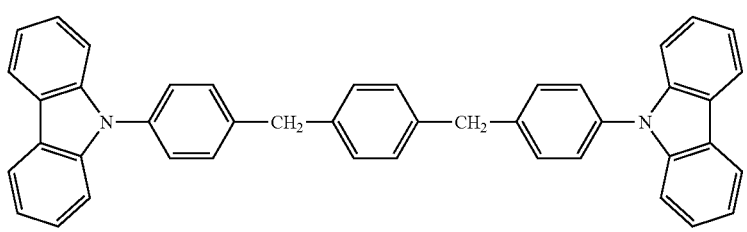
H-7

-continued
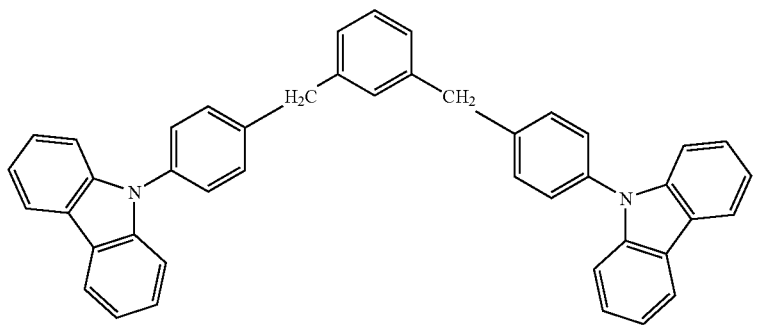
H-8
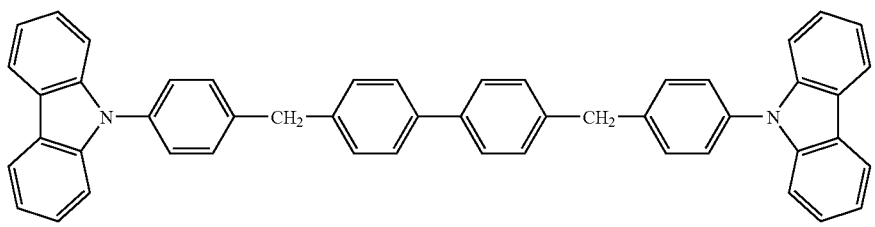
H-9
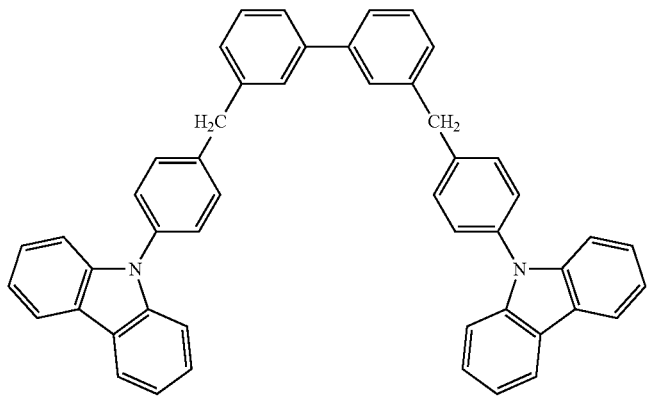
H-10
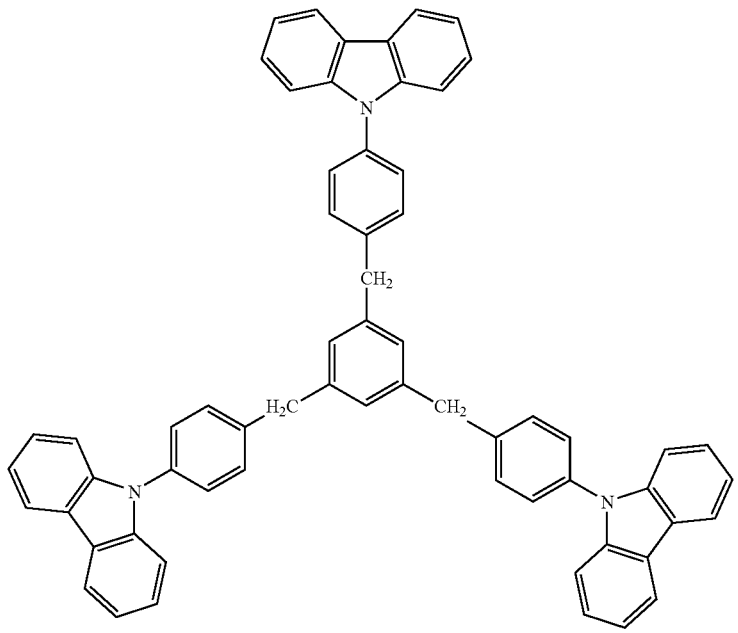
H-11

-continued
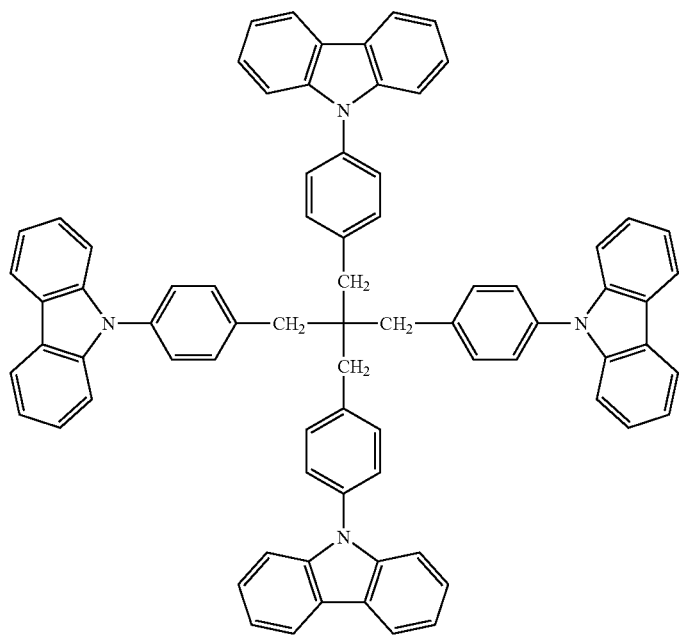
H-12
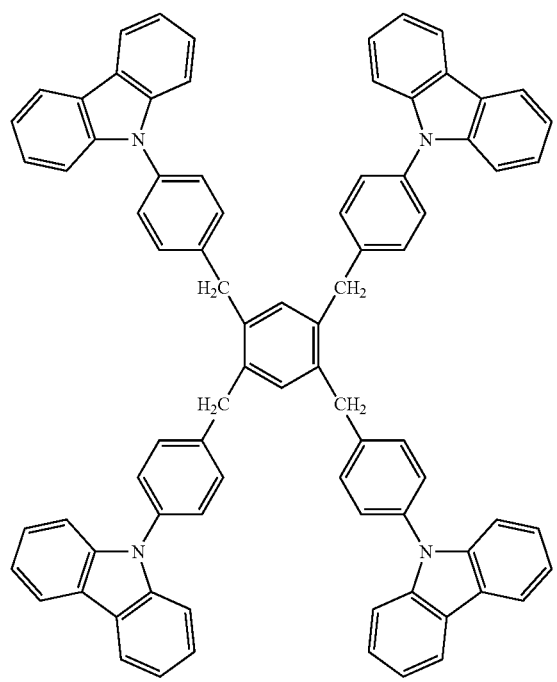
H-13

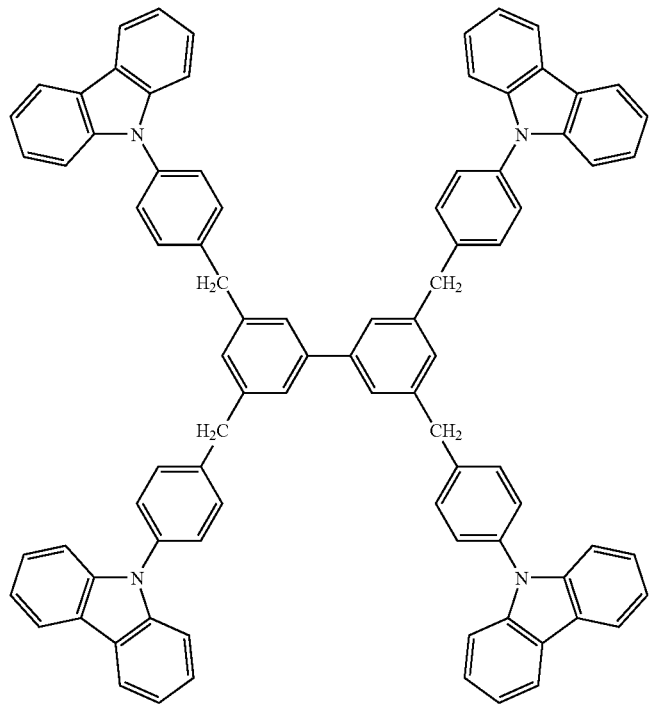
H-14
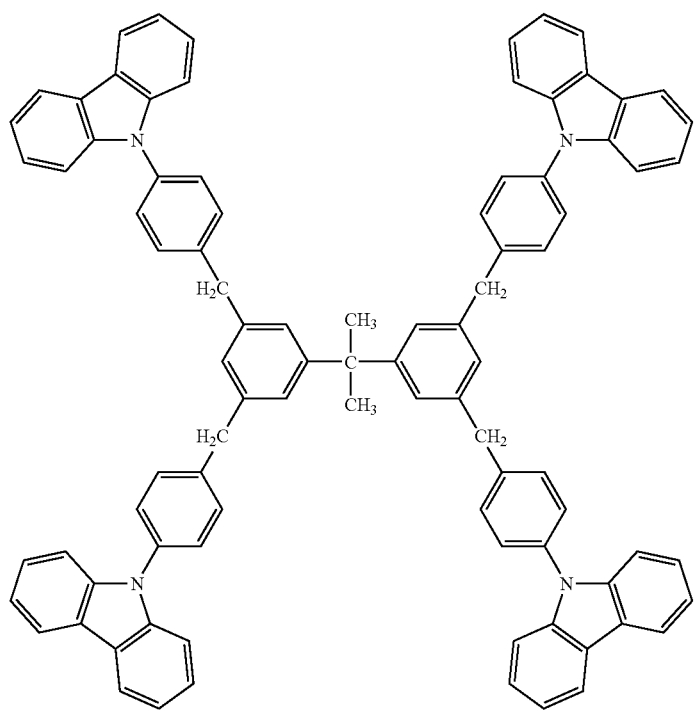
H-15

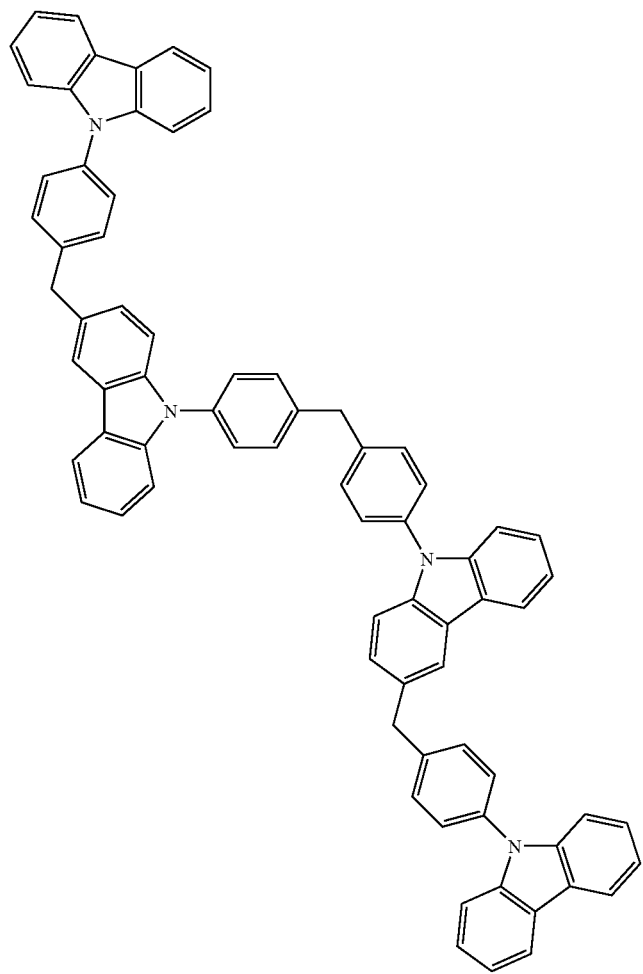
H-16

-continued
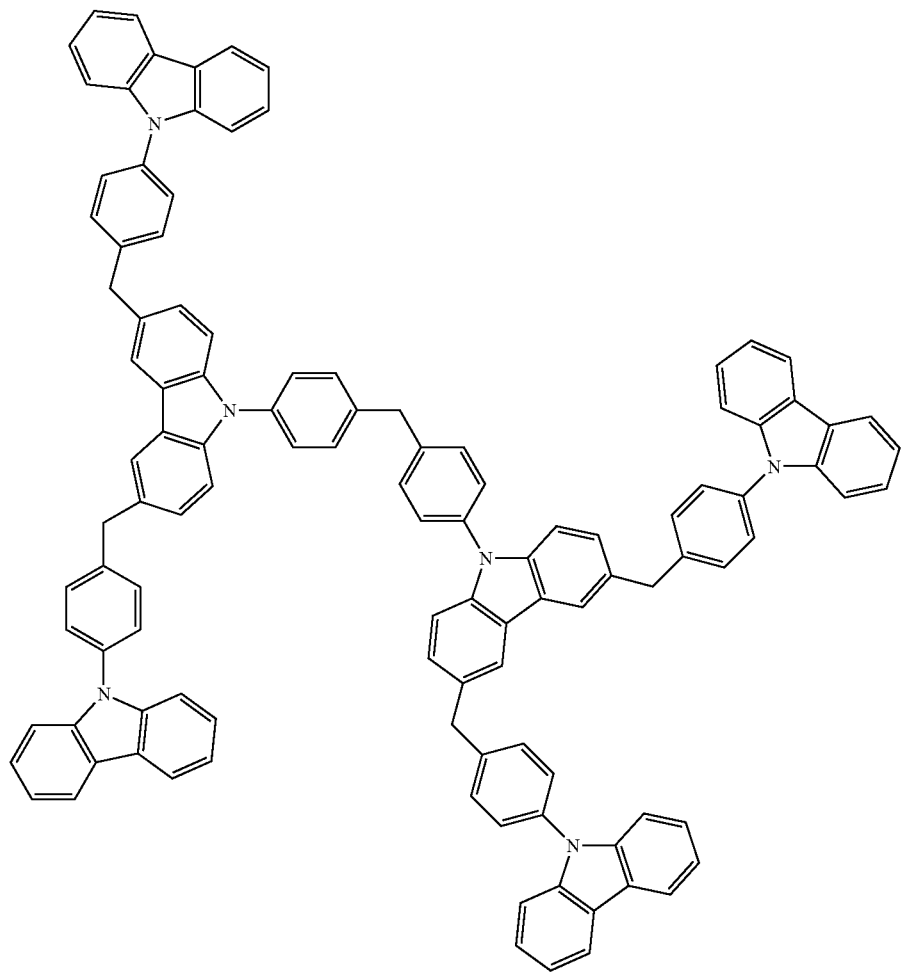
H-17
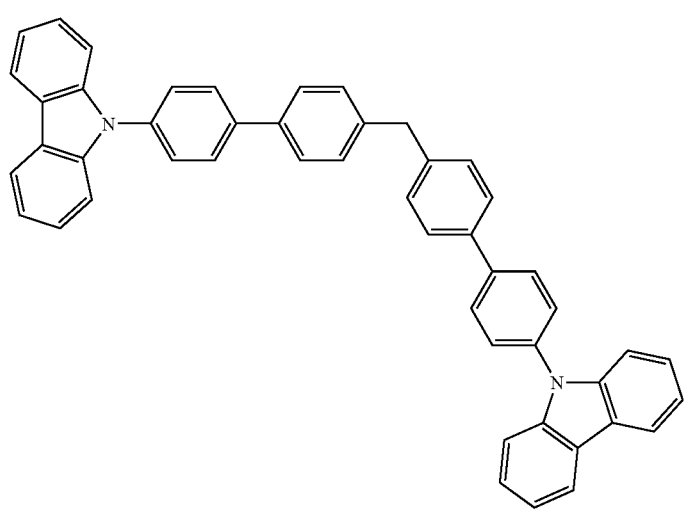
H-18

-continued
H-19
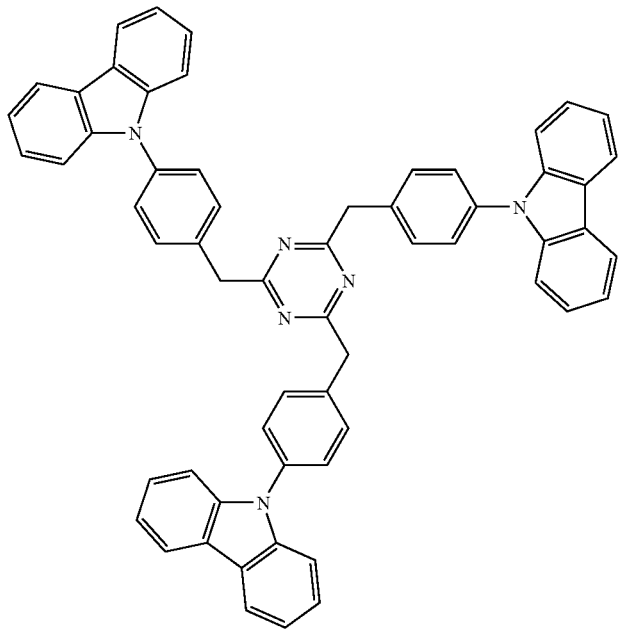
H-20
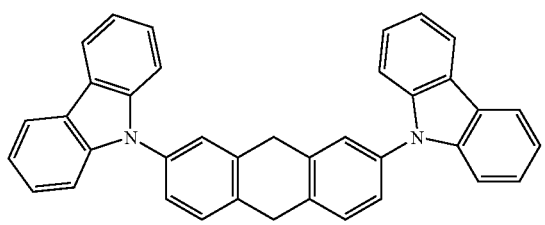
H-21
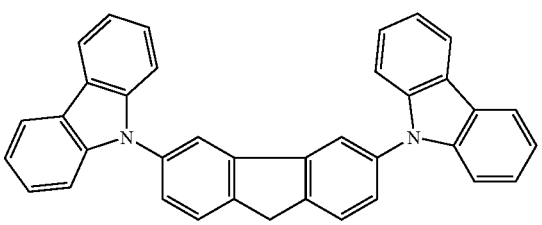
H-22
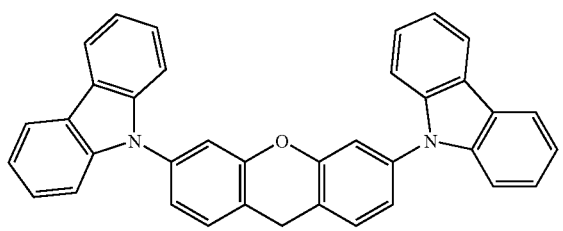
H-23
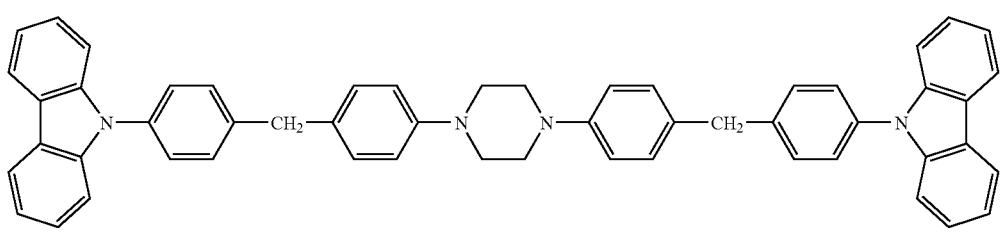
H-24
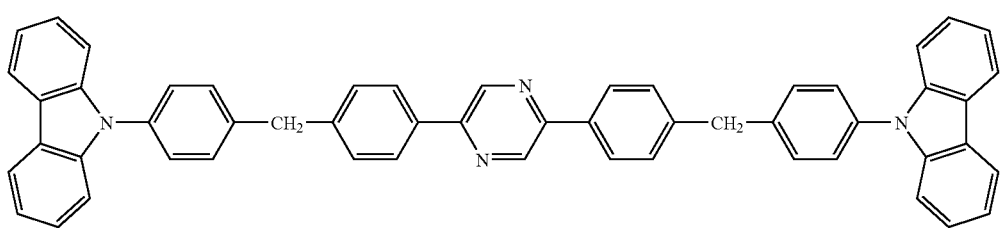

-continued
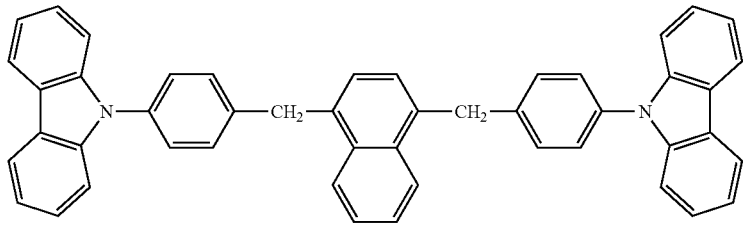
H-25
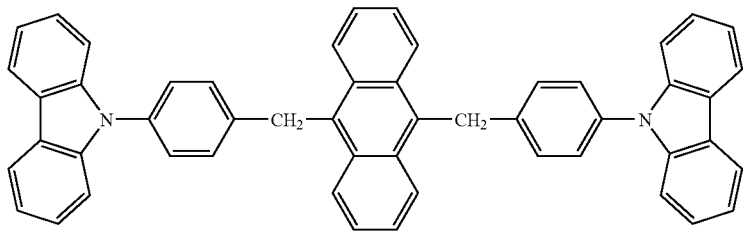
H-26
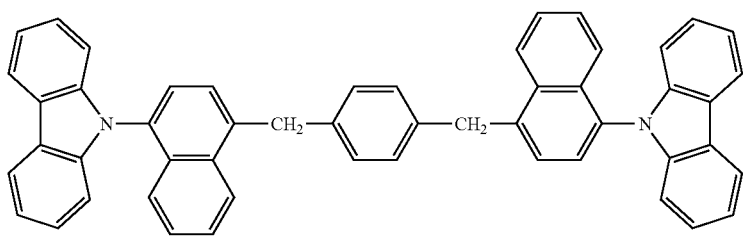
H-27
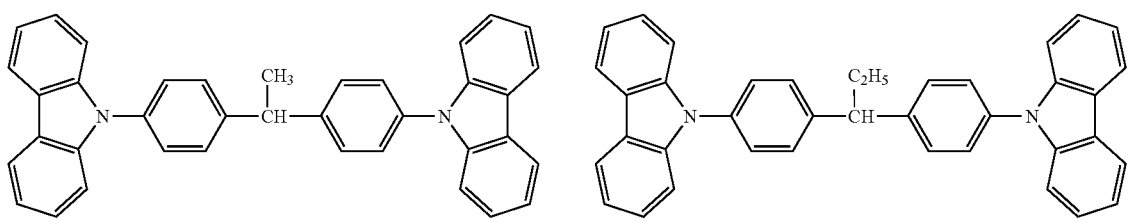
H-28 H-29
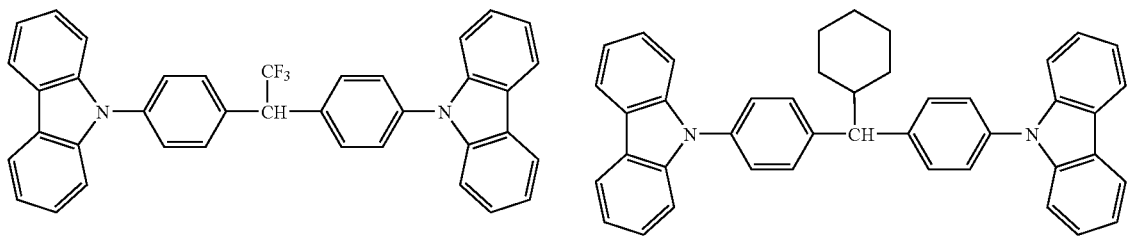
H-30 H-31
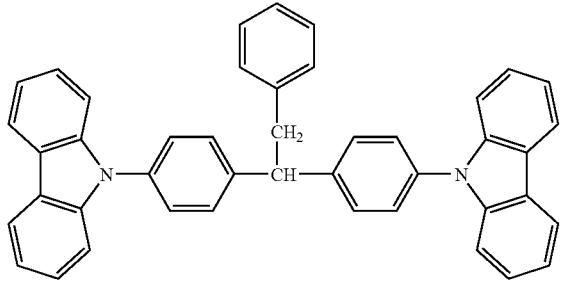
H-32

-continued
H-33 H-34
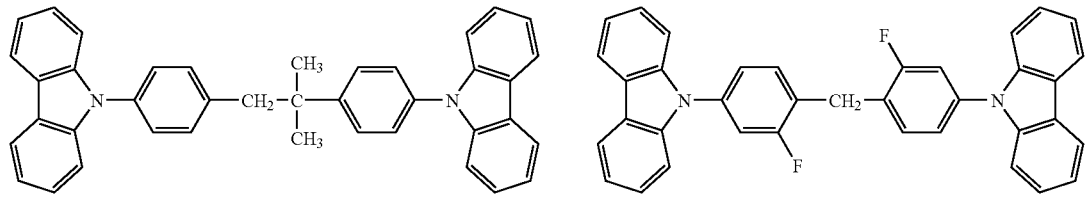
H-35 H-36
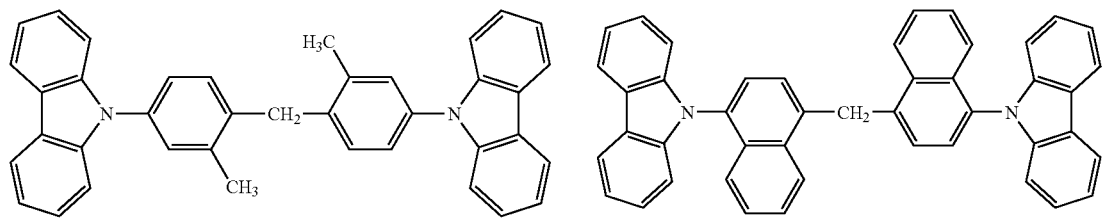
H-37 H-38
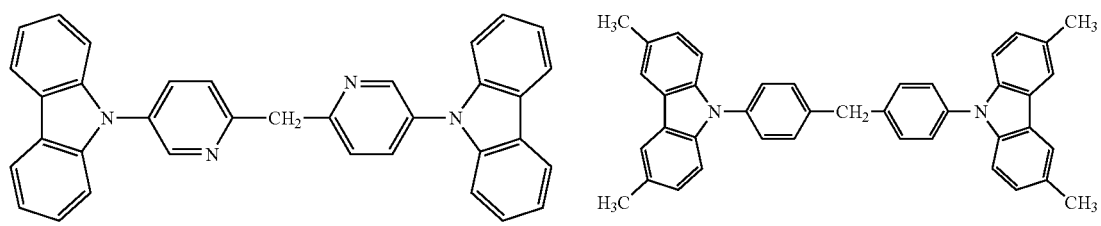
H-39 H-40
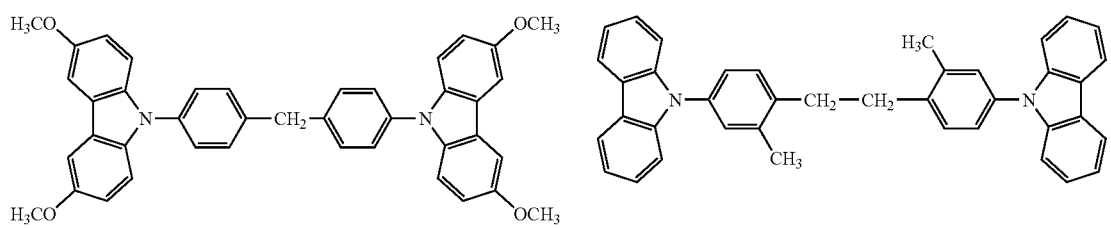
H-41
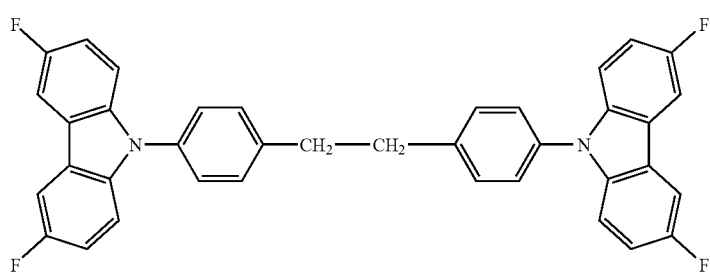
H-42
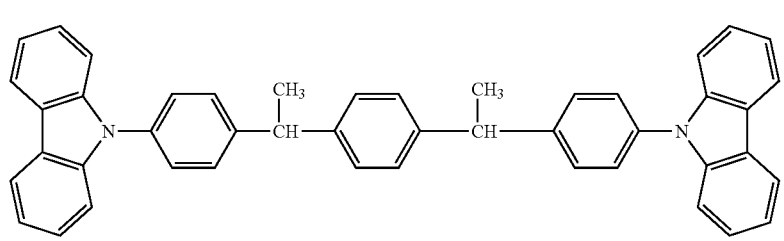

-continued
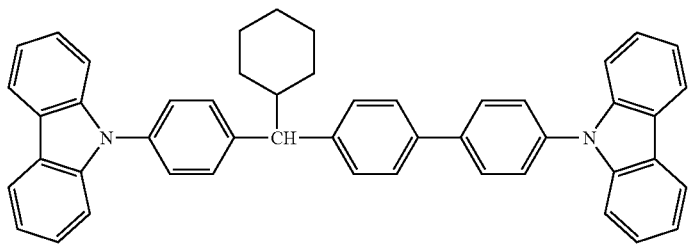
H-43
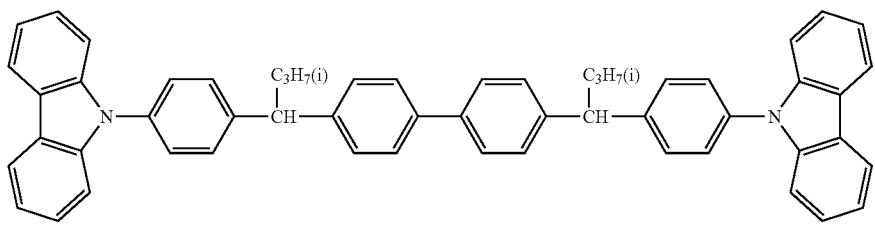
H-44
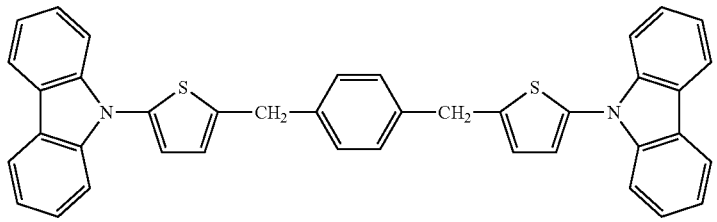
H-45
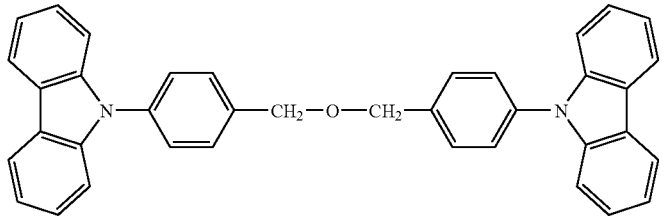
H-46
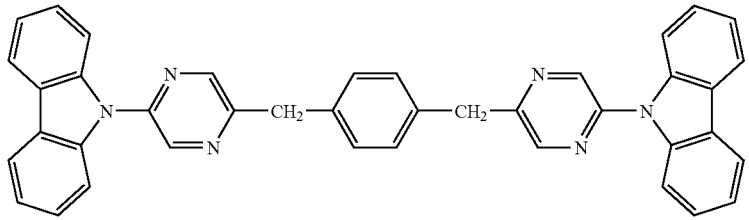
H-47
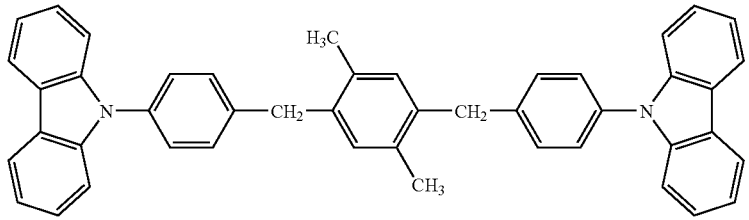
H-48
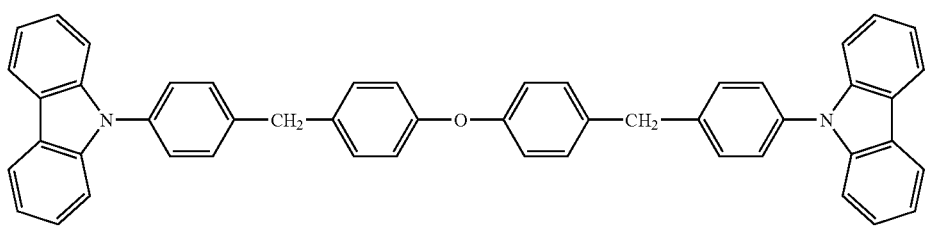
H-49

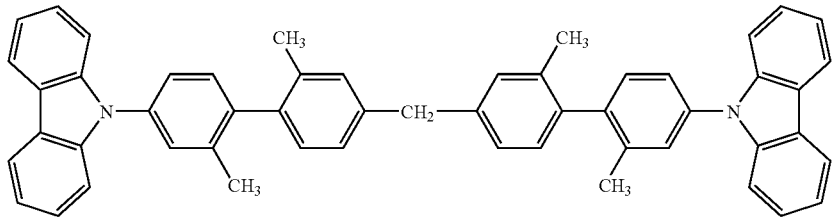
H-50
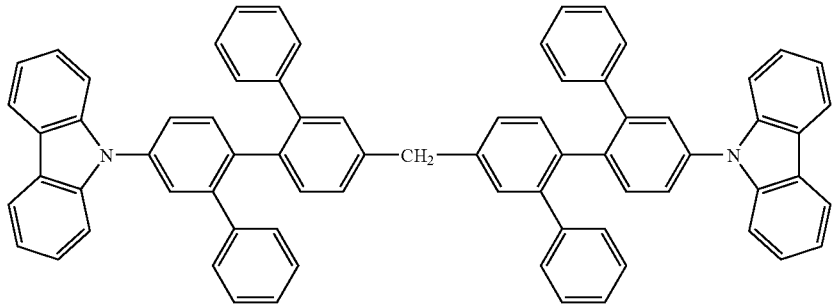
H-51
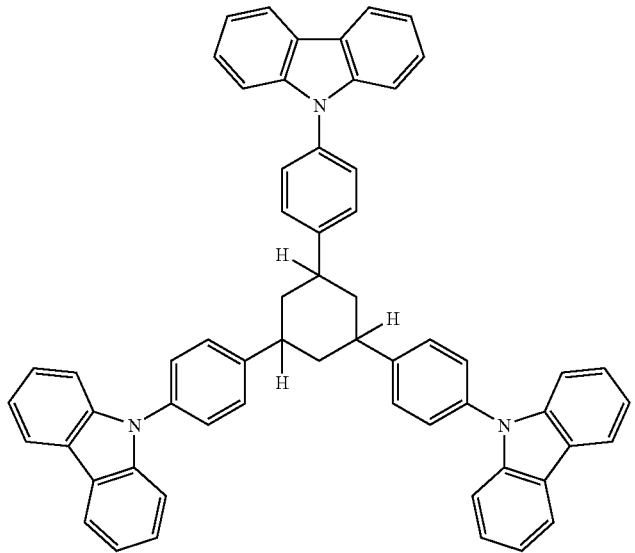
H-52

-continued
H-53
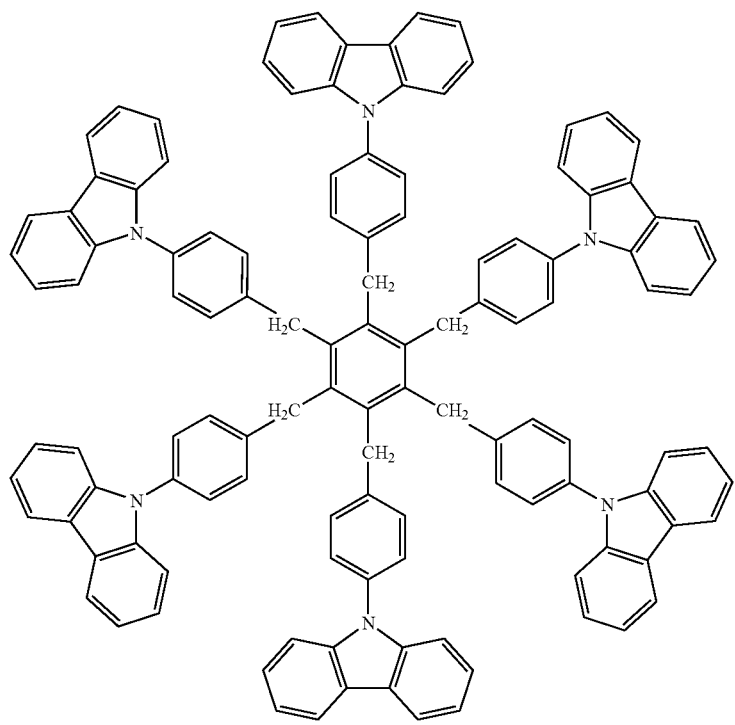
H-54
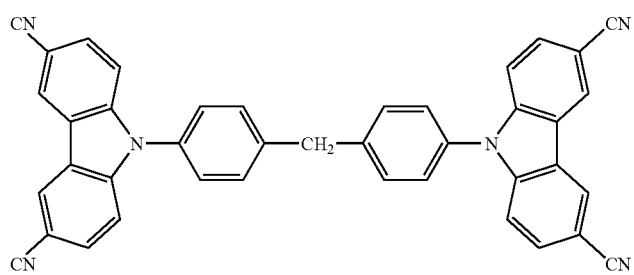
H-55
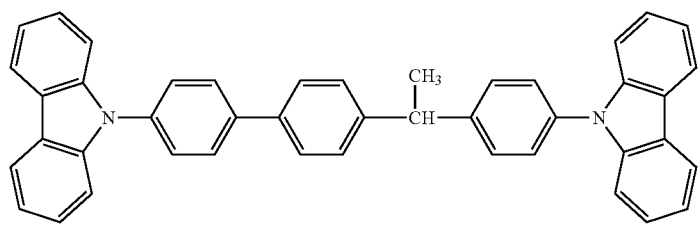
H-56
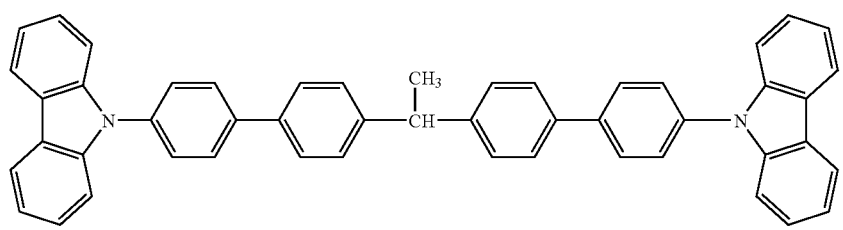

-continued
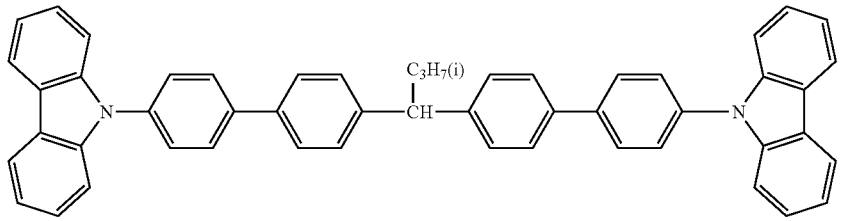
H-57
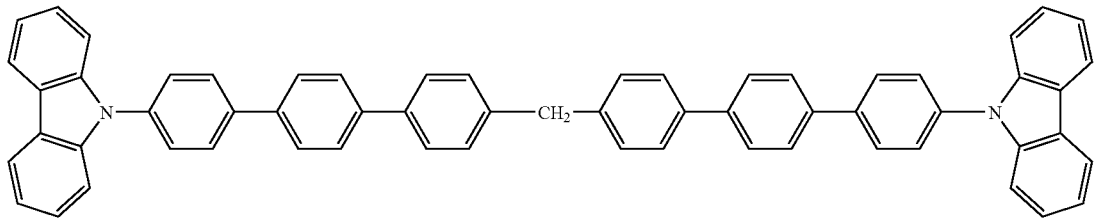
H-58
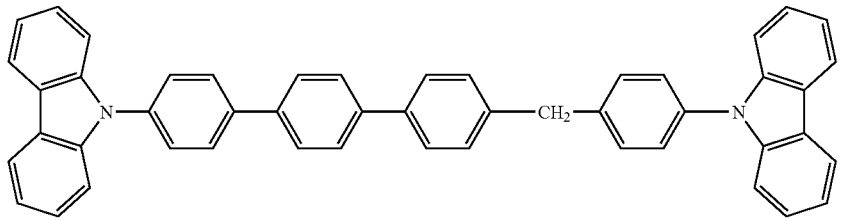
H-59
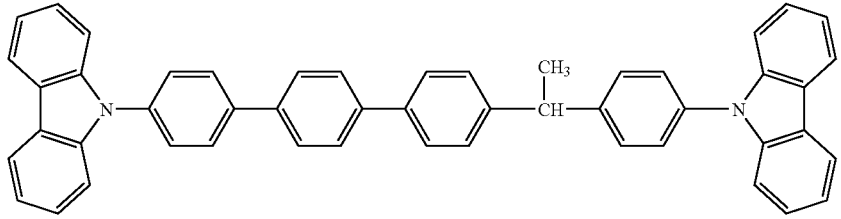
H-60
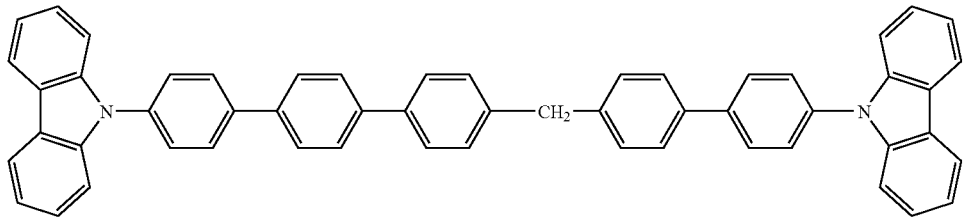
H-61
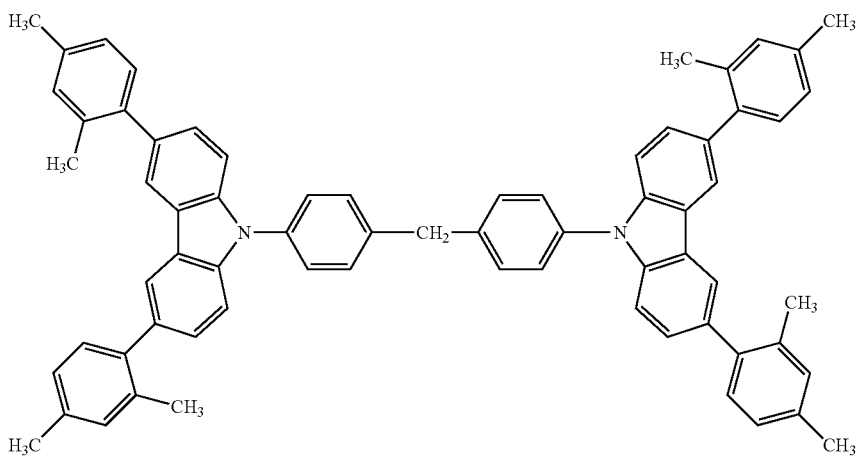
H-62

-continued
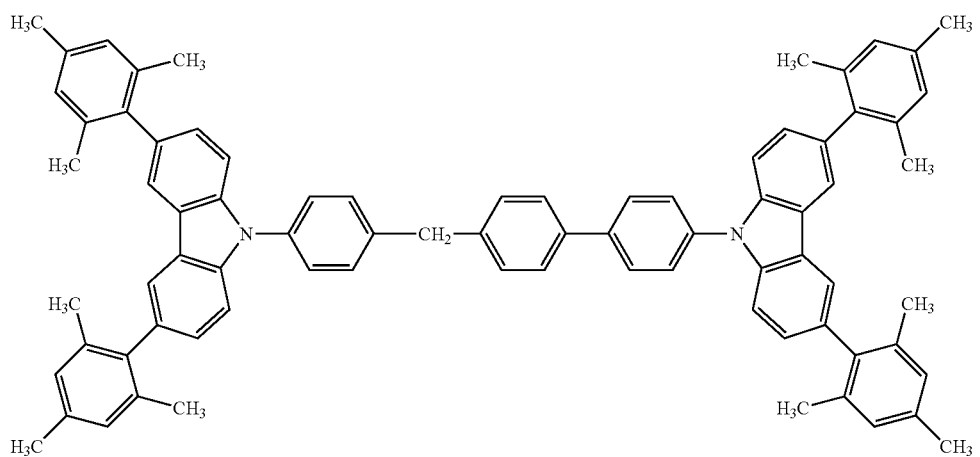
H-63
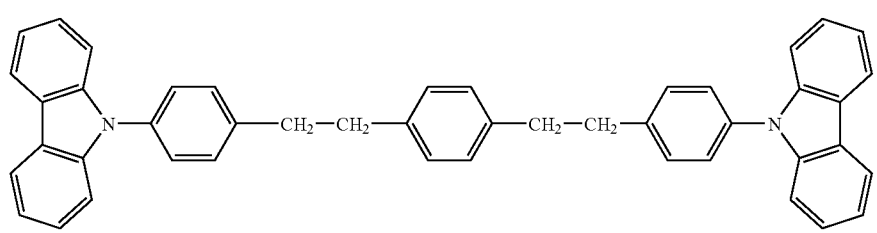
H-64
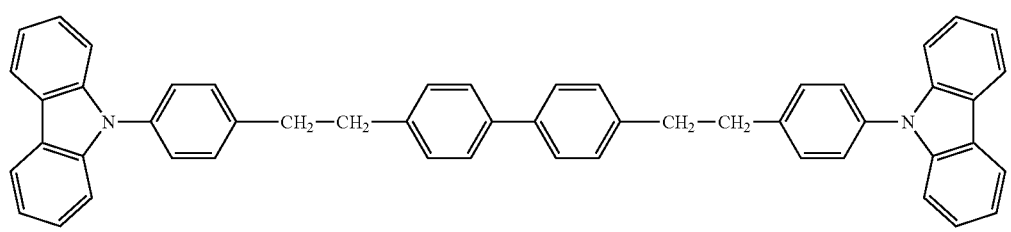
H-65
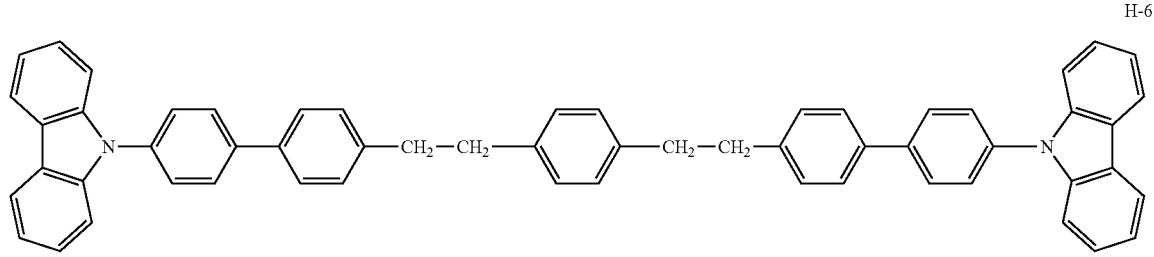
H-66
As an example of the synthetic method of above compounds, a method of synthesizing H-1 is described below:
<Synthesis of Compound H-1>
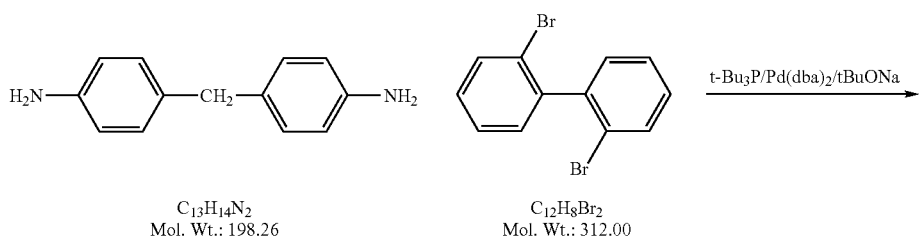

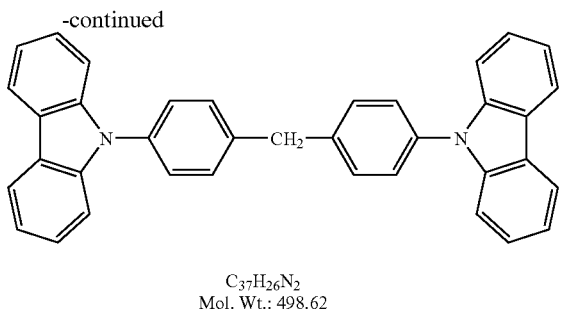

$C_{37}H_{26}N_2$
Mol. Wt.: 498.62

4.0 g of 4,4'-diamino diphenylmethan, 13.0 g of 2,2'-dibromo biphenyl, 0.7 g of bis(dibenzylideneacetone) palladium, 1.2 ml of tri-tert-butyl phosphine and 7.7 g of anhydrous sodium-tert-butoxide were dispersed in 70 ml of anhydrous toluene and stirred at a reflux temperature for 4 hours under a nitrogen atmosphere. After standing the product mixture to cool, toluene and water were added to separate the organic layer, the organic layer was washed by using diluted hydrochloric acid, water and saturated sodium chloride solution, the product was condensed and refined by means of silica gel column chromatography, and 1.7 g of colorless needle crystals of a compound H-1 was obtained. The structure was identified with a $^1$H-NMR spectrum and a mass spectroscopy spectrum.

Data of a Compound H-1:

Shape: A colorless crystal

Melting point: 200° C.

Mass spectrum: MS(FAB) m/z 498 ($M^+$) $^1$H-NMR (400 MHz, $CDCl_3$): δ/ppm: 4.24 (s, 2H), 7.29 (td, J=6.5, 1.2 Hz, 4H), 7.41 (td, J=7.8, 1.2 Hz, 4H), 7.45 (d, J=6.5 Hz, 4H), 7.51 (d, J=8.3 Hz, 4H), 7.56 (d, J=8.3 Hz, 4H), 8.15 (d, J=7.8 Hz, 4H)

Absorption, fluorescence and excitation spectra of H-1 measured in tetrahydrofuran are shown in FIG. 8.

The molecular weight of the compound of the present invention is preferably not more than 1700, and more preferably not less than 500 and not more than 1700. By using a compound having a molecular weight of the above described range, there is obtained an organic EL element exhibiting a long life, a high emission intensity and a high emission efficiency while degradation of emission intensity in keeping under a higher temperature is suppressed.

Specific examples of the organic EL element of the present invention are shown below, however, the present invention is not limited thereto.

| | |
|---|---|
| I | Anode/Light emission layer/Cathode |
| II | Anode/Light emission layer/Electron transporting layer/Cathode |
| III | Anode/Anode buffering layer/Light emission layer/Cathode |
| IV | Anode/Anode buffering layer/Light emission layer/Hole blocking layer/Electron transporting layer/Cathode |
| V | Anode/Hole transporting layer/Light emission layer/Electron transporting layer/Cathode |
| VI | Anode/Hole transporting layer/Light emission layer/Hole blocking layer/Electron transporting layer/Cathode |
| VII | Anode/Hole transporting layer/Light emission layer/Hole blocking layer/Electron transporting layer/Cathode buffering layer/Cathode |
| VIII | Anode/Anode buffering layer/Hole transporting layer/Light emission layer/Hole blocking layer/Electron transporting layer/Cathode buffering layer/Cathode |

<Anode>

For the anode of the organic EL element, a metal, an alloy, or an electroconductive compound each having a high working function (not less than 4 eV), and a mixture thereof are preferably used as the electrode material. Concrete examples of such an electrode material include a metal such as Au, and a transparent electroconductive material such as CuI, indium tin oxide (ITO), $SnO_2$, or ZnO, and a material capable of forming an amorphous and transparent conductive layer such as IDIXO ($In_2O_3$—ZnO). The anode may be prepared by forming a thin layer of the electrode material according to a depositing or spattering method, and by forming the layer into a desired pattern according to a photolithographic method. When required precision of the pattern is not so high (not less than 100 μm), the pattern may be formed by depositing or spattering of the electrode material through a mask having a desired form. When light is emitted through the anode, the transmittance of the anode is preferably 10% or more, and the sheet resistance of the anode is preferably not more than several hundred Ω/□. The thickness of the layer is ordinarily within the range of from 10 nm to 1 μm, and preferably from 10 to 200 nm, although it may vary due to kinds of materials used.

<Cathode>

On the other hand, for the cathode, a metal (also referred to as an electron injecting metal), an alloy, and an electroconductive compound each having a low working function (not more than 4 eV), and a mixture thereof is used as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as an evaporation or spattering method. The sheet resistance as the cathode is preferably not more than several hundred Ω/□, and the thickness of the layer is ordinarily from 10 nm to 1 μm, and preferably from 50 to 200 nm. It is preferable in increasing the light emission efficiency that either the anode or the cathode of the organic EL element is transparent or semi-transparent.

Next, an injecting layer, a hole transporting layer, and an electron transporting layer used in the component layer of the organic EL element of the present invention will be explained.

<Injecting Layer: Electron Injecting Layer, Hole Injecting Layer>

The injecting layer is optionally provided, for example, an electron injecting layer or a hole injecting layer, and may be provided between the anode and the light emission layer or hole transporting layer, and between the cathode and the light emission layer or electron transporting layer as described above.

The injecting layer herein referred to is a layer provided between the electrode and an organic layer in order to reduce the driving voltage or to improve of light emission efficiency. As the buffer layer there are a hole injecting layer (an anode buffer layer) and an electron injecting layer (a cathode buffer layer), which are described in "Electrode Material" pp. 123-166, Div. 2 Chapter 2 of "Organic EL element and its frontier of industrialization" (published by NTS Corporation, Nov. 30, 1998) in detail.

The anode buffer layer (hole injecting layer) is described, for example, in JP-A Nos. 9-45479, 9-260062, and 8-288069, and its examples include, for example, a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene. Among these compounds, polydioxythiophene is specifically preferable and an organic EL element using this compound exhibits specifically high emission intensity and emission efficiency and a specifically longer life. An anode buffer layer is provided between an anode and a light emission layer and adjacent to the light emission layer, by using this anode buffer layer, a specifically high emission intensity and emission efficiency and a specifically long life are obtained.

The cathode buffer layer (electron injecting layer) is described in JP-A Nos. 6-325871, 9-17574, and 9-74586 in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide.

The buffer layer (injecting layer) is preferably very thin and has a thickness of preferably from 0.1 to 100 nm depending on kinds of the material used.

The blocking layer is a layer provided if necessary in addition to the fundamental configuration layers as described above, and is for example a hole blocking layer as described in JP-A Nos. 11-204258, and 11-204359, and on page 237 of "Organic EL element and its frontier of industrialization" (published by NTS Corporation, Nov. 30, 1998).

<Blocking Layer: Hole Blocking Layer, Electron Blocking Layer>

The hole blocking layer is an electron transporting layer in a broad sense, and is comprised of material having an ability of transporting electrons but an extremely poor ability of holes, which can increase a recombination probability of electrons and holes by transporting electrons and blocking holes.

The rolls of a hole blocking layer are (i) to prevent the holes which migrate from a hole transporting layer from leaching a cathode, and (ii) to efficiently transport the electrons injected from an anode to a light emission layer. In order to effectively block in holes in a light emission layer, the properties required for a hole blocking layer are as follows: (i) having a high mobility of electrons and a low mobility of holes; and (ii) having a larger ionization potential than that of a light emission layer or having a larger band gap than that of a light emission layer.

In the present invention, a hole blocking layer is preferably provided adjacent to a light emission layer, by which emission intensity and an emission efficiency are improved.

Higher emission intensity and a higher emission efficiency are obtained by using a compound selecting from the group consisting of a styryl derivative, a boron derivative, a carboline derivative and a carboline derivative in which at least one of carbon atoms of a carboline moiety is substituted with a nitrogen atom in a hole blocking layer.

Also, in the present invention, a hole blocking layer preferably contains one of the compound represented by Formulae (2)-(10), by which emission intensity and an emission efficiency are improved.

<Compounds Represented by Formula (2)>

Compounds represented by Formula (2) are explained below:

Examples of an alkyl group represented by $R_1$ and $R_2$ in Formula (2) include, a methyl group, an ethyl group, a propyl group, an isopropyl group, a tert-butyl group, a pentyl group, a hexyl group, an octyl group, a dodecyl group, a tridecyl group, a tetradecyl group, a penta decyl group, a trifluoro methyl group, a pentafluoro methyl group and a trifluoro methyl group.

Examples of an alkoxyl group represented by $R_1$ and $R_2$ in Formula (2) include, a methoxy group, an ethoxy group, a butoxy group, a propyloxy group, a pentyloxy group, a hexyloxy group, an octyloxy group and a dodecyloxy group.

Examples of an aryl group represented by $R_1$ and $R_2$ in Formula (2) include, a phenyl group, a tolyl group, a xylyl group, a biphenyl group, a naphthyl group, an anthryl group and a phenanthryl group.

The alkyl group, alkoxyl group and the aryl group represented by $R_1$ and $R_2$ in Formula (2) may further have a substituent represented by $R_2$-$R_9$ in Formula (1).

Examples of a heterocyclic group represented by $R_3$ and $R_4$ in Formula (2) include, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a phthalazinyl group, a pyrrolidyl group, an imidazolysyl group, a quinoxalinyl group, a morpholinyl group and a oxazolidyl group.

The aryl groups represented by $R_3$ and $R_4$ in Formula (2) are the same as those represented by $R_1$ and $R_2$ in Formula (2).

The arylene group represented by $Ar_{11}$ in Formula (2) is the same as that represented by Ar Formula (1).

<Compounds Represented by Formula (3)>

Compounds represented by Formula (3) are explained below:

Examples of a aryl group represented by $Ar_1$ Formula (3) include, a phenyl group, a tolyl group, a xylyl group, a biphenyl group, a naphthyl group, an anthryl group and a phenanthryl group.

Examples of a aromatic heterocyclic group represented by $Ar_1$ Formula (3) include, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group and a phthalazinyl group.

The aryl group and the aromatic heterocyclic group represented by $Ar_1$ in Formula (3) may further have a substituent represented by $R_2$-$R_9$ in Formula (1)

<Compounds Represented by Formulae (4)-(8)>

In each of the compounds represented by Formulae (4)-(8), the substituents represented by $R_1$ and $R_2$ are the same as the substituents represented by $R_2$-$R_9$ in Formula (1).

Examples of a 6 membered aromatic heterocyclic ring containing a nitrogen atom represented by $Z_1$, $Z_2$, $Z_3$ and $Z_4$ in Formula (8) include, a pyridine ring, a pyridazine ring, a pyrimidine ring and a pyrazine ring.

Each of 6 membered aromatic heterocyclic ring containing a nitrogen atom represented by $Z_1$, $Z_2$, $Z_3$ and $Z_4$ in Formula (8) may further have a substituent represented by $R_2$-$R_9$ in Formula (1).

<Compounds Represented by Formulae (9)-(10)>

Examples of a 6 membered aromatic heterocyclic ring containing a nitrogen atom represented by $Z_1$ or $Z_2$ in Formula (9) include, a pyridine ring, a pyridazine ring, a pyrimidine Examples of an arylene group represented by $Ar_1$ or $Ar_2$ in Formula (9) include, an o-phenylene group, a m-phenylene group, a p-phenylene group, a naphthalenediyl group, an anthracenediyl group, a naphthacenediyl group, a pyrenediyl group, a naphthyl naphthalenediyl group, a biphenyldiyl group (for example, a 3,3'-biphenyldiyl group and 3,6-biphenyldiyl group), a terphenyldiyl group, a quaterphenyldiyl group, a quinquephenyldiyl group, a sexiphenyldiyl group, a septiphenyldiyl group, a octiphenyldiyl group, a noviphenyldiylgroup and a deciphenyldiyl group. The above arylene group may further have a substituent represented by $R_2$-$R_9$ in Formula (1).

Examples of divalent aromatic heterocyclic groups represented by $Ar_1$ and $Ar_2$ include divalent aromatic heterocyclic groups derived from a furan ring, a thiophene ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, a benzomidazole ring, a benzothiazole ring, a benz oxazole ring, a quinoxaline ring, a quinazoline ring, a phthalazine ring, a carbazole ring, a carboline ring, and a carboline ring, in which at least one of carbon atoms of a hydrocarbon ring is replaced by a nitrogen atom. The above aromatic heterocyclic groups may have a substituent represented by $R_2$-$R_9$ in Formula (1).

The divalent connecting group represented by L in Formula (9) is the same as the divalent connecting group represented by L in Formula (10), however, preferable is an alkylene group or a divalent group containing a chalcogen atom, for example, —O— or —S—, and the most preferable is an alkylene group.

The arylene group represented by $Ar_1$ or $Ar_2$ in Formula (10) is the same as the arylene group represented by $Ar_1$ or $Ar_2$ in Formula (9).

The aromatic heterocyclic group represented by $Ar_1$ or $Ar_2$ in Formula (10) is the same as the aromatic heterocyclic group represented by $Ar_1$ or $Ar_2$ in Formula (9).

Examples of the 6 membered aromatic heterocyclic group containing a nitrogen atom represented by $Z_1$, $Z_2$, $Z_3$ or $Z_4$ in Formula (10) include, a pyridine ring, a pyridazine ring, a pyrimidine ring and a pyrazine ring.

Specific examples of the compounds represented by Formulae (2)-(10) are shown below, however, the present invention is not limited thereto:

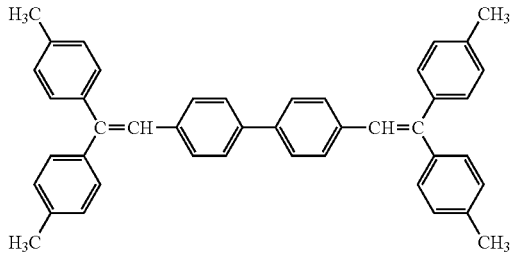

B-1

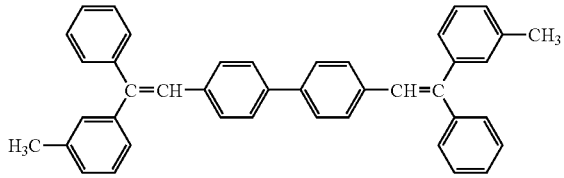

B-2

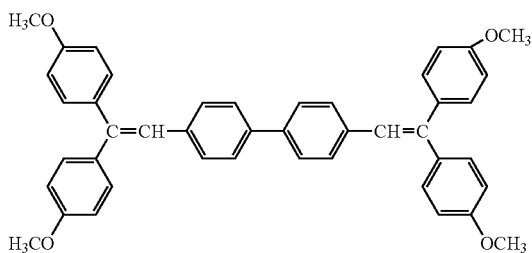

B-3

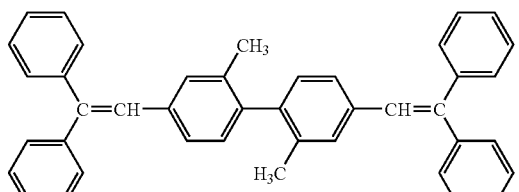

B-4

-continued
B-5
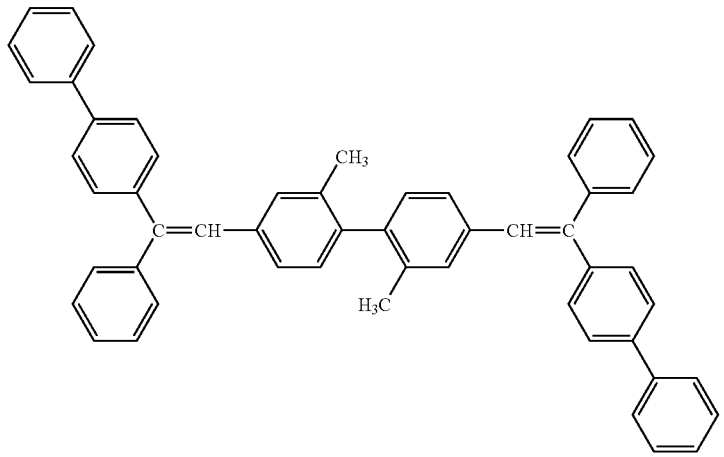
B-6
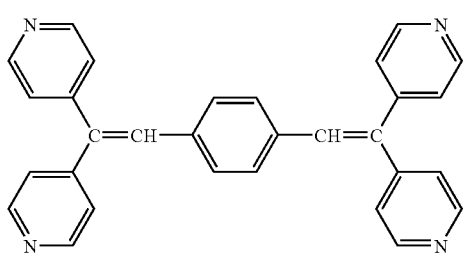
B-7
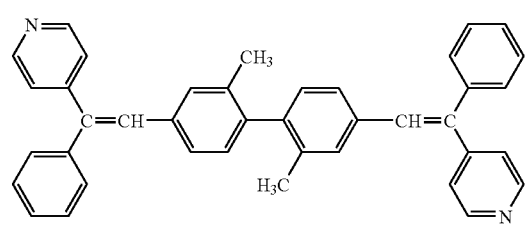
B-8
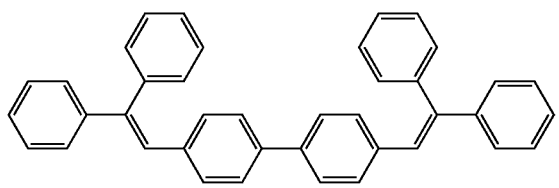
B-9
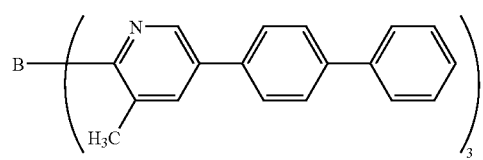
B-10
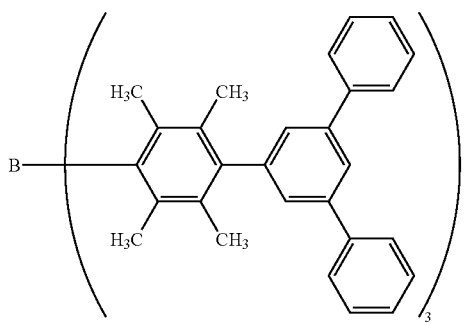
B-11
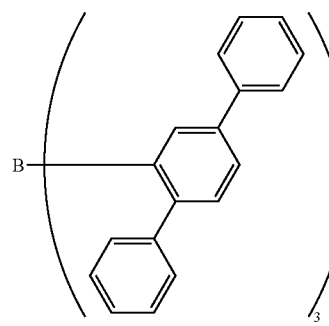
B-12
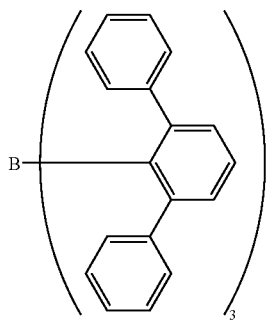
B-13
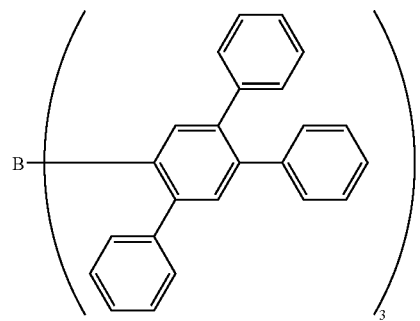

-continued
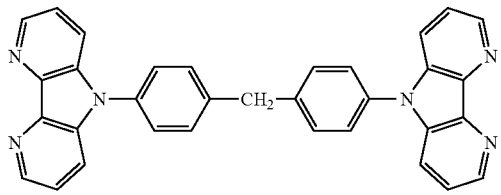
B-14
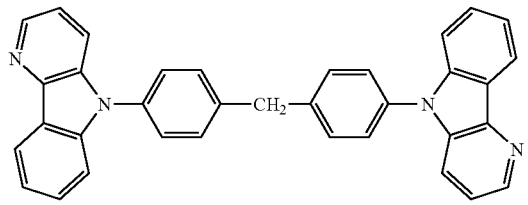
B-15
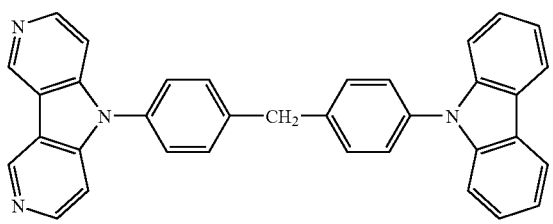
B-16
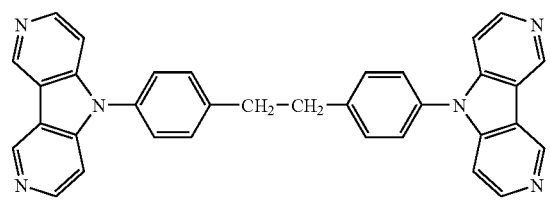
B-17
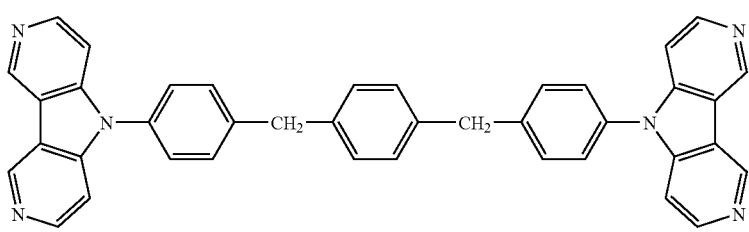
B-18
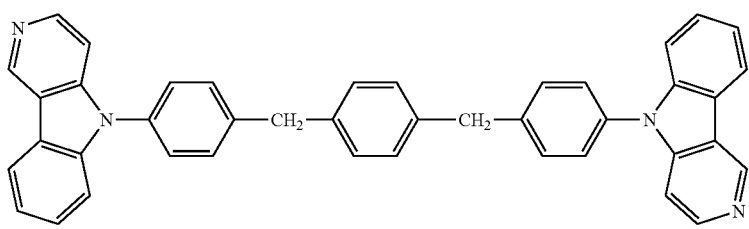
B-19
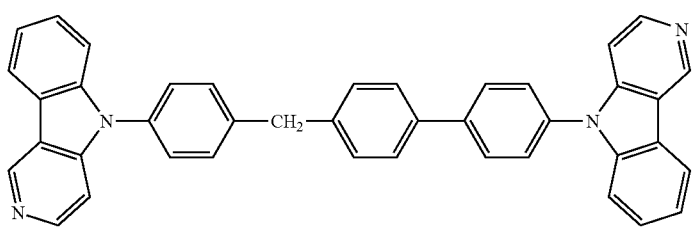
B-20
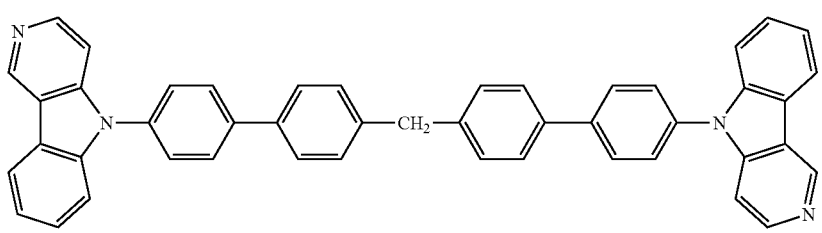
B-21

-continued
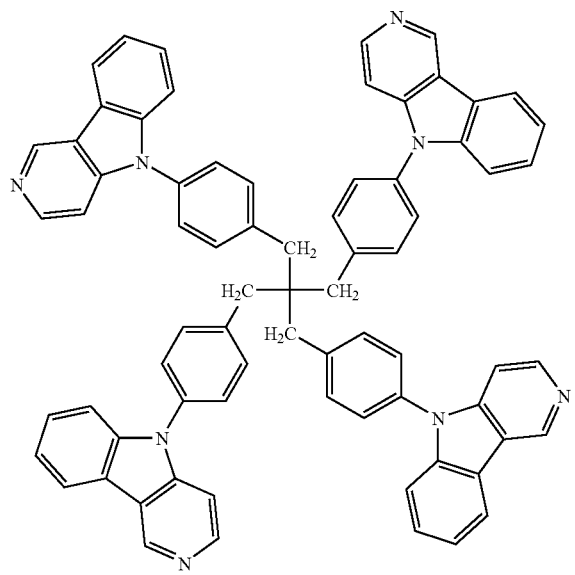
B-22
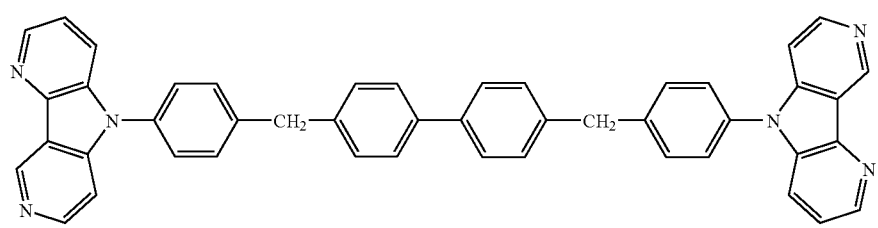
B-23
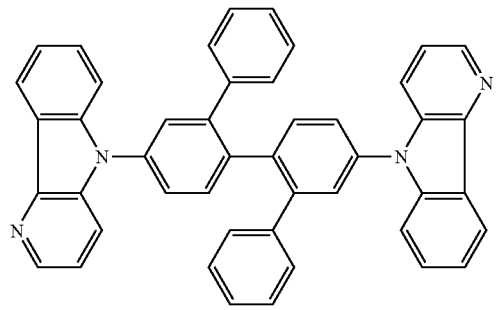
B-24
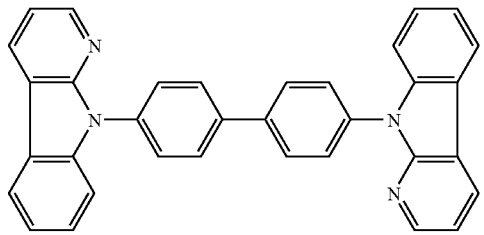
B-25
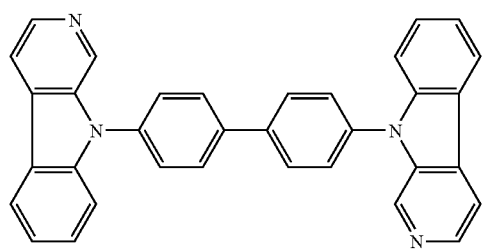
B-26
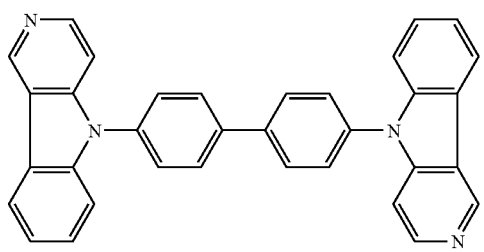
B-27
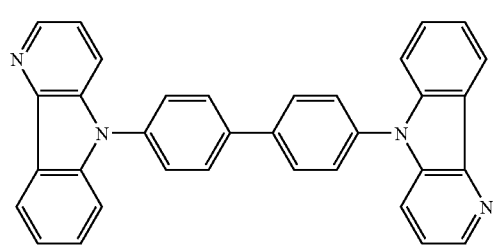
B-28
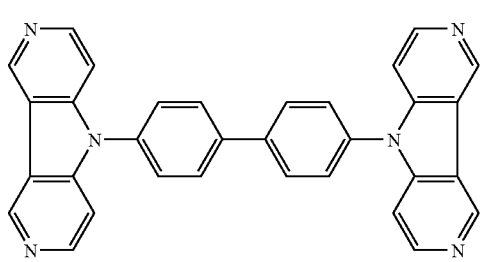
B-29

-continued
B-30
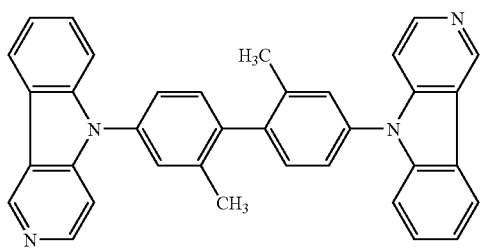
105
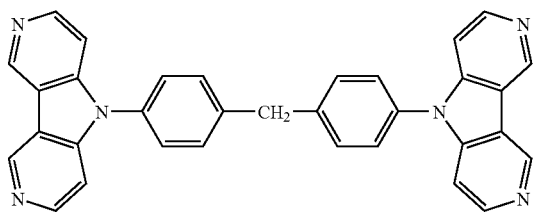
106
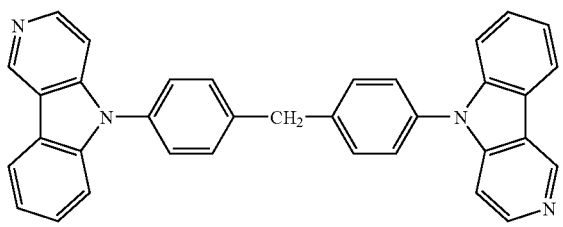
107
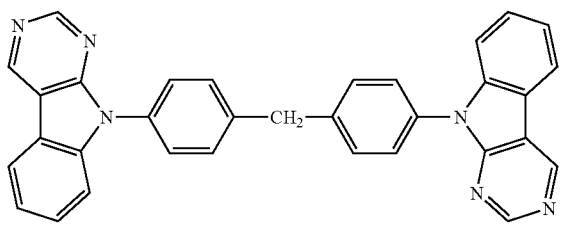
108
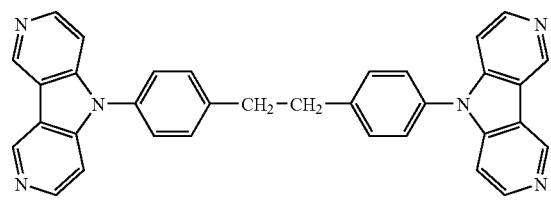
109
110
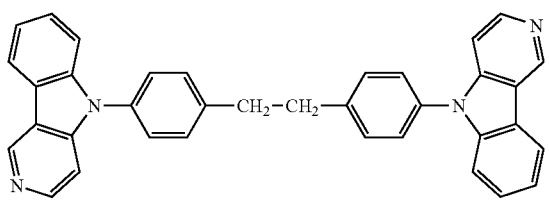
111
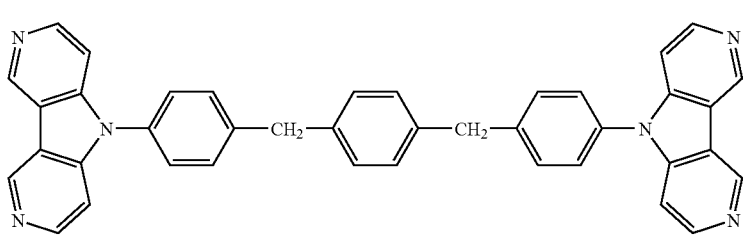
112
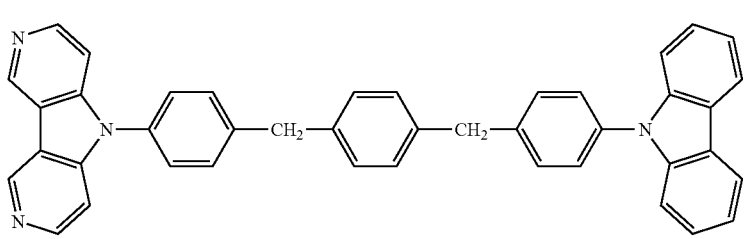

-continued
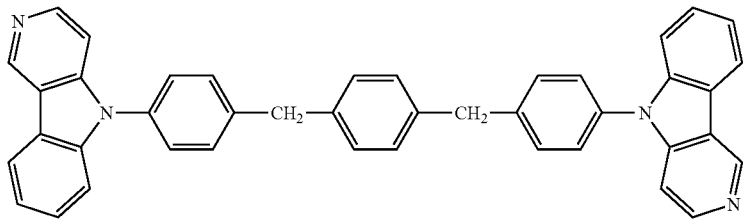
113
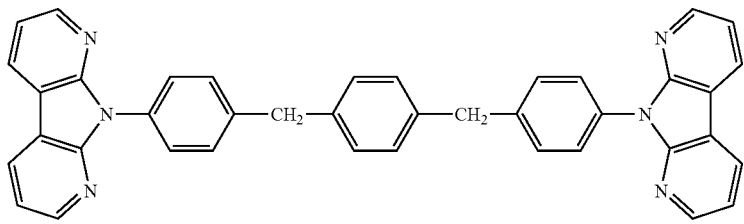
114
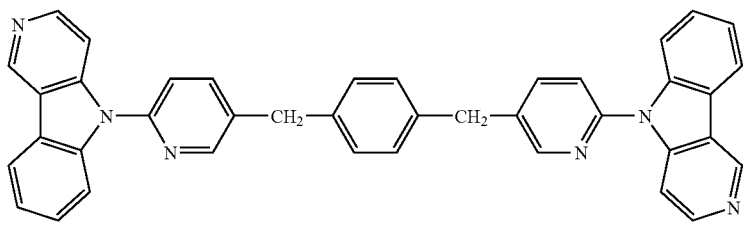
115
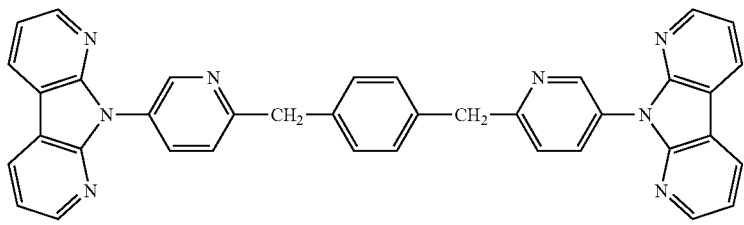
116
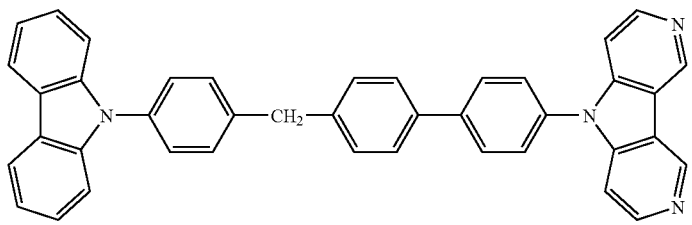
117
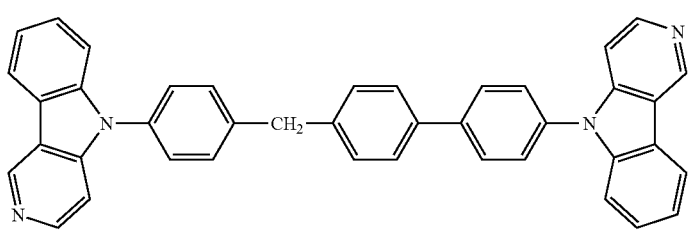
118
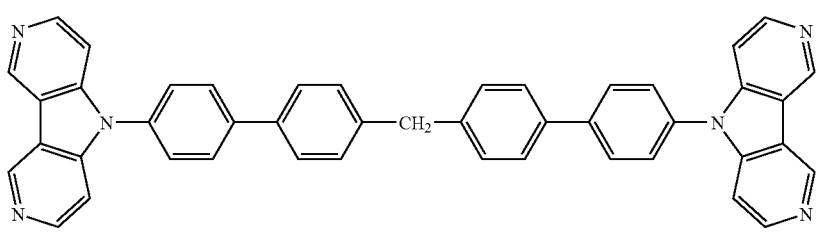
119

-continued
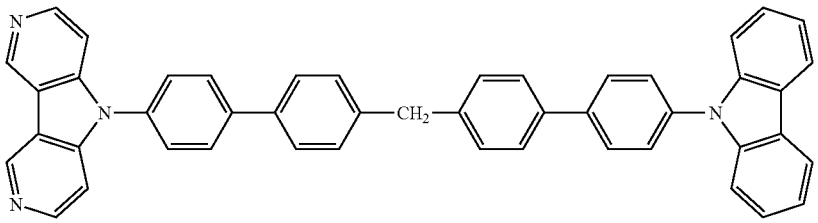
120
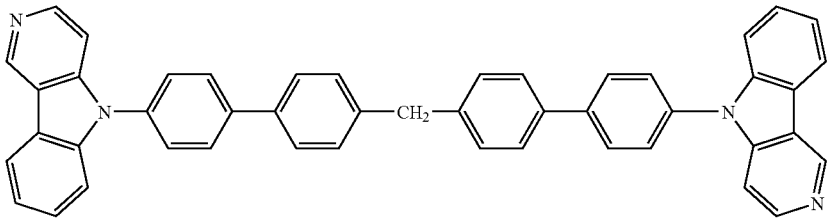
121
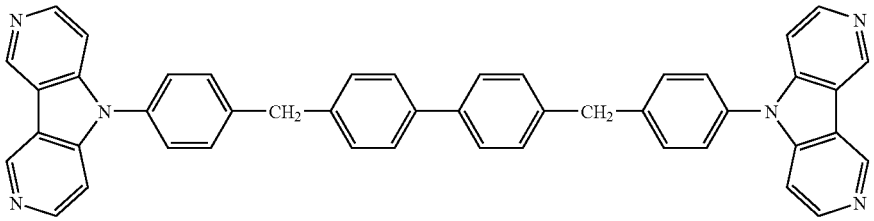
122
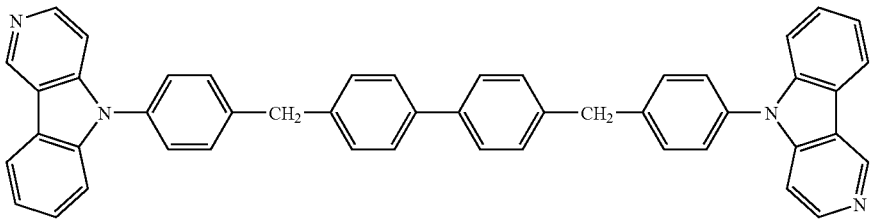
123
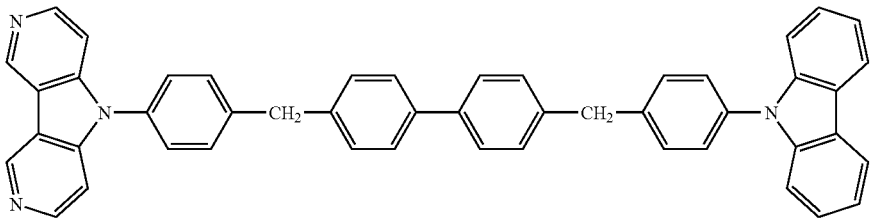
124
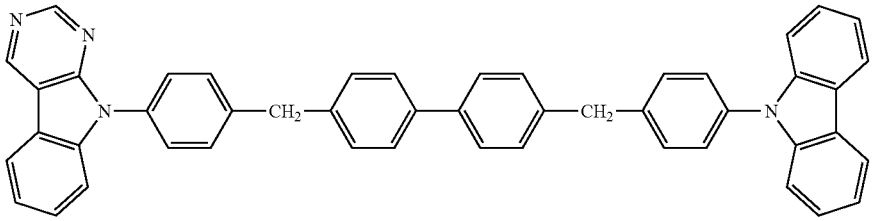
125
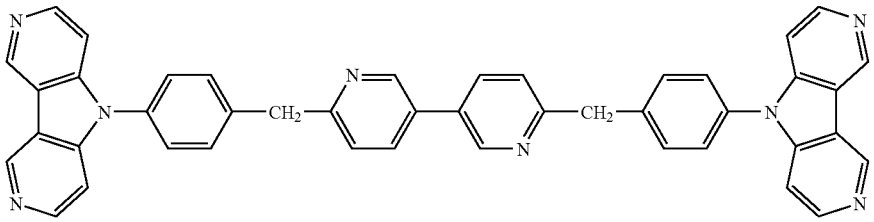
126

-continued
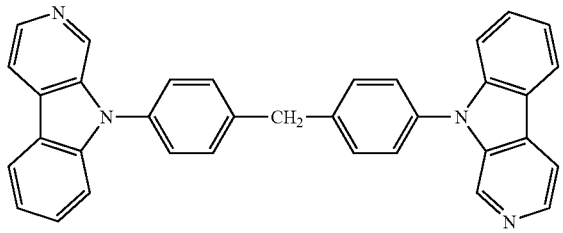
127
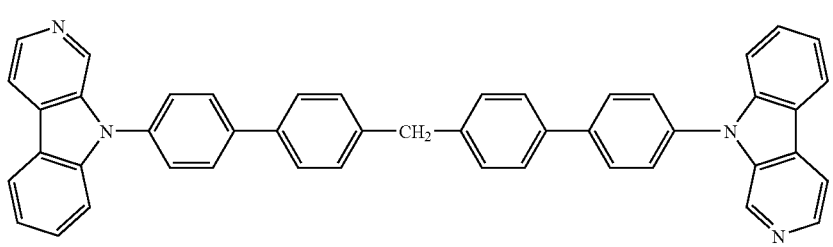
128
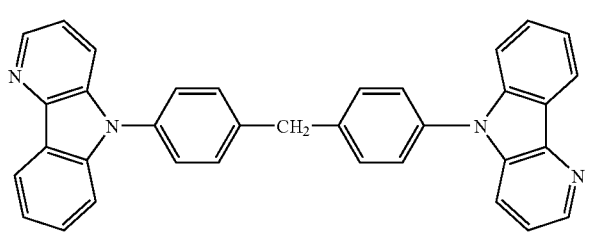
129
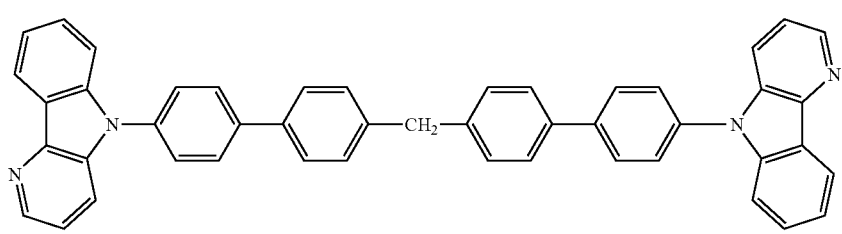
130
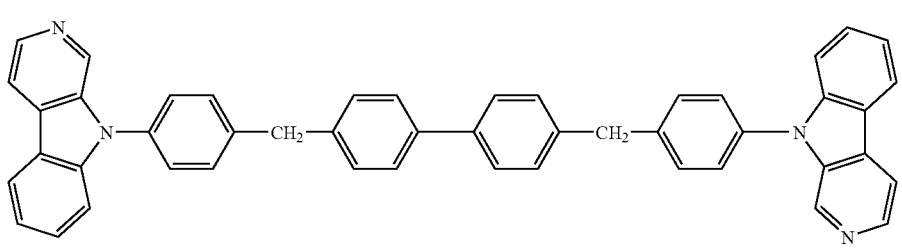
131
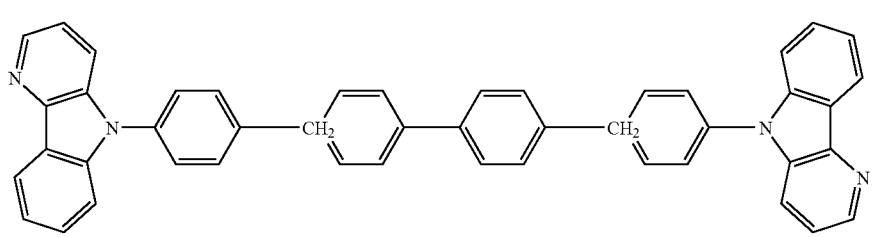
132

-continued
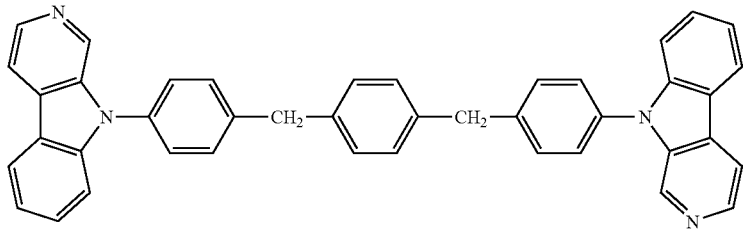
133
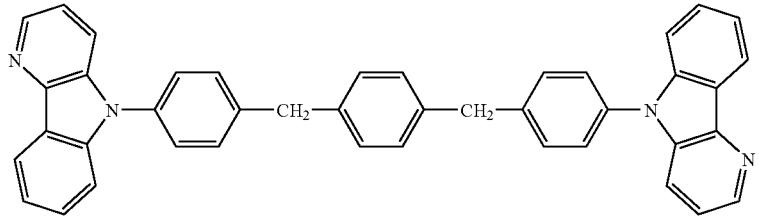
134
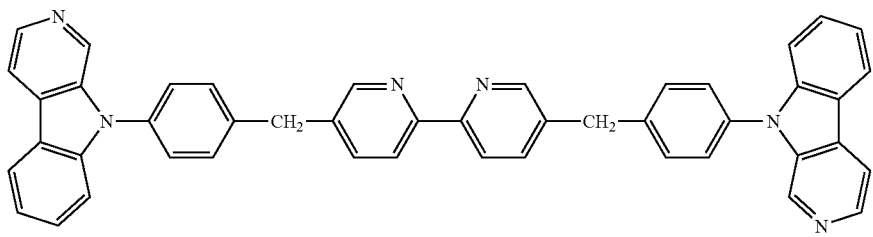
135
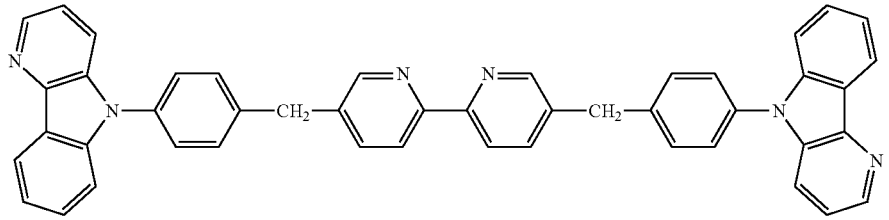
136
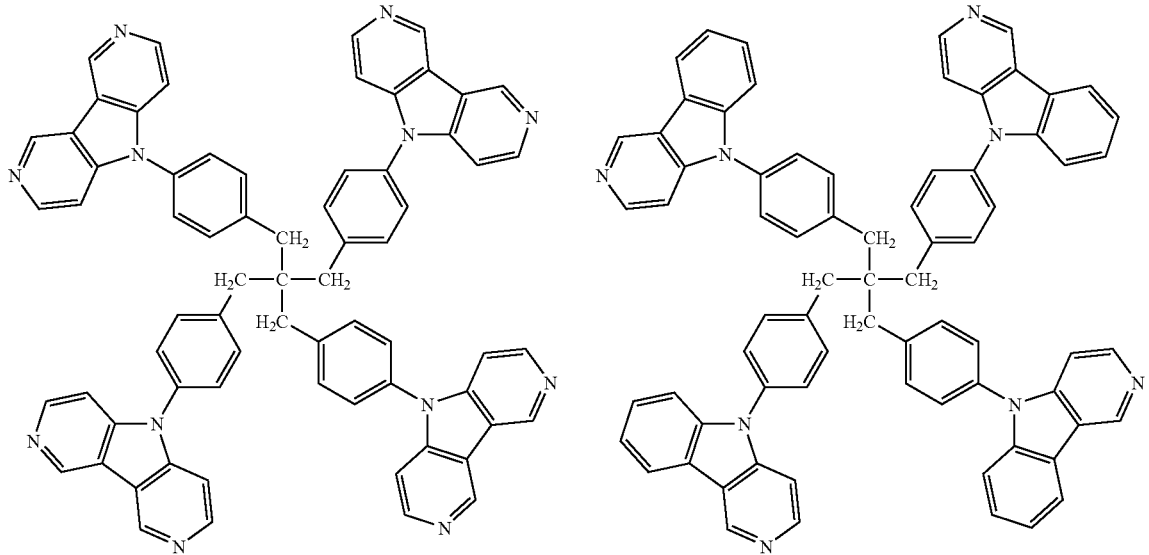
137    138

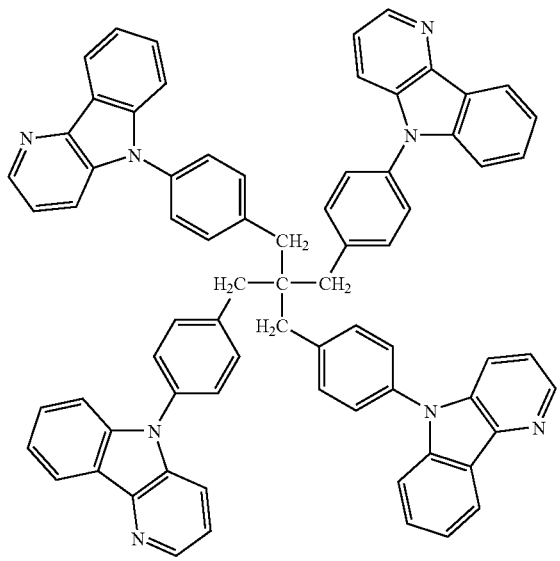
139
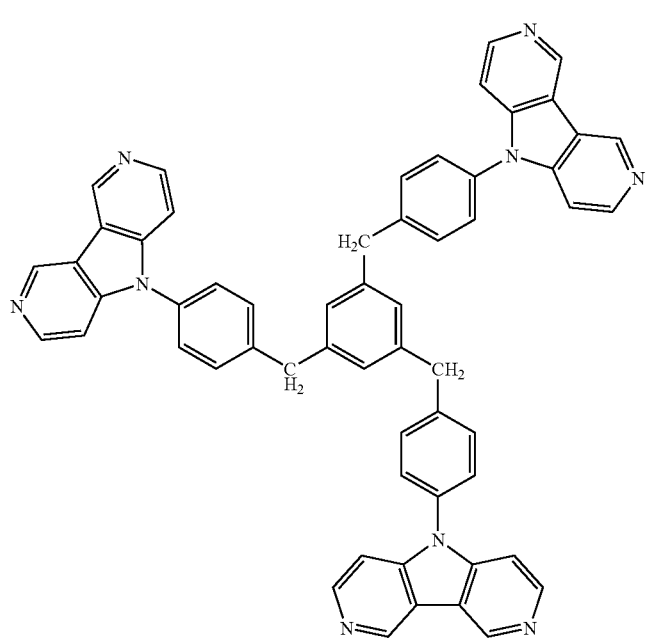
140

141
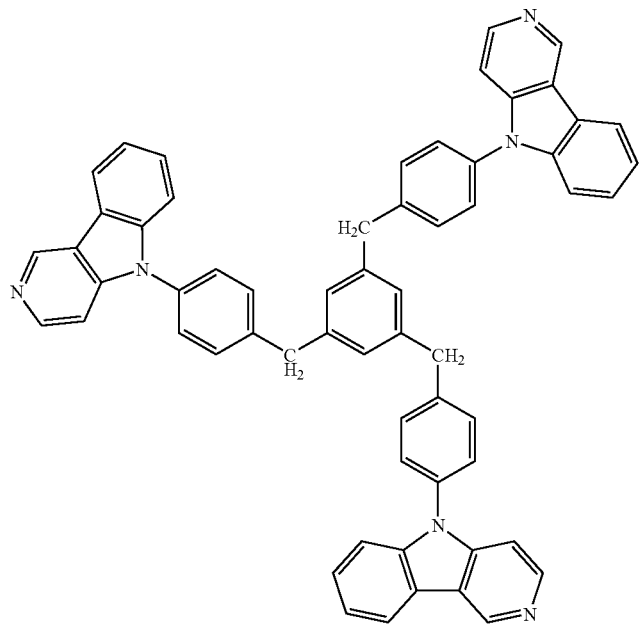
142
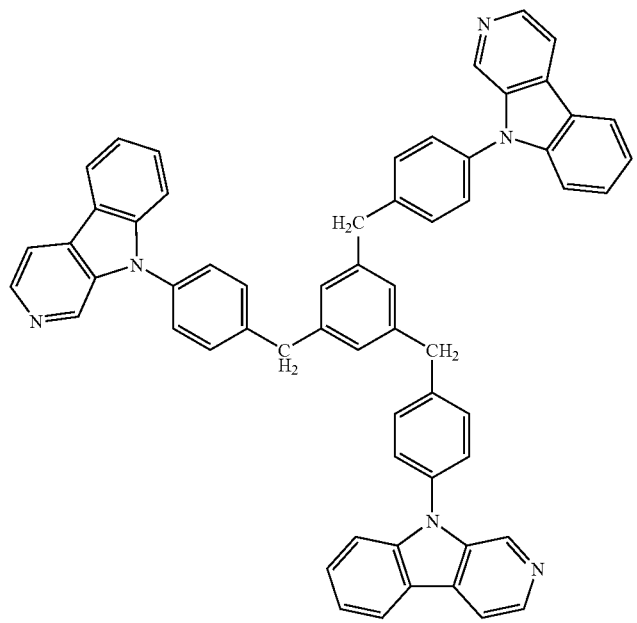
143
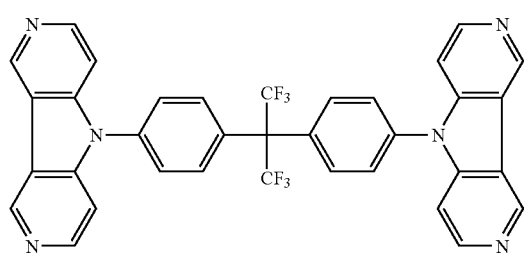

-continued
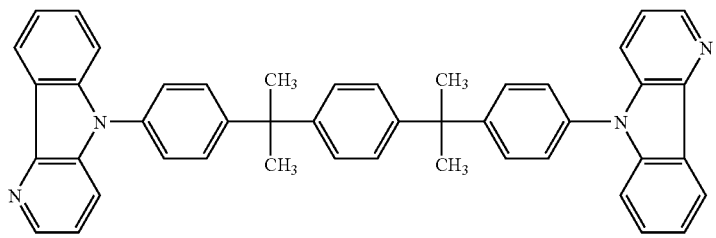
144
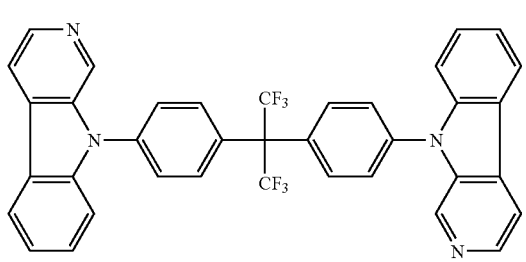
145
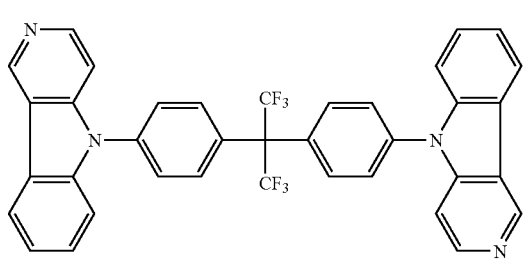
146
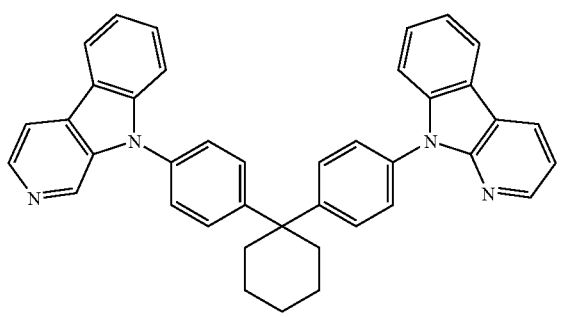
147
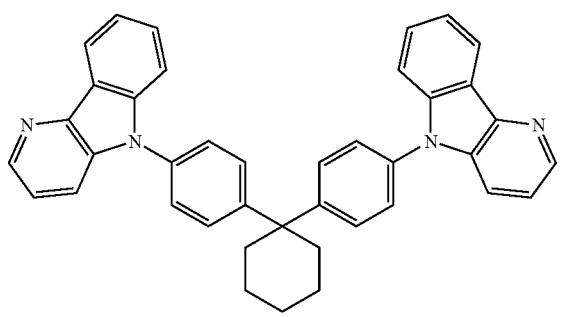
148
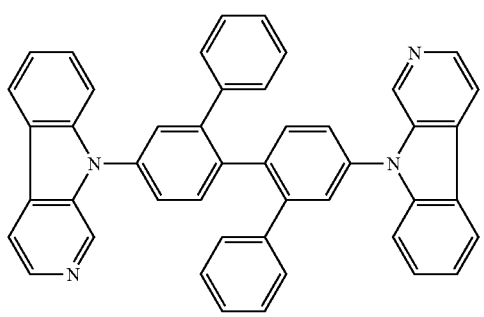
149
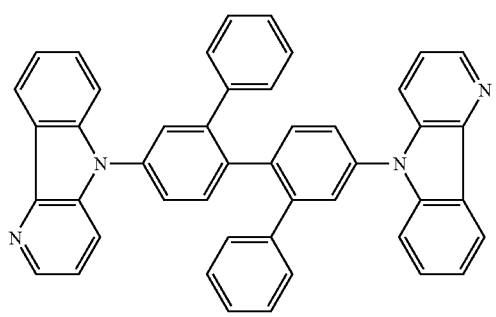
150
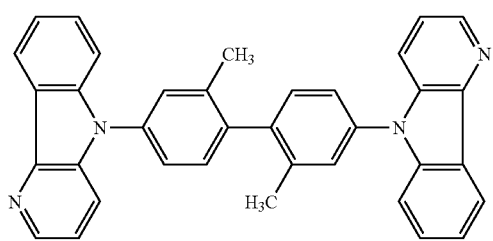
151
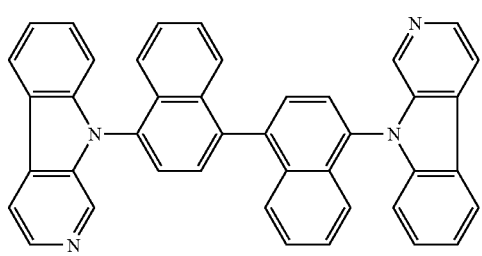
152

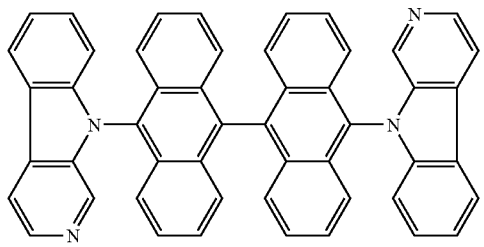

153

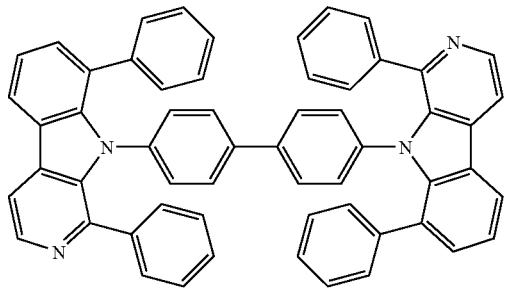

154

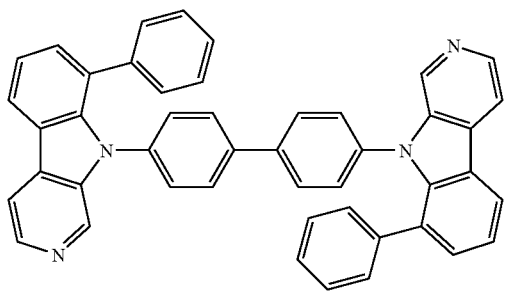

155

Examples of the synthesis of the compounds represented by Formulae (2)-(10) are given below, however, the present invention is not limited thereto.

<Synthesis of the Exemplified Compound 144>

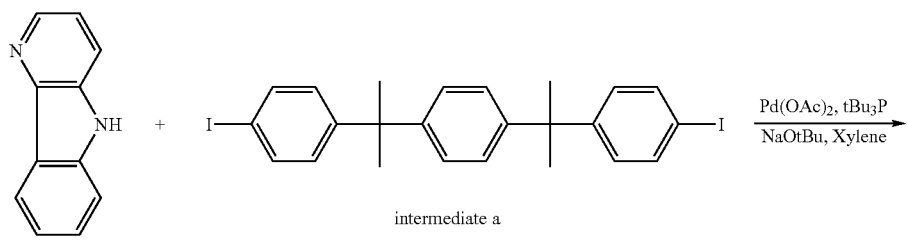

intermediate a

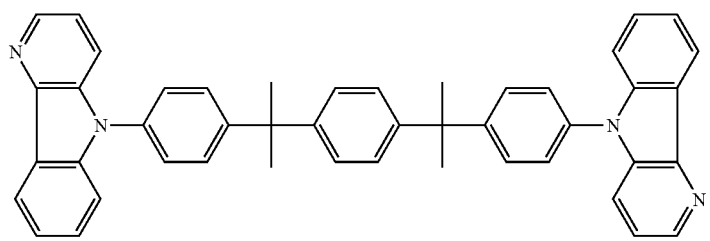

0.16 g of palladium acetate and 0.58 g of 0.16 g tri-tert-butyl phosphine were dissolved in 10 ml of anhydrous toluene. After adding 25 mg of sodium borohydride, the mixture was agitated for 10 minutes at ambient temperature. 2.00 g of carboline, 3.20 g of an intermediate and 1.37 g of sodium-tert-butoxide were further added, and the mixture was dispersed in 50 ml of anhydrous xylene followed by stirring at reflux temperature for 10 hours under a nitrogen atmosphere. After standing the product to cool, chloroform and water were added to separate an organic layer. The organic layer was washed by water and a saturated sodium chloride solution, and condensed under a reduced pressure. The residue was recrystallized in acetic acid, and 1.5 g of colorless crystal of the exemplified compound 144 was obtained.

The structure of the exemplified compound 144 was identified with a $^1$H-NMR spectrum and a mass spectroscopy. The spectrum data are as follows:

MS(FAB) m/z: 647 (M$^{+1}$) $^1$H-NMR (400 MHz, CDCl$_3$) δ/ppm 1.80 (S, 12H), 7.27 (S, 4H), 7.34 (dd, J=4.9 Hz, J=8.3 Hz, 2H), 7.3-7.4 (m, 2H), 7.4-7.5 (m, 12H), 7.76 (dd, J=1.3 Hz, J=8.3 Hz, 2H), 8.45 (d, J=7.8 Hz, 2H), 8.63 (dd, J=1.3 Hz, J=4.9 Hz, 2H)

<Synthesis of the Exemplified Compound 143>

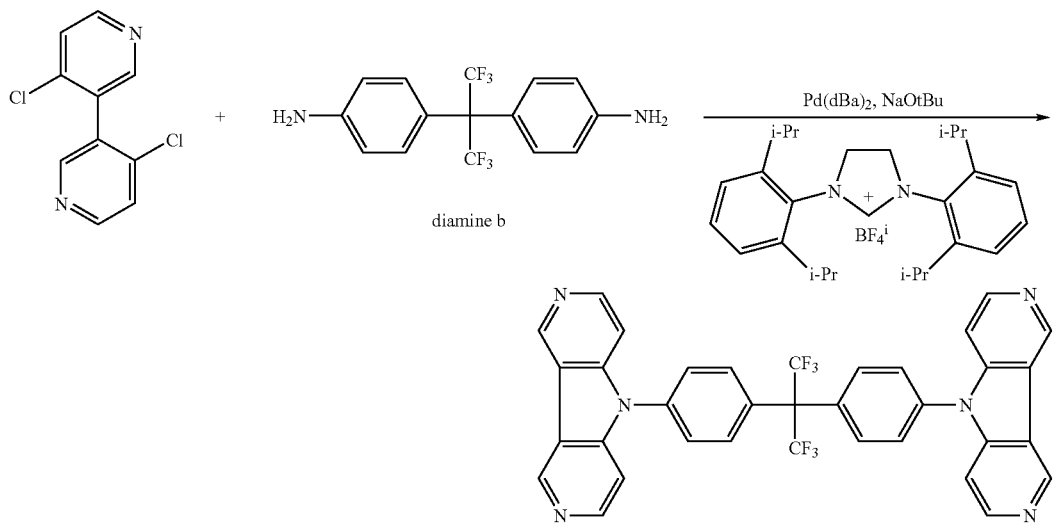

0.85 g of 4,4'-dichloro-3,3'-bipyridyl, 0.59 g of diamine b, 44 mg of dibenzylideneacetone palladium, 36 mg of imidazolium salt, and 1.09 g of the sodium-tert-butoxide were added to 5 ml of dimethoxy ethane 5 ml, and stirred for 24 hours under heating at 80° C. After standing the product to cool, chloroform and water were added to separate an organic layer. The organic layer was washed by water and a saturated sodium chloride solution, and condensed under a reduced pressure. The residue was recrystallized in ethyl acetate, and 0.3 g of colorless crystal of the exemplified compound 143 was obtained.

The structure of the exemplified compound 143 was identified with a $^1$H-NMR spectrum and a mass spectroscopy. The spectrum data are as follows:

MS(FAB) m/z 639 ($M^{+1}$) $^1$H-NMR (400 MHz, $CDCl_3$): δ/ppm 7.46 (d, J=5.7 Hz, 4H), 7.6-7.7 (m, 4H), 7.8-7.9 (m, 4H), 8.67 (d, J=5.7 Hz, 4H), 9.51 (S, 4H)

<Synthesis of the Exemplified Compound 145>

The exemplified compound 145 was synthesized in the same manner as the exemplified compound 145 except that a pyridine ring of 4,4'-dichloro-3,3'-bipyridyl was replaced by benzene.

The structure of the exemplified compound 145 was identified with a $^1$H-NMR spectrum and a mass spectroscopy. The spectrum data are as follows:

MS(FAB) m/z 639 ($M^{+1}$) $^1$H-NMR (400 MHz, $CDCl_3$): δ/ppm 7.3-7.4 (m, 2H), 7.6-7.7 (m, 4H), 7.7-7.8 (m, 4H), 7.8-7.9 (m, 4H), 8.06 (d, J=5.3 Hz, 2H), 8.23 (d, J=7.8 Hz, 2H), 8.56 (d, J=5.3 Hz, 2H), 8.96 (S, 2H)

In addition to the above-mentioned synthetic example, a carboline derivative and a carboline derivative in which at least one of carbon atoms of a carboline moiety is substituted with a nitrogen atom, and analogous compounds may be synthesized according to: J. Chem. Soc., Perkin Trans., 1, 1505-1510 (1999), Pol. J. Chem., 54, 1585 (1980), and (Tetrahedron Lett., 41 (2000), 481-484). Introduction of a core or a connecting group, for example, an aromatic ring, a heterocyclic ring or an alkyl group into synthesized azacarbazole ring or its analog may be carried out by means of a well known method, such as an Ullman coupling, a coupling which used the Pd catalyst, or a Suzuki coupling.

Other examples of compounds are disclosed in, for example, JP-A Nos. 2003-31367 and 2003-31368.

Other examples of compounds are disclosed in JP-A Nos. 2003-31367 and 2003-31368.

The electron blocking layer is an hole transporting layer in a broad sense, and is comprised of material having an ability of transporting holes but an extremely poor ability of transporting electrons, which may increase a recombination probability of electrons and holes by transporting holes and blocking electrons.

<Light Emission Layer>

The light emission layer in the present invention contains light emitting materials and is a layer where electrons and holes, injected from electrodes, an electron transporting layer or a hole transporting layer, are recombined to emit light. The portions where light emits may be in the light emission layer or at the interface between the light emission layer and the layer adjacent thereto.

The light emission layer of the present invention contains a compound (host compound) having a partial structure represented by above mentioned Formula (1) and having a molecular weight not more than 1700, by which a high emission intensity, a high emission efficiency and a long life of the organic EL element is attained.

In the present invention, a phosphorescent compound material is preferably used as a light emission layer, use of which enables to obtain a high emission intensity and a high efficiency. A phosphorescent compound is a compound which emits light from the excited triplet, emits phosphorescence at room temperature (25° C.), and has a phosphorescent quantum yield at 25° C. of not less than 0.01. The phosphorescent quantum yield at 25° C. is preferably not less than 0.1.

The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. The phosphorescent compounds used in the present invention exhibit phosphorescent quantum yields measured employing at least one of arbitrary solvents within the above-described range.

The light emission of the phosphorescent compound is divided in two types in principle, one is an energy transfer type in which recombination of a carrier occurs on the host to which the carrier is transported to excite the host, the resulting energy is transferred to the phosphorescent compound, and light is emitted from the phosphorescent compound, and the other is a carrier trap type in which recombination of a carrier occurs on the phosphorescent compound, a carrier trap material, and light is emitted from the phosphorescent compound. However, in each type, energy level of the phosphorescent compound in excited state is lower than that of the host in excited state.

The phosphorescent compound is suitably selected from those used in the light emission layer of an organic EL element in the prior art.

The phosphorescent compound used in the present invention is preferably a metal compound containing osmium, iridium or a platinum compound (a platinum complex). Use of one of these compound enables to obtain a higher emission intensity and a higher emission efficiency.

Examples of the phosphorescent compound used in the present invention will be listed below, however, the present invention is not limited thereto. These compounds can be synthesized according to a method described in Inorg. Chem., 40, 1704-1711 (2001).

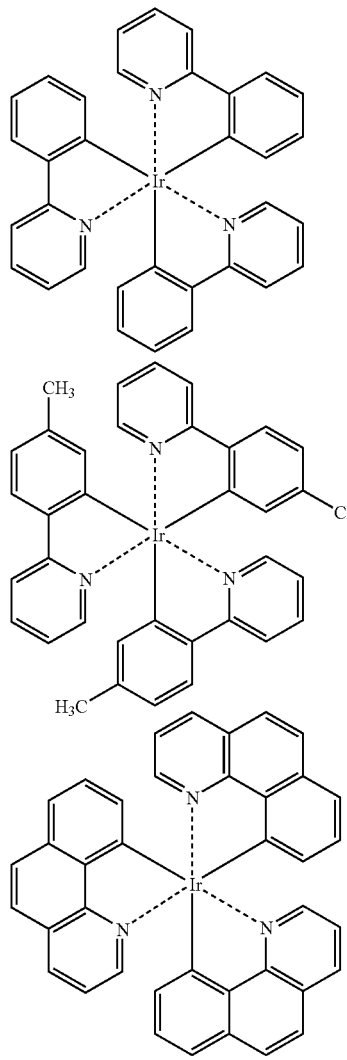

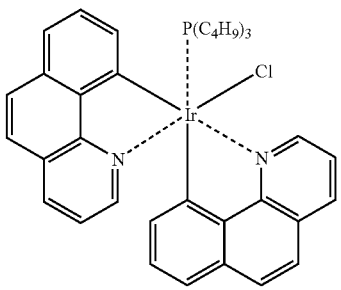

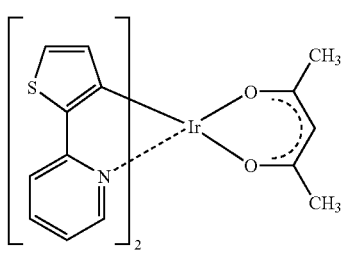

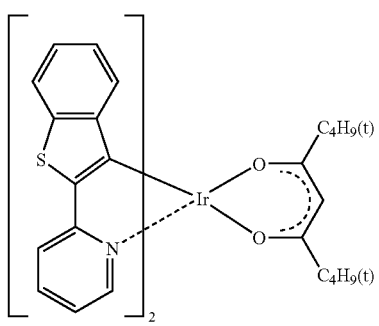

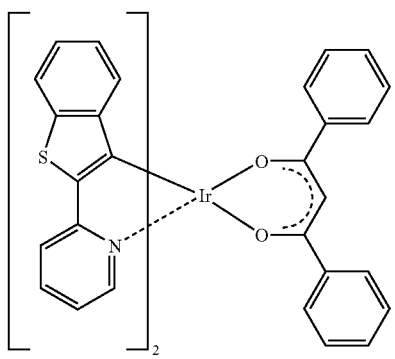

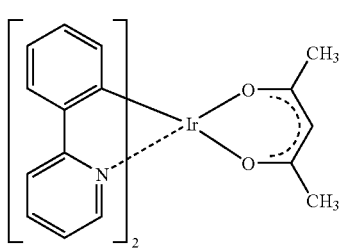

-continued
Ir-9
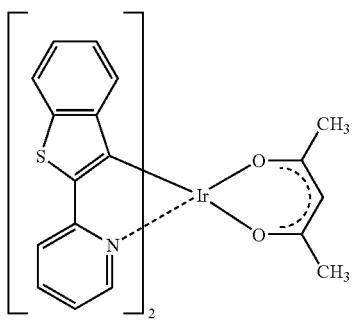
Ir-10
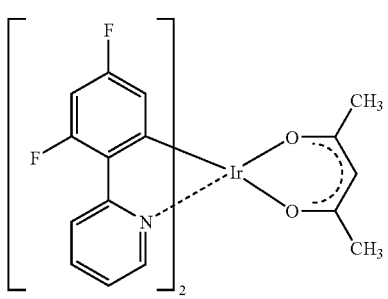
Ir-11
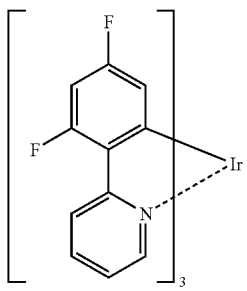
Ir-12
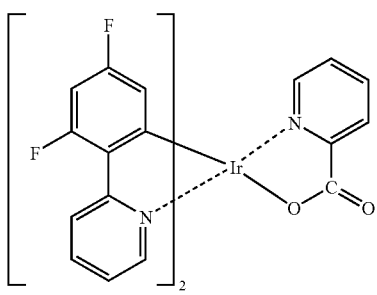
Ir-13
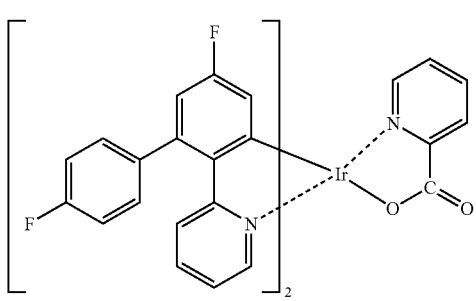
-continued
Pt-1
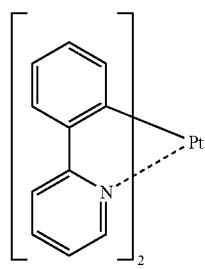
Pt-2
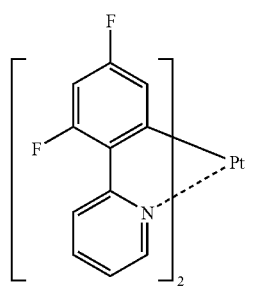
Pt-3
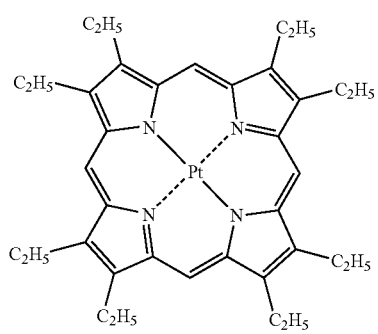
Pd-1
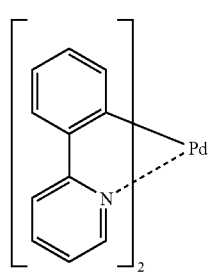
Pd-2
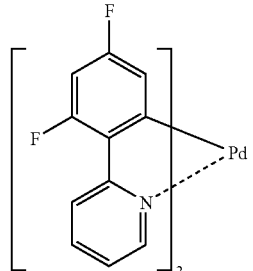

-continued
Pd-3
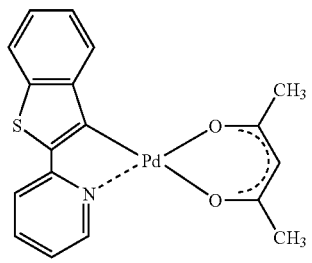
Rh-1
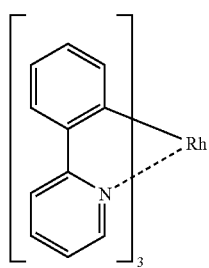
Rh-2
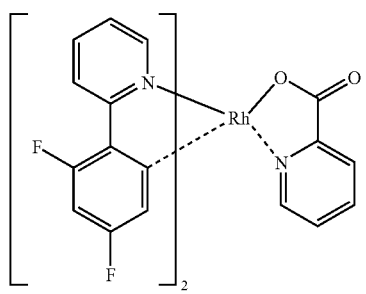
Rh-3
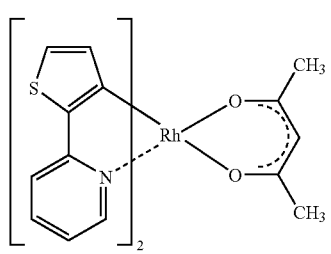
A-1
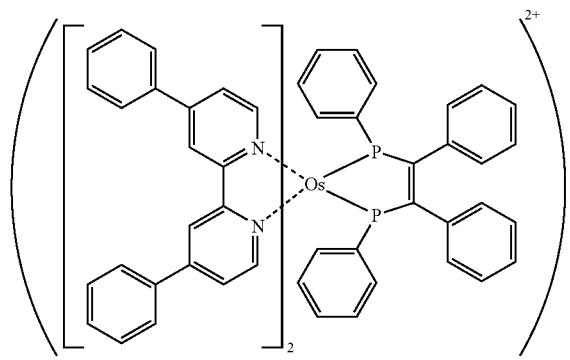
(CF$_3$CF$_2$CF$_2$COO$^-$)$_2$
-continued
D-1
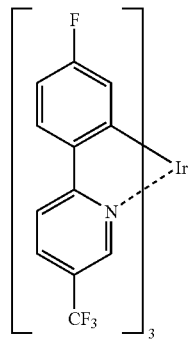
D-2
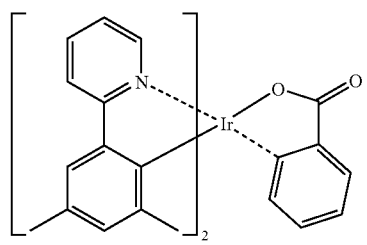
D-3
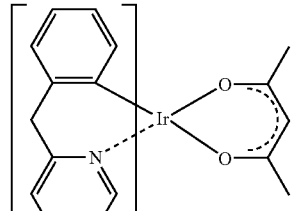
D-4
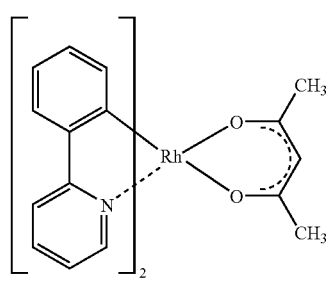
D-5
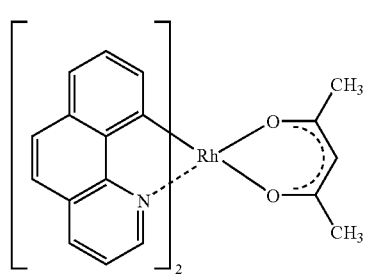

-continued

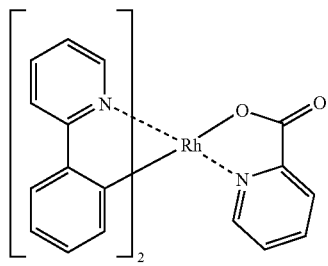

D-6

In the present invention, the wavelength providing a phosphorescence maximum of the phosphorescent compound is not specifically limited. Theoretically, the phosphorescence wavelength can be varied by selecting a center metal, a ligand, or a substituent of the ligand of complexes used. The phosphorescent compound is preferably a phosphorescent compound having a wavelength providing a phosphorescence maximum in the wavelength regions of from 380 to 430 nm. Such an organic electroluminescent element emitting a blue or white light phosphorescence can provide higher emission efficiency and a long half-life period.

Use of a plurality of phosphorescent compounds enables to mix emissions of different colors and emission of an arbitrary color becomes possible. By adjusting types and amounts of phosphorescent compounds, emission of white light is possible, which enables to apply the organic EL element to an illuminator and to a back light of a display.

The light emission layer may contain a plurality of host compounds known in the art in addition to the compound having a partial structure represented by Formula (1) and having a molecular weight of not more than 1700. Use of a plurality of host compounds enables to control the mobility of electrons and to improve the efficiency of the organic EL element. As the host compounds known in the art, there is preferable a compound having: (i) a hole transport ability; (ii) a electron transport ability; (iii) a property to prevent a shift of emission to a longer wavelength; and (iv) a higher Tg (glass-transition temperature).

Specific examples of the compounds known in the art are disclosed in the following patent documents, for example: JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

The light emission layer may contain a host compound having a wavelength providing a fluorescence maximum as a host compound. In this case, the electroluminescence of the EL element is emitted from the fluorescent compound to which energy is transferred from another host compound and the phosphorescent compound. The host compound having a wavelength providing a fluorescence maximum preferably has a high fluorescence quantum yield in the form of solution. Herein, the fluorescence quantum yield is preferably not less than 10%, and more preferably not less than 30%. Examples of the a host compound having a wavelength providing a fluorescence maximum include a coumarin dye, a cyanine dye, a chloconium dye, a squalenium dye, an oxobenzanthracene dye, a fluorescene dye, a rhodamine dye, a pyrylium dye, a perylene dye, a stilbene dye, and a polythiophene dye. The fluorescence quantum yield can be measured according to a method described in the fourth edition, Jikken Kagaku Koza 7, Bunko II, p. 362 (1992) (published by Maruzen).

Figure 4:
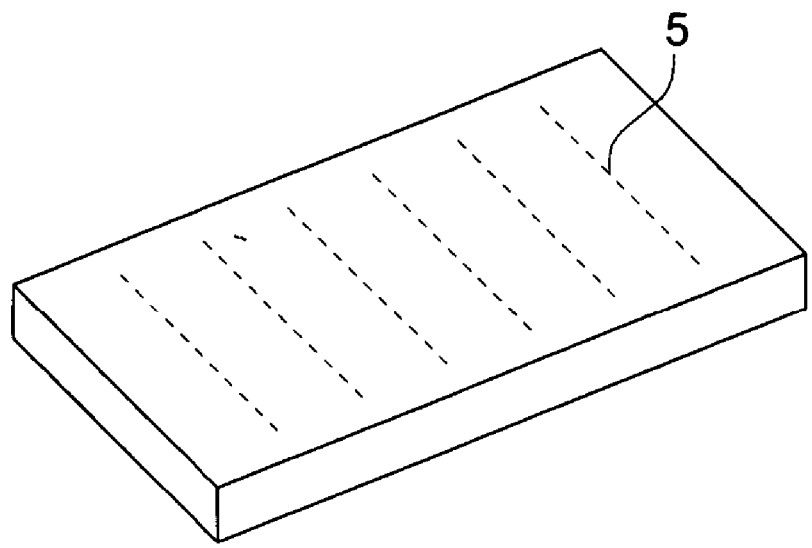
FIG. 4 is a schematic drawing of a display employing a passive matrix method.
Figure 4:
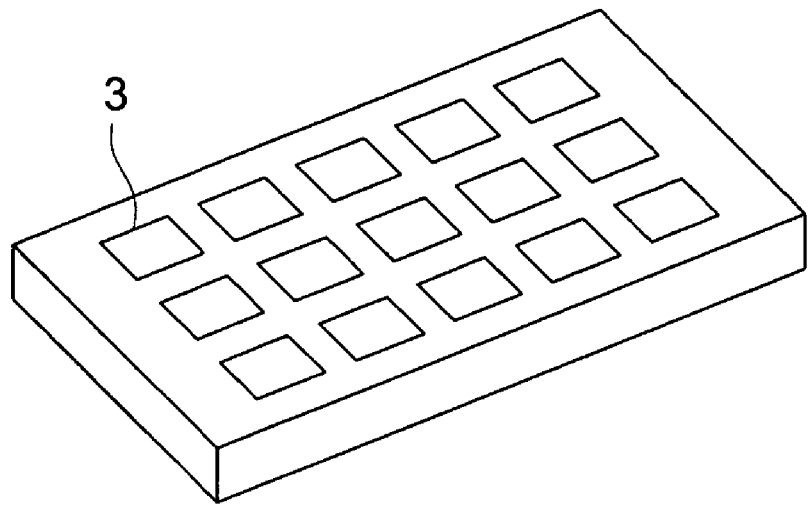
Figure 4:
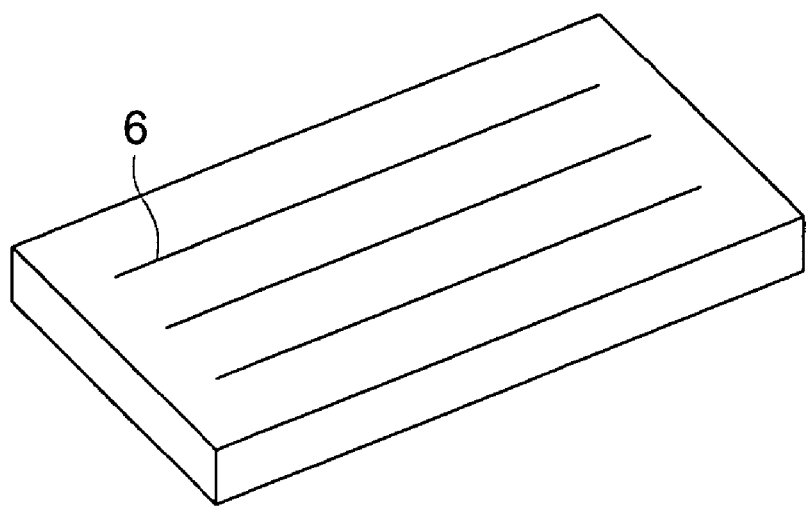

Color of light emitted from the fluorescent compound in the present invention is measured by a spectral light meter CS-1000, manufactured by Minolta Co., Ltd., and expressed according to CIE chromaticity diagram described in FIG. 4.16 on page 108 of "Shinpen Shikisai Kagaku Handbook" (Coloring Science Handbook, New Edition), edited by Nihon Shikisai Gakkai, published by Todai Shuppan Kai, 1985.

The light emission layer can be formed employing the above-described compounds and a known method such as a vacuum evaporation method, a spin coat method, a casting method, an LB method or an ink jet method. The thickness of the light emission layer is not specifically limited, but is ordinarily from 5 nm to 5 μm, and preferably from 5 to 200 nm. The light emission layer may be composed of a single layer containing one or two or more of the phosphorescent compound or the host compound, or of plural layers composed of the same composition or different composition.

<Hole Transporting Layer>

The hole transporting layer is composed of a hole transporting material having an ability of transporting holes, and a hole injecting layer and an electron blocking layer are included in the hole transporting layer in a broad sense. The hole transporting layer may be a single layer or plural layers.

As a hole transporting material, there is no restriction in particular, and arbitrary compounds may be selected to use from the well known compounds which are (i) conventionally used in a photo conducting material as a charge injecting and transporting material of holes or (ii) used in a hole injecting layer and a hole transporting layer of an EL element.

The hole transporting material may be either an organic substance or an inorganic substance as long as it has a hole injecting ability, a hole transporting ability or an ability to form a barrier to electrons. Examples of thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer.

As the hole transporting material, those described above are used, but a porphyrin compound, an aromatic tertiary amine compound or a styrylamine compound is preferably used, and an aromatic tertiary amine compound is more preferably used.

Typical examples of the aromatic tertiary amine compound and styrylamine compound include N,N,N',N'-tetraphenyl-4, 4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N, N-diphenylaminostylbene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in JP-A No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used.

As the hole injecting material or the hole transporting material, inorganic compounds such as p-Si and p-SiC are usable.

The organic EL element using the hole transporting material of the present invention in the hole transport layer preferably have a fluorescence maximum at a wave length not longer than 415 nm. Namely, the hole transporting material preferably prevents a shift of the emission towards a longer wave length and has a higher Tg while having a hole transporting ability.

The hole transporting layer can be formed by layering the hole transporting material by a known method such as a vacuum evaporation method, a spin coat method, a casting method, an ink jet method, and an LB method. The thickness of the hole transporting layer is not specifically limited, but is ordinarily from 5 to 5000 nm. The hole transporting layer may be composed of a single layer structure containing one or two or more of the materials mentioned above.

<Electron Transporting Layer>

The electron transporting layer contains a material (an electron transporting material) having an electron transporting ability, and in a broad sense refers to an electron injecting layer or a hole blocking layer. The electron transporting layer can be provided as a single layer or plural layers.

Examples of the electron transporting material (which serves also as a hole blocking material,) used in a single electron transporting layer or in the electron transporting layer closest to the cathode of plural electron transporting layers include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material.

The electron transporting layer may be any layer, as long as it has a function of incorporating electrons injected from a cathode to a light emission layer, and a material used in the electron transporting layer can be optionally selected from known compounds used as electron transporting materials.

A polymer in which the material mentioned above is introduced in the polymer side chain or a polymer having the material as the polymer main chain can be also used.

A metal complex of an 8-quinolynol derivative such as aluminum tris-(8-quinolynol) ($Alq_3$), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), or zinc bis-(8-quinolynol) ($Znq_2$), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emission layer may preferably be employed as the electron transporting material. An inorganic semiconductor such as n-Si and n-SiC may also be used as the electron transport material in a similar way as in the hole transporting layer.

The organic EL element using the electron transporting material of the present invention in the electron transport layer preferably have a fluorescence maximum at a wave length not longer than 415 nm. Namely, the electron transporting material preferably prevents a shift of the emission towards a longer wave length and has a higher Tg while having a electron transporting ability.

The electron transporting layer can be formed employing the above-described electron transporting materials and a known method such as a vacuum evaporation method, a spin coat method, a casting method, a printing method including an ink jet method or an LB method. The thickness of electron transporting layer is not specifically limited, but is ordinarily from 5 to 5000 nm. The electron transporting layer may be composed of a single layer comprising one or two or more of the electron transporting material.

<Substrate (Referred to as Also Base Plate, Base or Support)>

The substrate employed for the organic electroluminescent element of the present invention is not restricted to specific kinds of materials such as glass and plastic, as far as it is transparent. Examples of the substrate preferably used include glass, quartz and light transmissible plastic film. Especially preferred one is a resin film capable of providing flexibility to the organic EL element.

The substrate employed for the organic electroluminescent element of the present invention is not restricted to specific kinds of materials such as glass and plastic, as far as it is transparent. Examples of the substrate preferably used include glass, quartz and light transmissible plastic film. Especially preferred one is a resin film capable of providing flexibility to the organic EL element.

The surface of the resin film may have a layer of an inorganic or organic compound or a hybrid layer of both compounds.

The external light emission efficiency of the organic electroluminescent element of the present invention is preferably not less than 1%, and more preferably not less than 2% at room temperature. Herein, external quantum yield (%) is represented by the following formula:

External quantum yield(%)=(the number of photons emitted to the exterior of the organic electroluminescent element×100)/(the number of electrons supplied to the organic electroluminescent element)

A hue improving filter such as a color filter may also be used.

The multi color display of the present invention has a organic EL element exhibiting at least two wave lengths giving fluorescence maximum, example of which are shown below:

<Preparation of Organic EL Element>

For one example, the preparation of the organic EL element, which has the constitution, Anode/Anode buffer layer/Light emission layer/Hole blocking layer/Electron transporting layer/Cathode, will be described.

A layer of a desired material for an electrode such as a material of the anode is formed on a suitable substrate by an evaporation or sputtering method to prepare the anode, so that the thickness of the layer is not more than 1 μm, and preferably within the range of from 10 to 200 nm. Then organic thin layers of the anode buffer layer, the light emission layer, the hole blocking layer and the electron transporting layer, which constitute the organic EL element, are formed on the resulting anode in that order.

As methods for formation of the thin layers, there are a spin coating method, a casting method, an ink jet method, a vacuum evaporation method, and a printing method, however, a spin coating method and a vacuum evaporation method are preferably used, because a uniform and pin hole free thin layer can be formed. Different methods may be used for formation of different layers. When the vacuum evaporation method is used for the thin layer formation method, although conditions of the vacuum evaporation differs due to kinds of materials used, vacuum evaporation is preferably carried out at a boat temperature of from 50° C. to 450° C., at a degree of vacuum of from $10^{-6}$ to $10^{-2}$ Pa, at a evaporation speed of from 0.01 to 50 nm/second, and at a substrate temperature of from −50 to 300° C. to form a layer with a thickness of from 0.1 nm to 5 μm.

After these layers has been formed, a thin layer comprised of a material for a cathode is formed thereon to prepare a cathode, employing, for example, an evaporation method or sputtering method to give a thickness of not more than 1 μm, and preferably from 50 to 200 nm. Thus, a desired organic EL element is obtained. It is preferred that the layers from the hole injecting layer to the cathode are continuously formed under one time of vacuuming to obtain an organic EL element. However, on the way of the layer formation under vacuum, a different layer formation method may be inserted. When the different method is used, its process is required to be carried out under a dry inert gas atmosphere.

In the display of the present invention, the light emission layer only is formed using a shadow mask, and other layers are formed in a common method such as a vacuum evaporation method, a casting method, a spin coat method or a printing method.

Further, these layers may be prepared in the reverse order.

When a direct current voltage is used, a voltage of 2 to 40 V is applied to thus obtained display by setting the anode as a + polarity and the cathode as a − polarity, and light emission occurs. When voltage is applied with the reverse polarity, no current flows, and light is not emitted at all. When an alternating voltage is applied, light emission occurs only at the time when the polarity of the anode is "+" and that of the cathode is "−". The wave shape of the alternating current may be any one.

The display using the organic electroluminescent element of the present invention can be used as a display device, a display, or various light emission sources. The display device or the display, which employs three kinds of organic EL elements, an element emitting a blue light, an element emitting a red light and an element emitting a green light, can present a full color image.

Examples of the display device or the display include a television, a personal computer, a mobile device or an AV device, a display for text broadcasting, and an information display used in a car. The multicolor emission apparatus may be used as particularly a display for reproducing a still image or a moving image. When the apparatus is used as a display for reproducing a moving image, the driving method may be either a simple matrix (passive matrix) method or an active matrix method.

The illuminator of the present invention contains an organic EL element of the present invention and may be used for a illumination for household use, an illumination in a vehicle, a backlight of a watch, an advertisement signboard, a traffic light, a light source for an optical memory medium, a light source for an electrophotographic copier, a light source for an optical communication processor and a light source for a light sensor, however, the present invention is not limited thereto. It is also used for a backlight of a liquid crystal display.

The organic EL element of the present invention may be an organic EL element having a resonator structure.

The organic EL element having a resonator structure is applied to a light source for a photo memory medium, a light source for an electrophotographic copier, a light source for an optical communication processor, or a light source for a photo-sensor, but its application is not limited thereto. In the above application, a laser oscillation may be carried out.

The organic EL element of the present invention can be used as a lamp such as an illuminating lamp or a light source for exposure, as a projection device for projecting an image, or as a display for directly viewing a still image or a moving image. When the element is used in a display for reproducing a moving image, the driving method may be either a simple matrix (passive matrix) method or an active matrix method. The display can present a full color image, employing two or more kinds of organic EL elements each emitting light with a different color. A monochromatic color, for example, a white color can be converted to a full color of BGR, employing a color filter. Further, employing a color conversion filter, light color emitted from the organic EL element can be converted to another color or full color, where the λmax of the light emitted from the organic EL element is preferably not more than 480 nm.

One example of the display comprising the organic EL element of the present invention will be explained below employing Figures.

FIG. 1 is a schematic drawing of one example of a display comprising an organic EL element. FIG. 1 is a display such as that of a cellular phone, displaying image information due to light emission from the organic EL element.

A display 1 comprises a display section A having plural pixels and a control section B carrying out image scanning based on image information to display an image in the display section A.

The control section B is electrically connected to the display section A, transmits a scanning signal and an image data signal to each of the plural pixels based on image information from the exterior, and conducts image scanning which emits light from each pixel due to the scanning signal according to the image data signal, whereby an image is displayed on the display section A.

Figure 2:
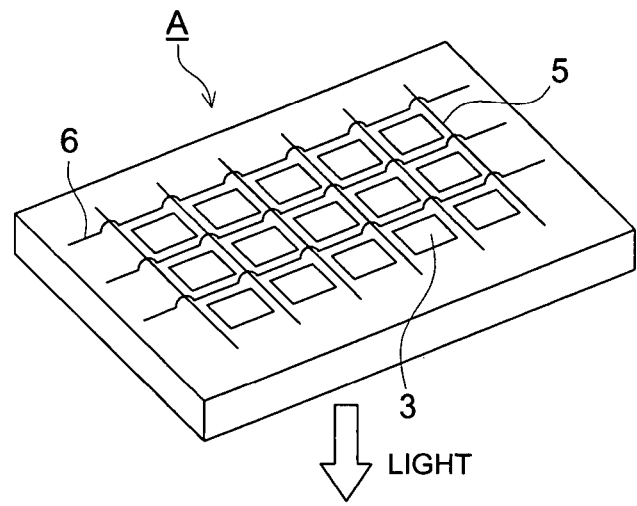
FIG. 2 is a schematic drawing of a display section.

FIG. 2 is a schematic drawing of a display section A.

The display section A comprises a glass substrate, plural pixels 3, and a wiring section containing plural scanning lines 5 and plural data lines 6. The main members of the display section A will be explained below. In FIG. 2, light from pixels 3 is emitted in the direction of an arrow.

The plural scanning lines 5 and plural data lines 6 are composed of an electroconductive material, the lines 5 and the lines 6 being orthogonally crossing with each, and connected with the pixels 3 at the crossed points (not illustrated).

The plural pixels 3, when the scanning signal is applied from the scanning lines 5, receive the data signal from the data lines 6, and emit light corresponding to the image data received. Provision of red light emission pixels, green light emission pixels, and blue light emission pixels side by side on the same substrate enables to display a full color image.

Next, an emission process of pixels will be explained.

Figure 3:
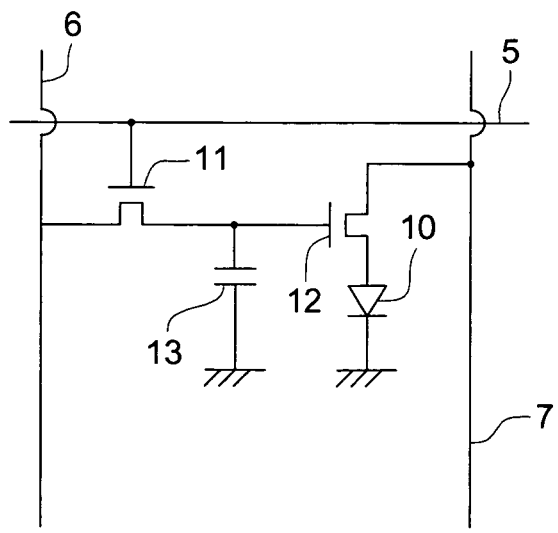
FIG. 3 is a schematic drawing of a pixel.

FIG. 3 is a schematic drawing of a pixel.

The pixel comprises an organic EL element 10, a switching transistor 11, a driving transistor 12, and a capacitor 13. When a pixel with a red light emission organic EL element, a pixel with a green light emission organic EL element, and a pixel with a blue light emission organic EL element are provided side by side on the same substrate, a full color image can be displayed.

In FIG. 3, an image data signal is applied through the data lines 6 from the control section B to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is turned on since the capacitor 13 maintains a charged potential of image data signal, and light emission from the organic EL element 10 continues until the next scanning signal is applied. When the next scanning signal is applied according the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be an emission with plural gradations according to image signal data of multiple value having plural gradation potentials, or an emission due to on-off according to a binary value of the image data signals.

The electric potential of the capacitor 13 may maintain till the next application of the scanning signal, or may be discharged immediately before the next scanning signal is applied.

In the present invention, light emission may be carried out employing a passive matrix method as well as the active matrix method as described above. The passive matrix method is one in which light is emitted from the organic EL element according to the data signal only when the scanning signals are scanned.

FIG. 4 is a schematic drawing of a display employing a passive matrix method.

When scanning signal is applied to scanning line 5 according to successive scanning, pixel 3 connecting the scanning line 5 emits according to the image data signal. The passive matrix method has no active element in the pixel 3, which reduces manufacturing cost of a display.

EXAMPLES

The present invention will be explained in the following examples, but is not limited thereto.

Example 1

Preparation and Evaluation of Organic EL Element Samples 1-1 through 1-29

A pattern was formed on a substrate (manufactured by NH Technoglass Co., Ltd.) on which a 100 nm ITO (indium tin oxide) was provided to prepare an anode. Then the resulting transparent substrate having the ITO transparent electrode was subjected to ultrasonic washing in isopropyl alcohol and dried by a dry nitrogen gas and subjected to UV-ozone cleaning for 5 minutes.

Thus obtained transparent substrate was fixed on a substrate holder of a vacuum evaporation apparatus available on the market. Next, α-NPD, CBP, Ir-1, BC and $Alq_3$ were independently put into five resistive heating molybdenum boats, and the boats were set in the vacuum evaporation apparatus.

After pressure in the vacuum tank was reduced to $4 \times 10^{-4}$ Pa, α-NPD was deposited on to the transparent substrate to form a hole injecting and transporting layer of a thickness of 20 nm. After that, the boat carrying CBP and the boat carrying Ir-1 were heated by independently supplying electric current to obtain a depositing speed ratio of CBP to Ir-1 being 100 to 7 and the light emission layer having a thickness of 30 nm was obtained.

Subsequently, BC was deposited to form a hole blocking layer of 10 nm thickness followed by depositing $Alq_3$ to obtain an electron transporting layer of 40 nm thickness.

Then the vacuum tank was opened, and the electron transporting layer was covered with a rectangular stainless steel mask having holes. The pressure of the vacuum tank was again reduced to $4 \times 10^{-4}$ Pa and a 0.5 nm thick lithium fluoride and a 110 nm thick aluminum layer was deposited to form a cathode. Thus, organic EL element sample 1-1 was prepared.

Organic EL element samples 1-2 through 1-29 were prepared in the same manner as organic EL element sample 1-1, except that CBP in the light emission layer was replaced by one of the compounds listed in Table 1.

Figure 5A:
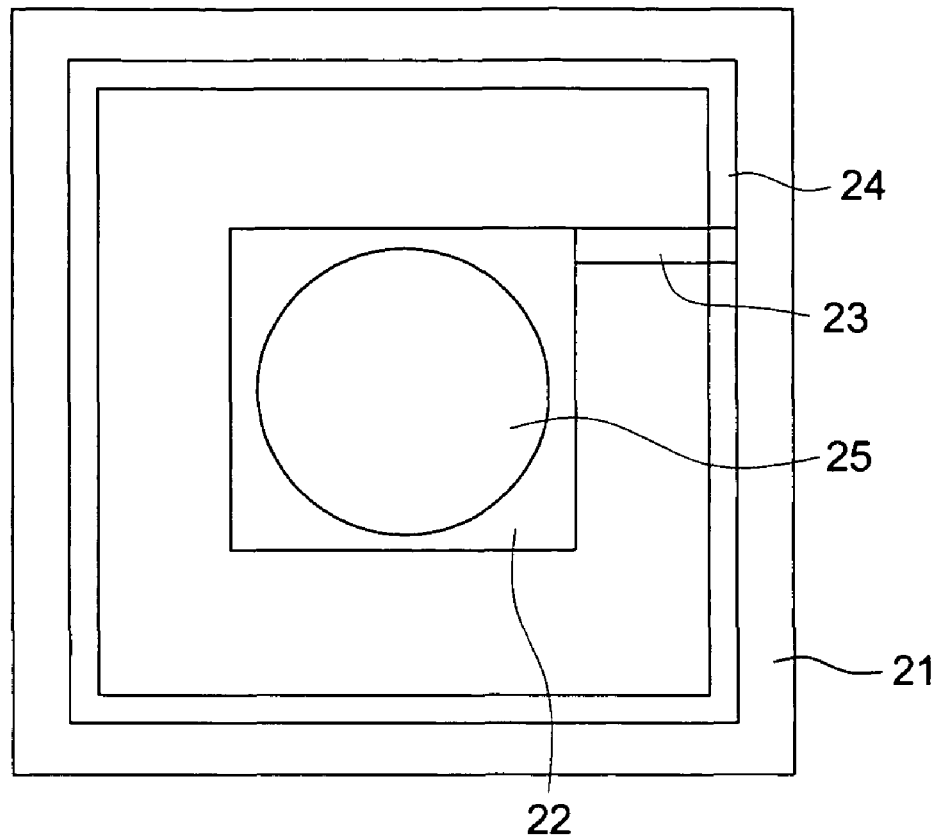
FIGS. 5(a) and 5(b) are schematic drawings of an organic EL element having a sealing structure.
Figure 5B:
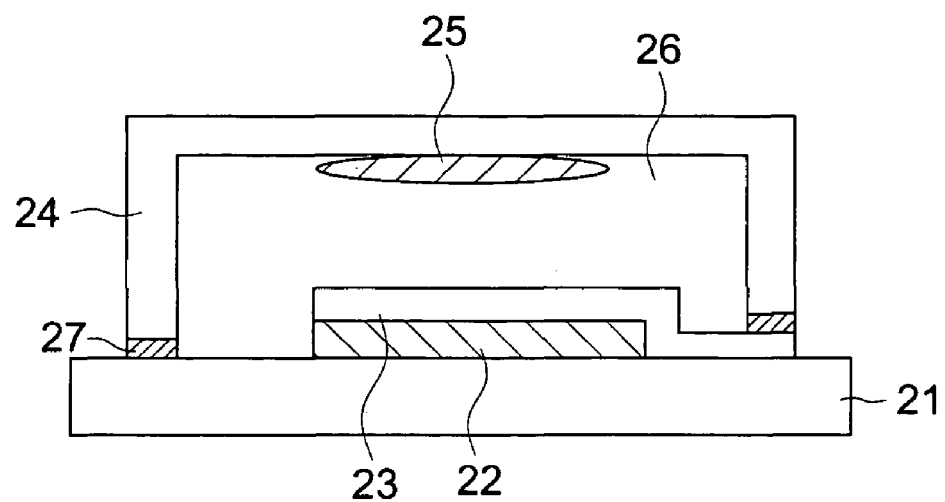

Thus prepared organic EL element samples 1-1 through 1-29 were transferred to a nitrogen atmosphere glove box (containing pure nitrogen of which the purity is more than 99.999%) without contacting air and subjected to a sealing treatment to form a sealed structure shown in FIGS. 5(*a*) and 5(*b*). As a water retention agent: barium oxide 25, high purity barium oxide produced by Aldrich was preliminary adhered to a glass sealing pan with a half-permeable fluorocarbon resin membrane (MIKUROTEKKUSU S—NTF8031Q produced by NITTO DENKO) provided with an adhesive and used in the sealed structure. In order to prepared an organic EL element having a sealed structure, an UV curable adhesive 27 was used to adhere the sealing pan to the organic EL element by irradiating UV rays. In the figure, 21 represents a glass substrate having a transparent electrode, 22 represents an aforementioned organic EL element containing a hole injecting and a transporting layer, a light emission layer, a hole blocking layer, an electron transporting layer and a cathode buffer layer. 23 represents a cathode.

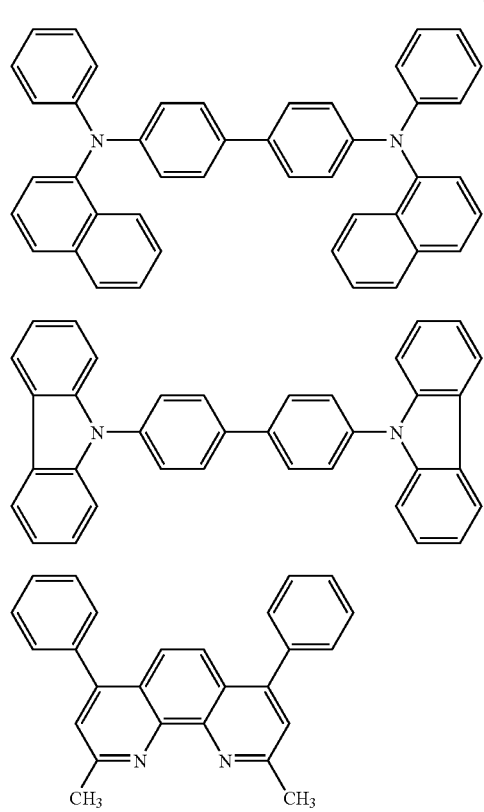
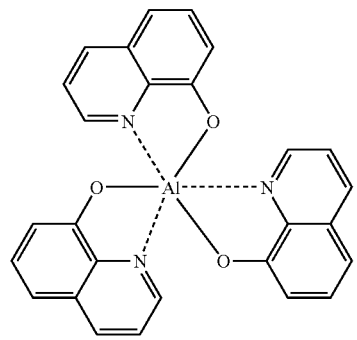
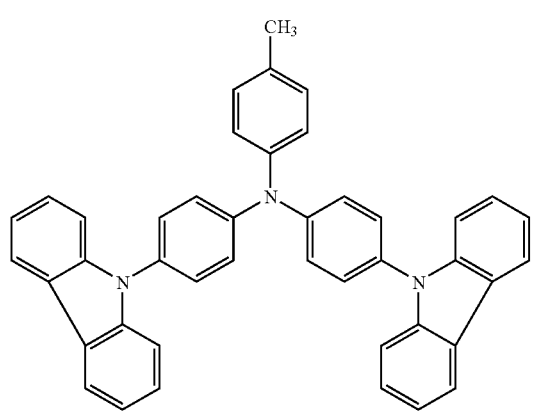
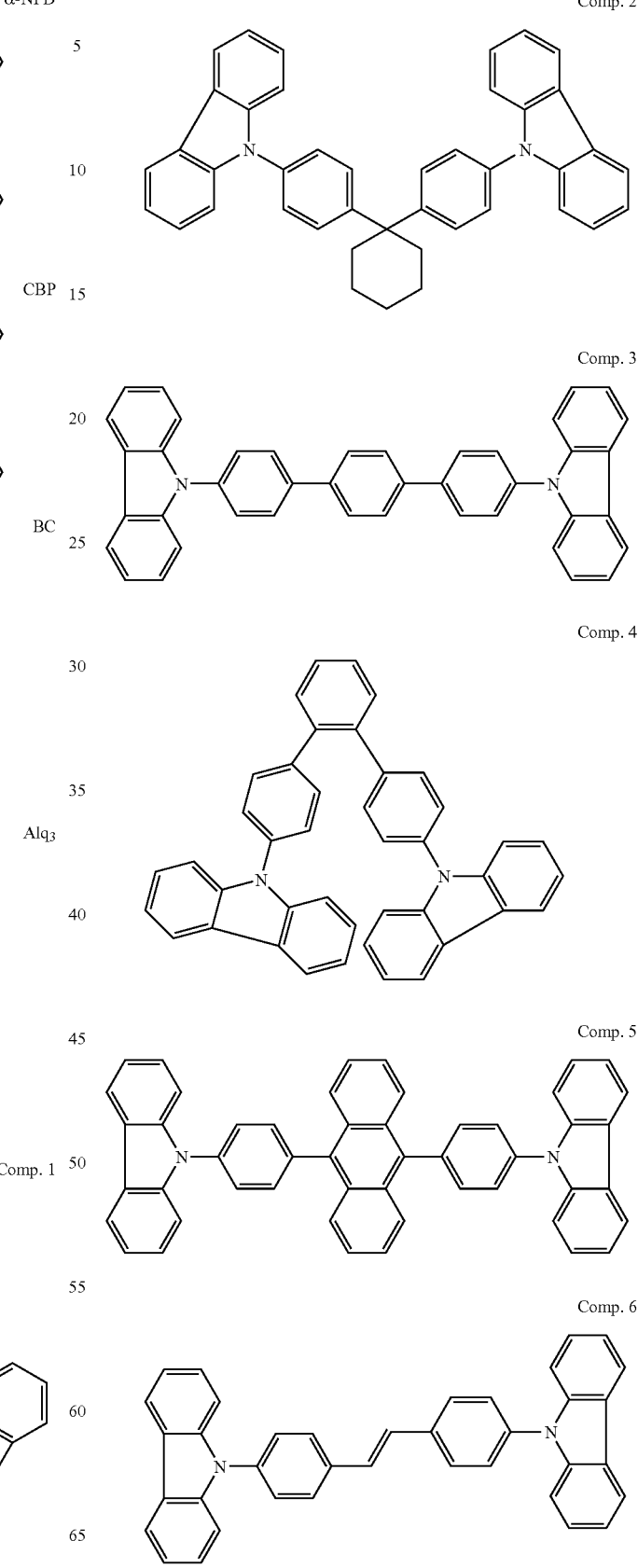

-continued

Comp. 7

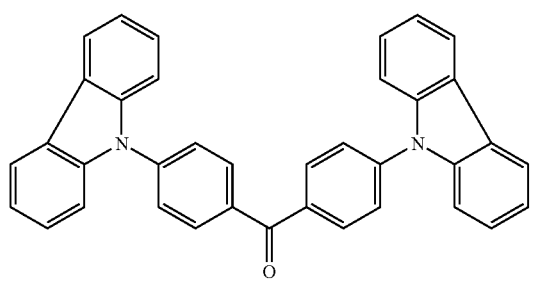

Comp. 8

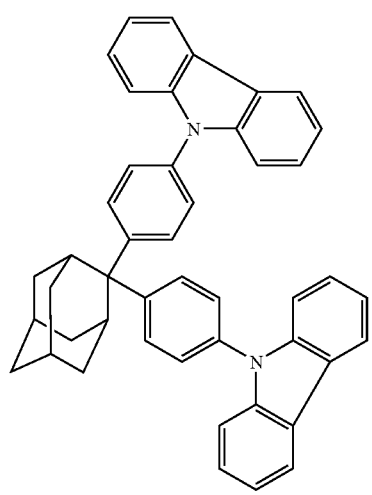

Comp. 9

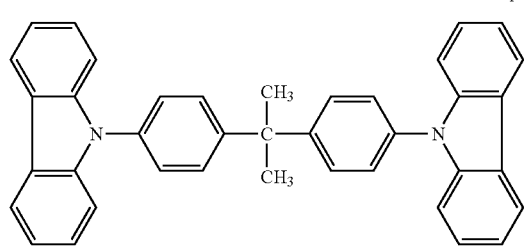

Comp. 10

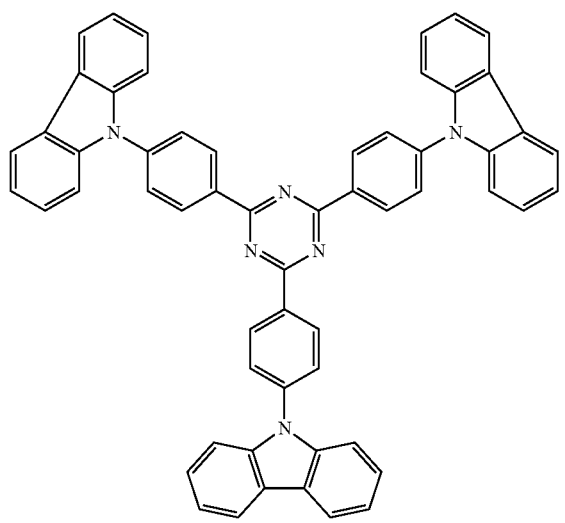

The organic EL element samples 1-1 through 1-29 obtained as above was evaluated according to the following criteria.

<Emission Intensity>

Electric current of 2.5 mA/cm² was supplied to each prepared organic EL element at 23° C. in an atmosphere of a dry nitrogen gas to measure an emission intensity. A spectral radiance meter CS-2000 produced by Minolta Co., Ltd was used to measure an emission intensity.

Electric current of 2.5 mA/cm² was supplied to each sample at 23° C. in an atmosphere of a dry nitrogen gas to measure an external quantum efficiency (%) of each sample. A spectral radiance meter CS-2000 produced by Minolta Co., Ltd was also used to measure an external quantum efficiency (%) of each sample.

<Half-Life Period>

A period in which an initial emission intensity of an organic EL element decreased to half of it was defined as a half-life period (τ 0.5) and used as an index of the life of an organic EL element, the emission intensity being measured by supplying a constant electric current of 2.5 mA/cm² at 23° C. in an atmosphere of a dry nitrogen gas. A spectral radiance meter CS-2000 produced by Minolta Co., Ltd was also used to measure a half-life period of an organic EL element.

<Heat Resistance>

Current of 2.5 mA/cm² was passed through a prepared organic EL element at 23° C. under a dried nitrogen gas flow and emission intensity (L) was measured and this value was represented as an initial emission intensity (L0). Then, the organic EL element was kept for 500 hours in a 85° C. thermostatic chamber. At 500 hours after the EL element was cooled down to 23° C., the emission intensity was measured again (L500), and an emission intensity degrading rate was calculated using the following equation:

Emission intensity degrading rate(%)=(((L0)−(L500))/(L0))×100

Results were summarized in Table 1 in which each of emission intensity, external quantum efficiency, emission life was given by a relative value when each of emission intensity, external quantum efficiency, emission life of the organic EL element sample 1-1 was represented as 100.

TABLE 1

| Organic EL element sample No. | Light emission layer Host compound | Light emission layer Molecular weight | Emission intensity | External quantum efficiency | Half-life period | Emission intensity degrading rate | Remarks |
|---|---|---|---|---|---|---|---|
| 1-1 | CBP | 456.6 | 100 | 100 | 100 | 100 | Comp. |
| 1-2 | Comp. 1 | 589.7 | 78 | 71 | 104 | 220 | Comp. |
| 1-3 | Comp. 2 | 566.7 | 72 | 62 | 101 | 140 | Comp. |
| 1-4 | Comp. 3 | 560.7 | 82 | 75 | 102 | 96 | Comp. |
| 1-5 | Comp. 4 | 560.7 | 88 | 77 | 60 | 112 | Comp. |
| 1-6 | Comp. 5 | 660.8 | 52 | 68 | 101 | 84 | Comp. |
| 1-7 | Comp. 6 | 510.6 | 66 | 65 | 70 | 124 | Comp. |
| 1-8 | Comp. 7 | 512.6 | 62 | 66 | 74 | 168 | Comp. |
| 1-9 | Comp. 8 | 619.8 | 85 | 88 | 98 | 60 | Comp. |
| 1-10 | Comp. 9 | 526.7 | 84 | 92 | 55 | 64 | Comp. |
| 1-11 | Comp. 10 | 805.0 | 81 | 79 | 98 | 76 | Comp. |
| 1-12 | H-1 | 498.6 | 113 | 109 | 130 | 88 | Comp. |
| 1-13 | H-6 | 574.7 | 122 | 113 | 123 | 24 | Inv. |
| 1-14 | H-7 | 590.8 | 119 | 110 | 124 | 32 | Inv. |
| 1-15 | H-11 | 844.1 | 118 | 111 | 138 | 16 | Inv. |
| 1-16 | H-13 | 1099.4 | 121 | 112 | 139 | 12 | Inv. |
| 1-17 | H-14 | 1175.5 | 123 | 109 | 120 | 16 | Inv. |
| 1-18 | H-15 | 1217.6 | 117 | 106 | 107 | 8 | Inv. |
| 1-19 | H-17 | 1515.9 | 118 | 107 | 106 | 12 | Inv. |
| 1-20 | H-18 | 648.8 | 120 | 112 | 102 | 20 | Inv. |
| 1-21 | H-20 | 510.6 | 118 | 109 | 124 | 24 | Inv. |
| 1-22 | H-25 | 638.8 | 119 | 109 | 123 | 12 | Inv. |
| 1-23 | H-28 | 512.7 | 121 | 108 | 138 | 24 | Inv. |
| 1-24 | H-35 | 526.7 | 119 | 111 | 122 | 40 | Inv. |
| 1-25 | H-49 | 680.8 | 124 | 112 | 120 | 44 | Inv. |
| 1-26 | H-51 | 955.2 | 121 | 115 | 119 | 4 | Inv. |
| 1-27 | H-53 | 1610.8 | 115 | 107 | 120 | 12 | Inv. |
| 1-28 | H-55 | 588.8 | 118 | 113 | 140 | 20 | Inv. |
| 1-29 | H-56 | 664.8 | 123 | 112 | 122 | 8 | Inv. |

Comp.: Comparative sample,
Inv.: This invention

Table 1 reveals that the organic EL element of the present invention exhibit superior properties in each of emission intensity, external quantum efficiency, and emission life compared to those of comparative samples. From the results of the heat resistance measurement, the organic EL element of the present invention has found to exhibit a superior emission intensity property even after keeping under a higher temperature.

Organic EL element samples 1-1B through 1-29B were prepared in the same manner except that Ir-1 was replaced by Ir-12, and organic EL element samples 1-1R through 1-29R were prepared in the same manner except that Ir-1 was replaced by Ir-9. Each of these organic EL elements exhibited the same properties as those of an organic EL element using Ir-1. Blue emission was observed from the organic EL elements using Ir-12, and Red emission was observed from the elements using Ir-9.

Example 2

Preparation and Evaluation of Organic EL Element Samples 2-1 through 2-14

Organic EL element samples 2-1 through 2-14 were prepared in the same manner except that CBP in the light emission layer and BC in the hole blocking layer were replaced by the compounds listed in Table 2.

Each of organic EL element samples 2-1 through 2-14 was subjected to the measurements of emission intensity and half-life period which were the same as those carried out in Example 1. The results were shown in Table 2.

Each of the results was given by a relative value when each of emission intensity, external quantum efficiency, half-life period of the organic EL element sample 2-1 was represented as 100.

TABLE 2

| Organic EL element sample No. | Light emission layer Host compound | Light emission layer Molecular weight | Hole blocking compound | Emission Intensity | External quantum efficiency | Half-life period | Remarks |
|---|---|---|---|---|---|---|---|
| 2-1 | CBP | 456.6 | BC | 100 | 100 | 100 | Comp. |
| 2-2 | CBP | 456.6 | B-1 | 106 | 104 | 111 | Comp. |
| 2-3 | H-1 | 498.6 | BC | 113 | 109 | 113 | Comp. |
| 2-4 | H-1 | 498.6 | B-1 | 117 | 116 | 141 | Inv. |
| 2-5 | H-1 | 498.6 | B-7 | 119 | 120 | 138 | Inv. |

TABLE 2-continued

| Organic EL element sample No. | Light emission layer Host compound | Molecular weight | Hole blocking compound | Emission Intensity | External quantum efficiency | Half-life period | Remarks |
|---|---|---|---|---|---|---|---|
| 2-6 | H-1 | 498.6 | B-8 | 117 | 114 | 140 | Inv. |
| 2-7 | H-1 | 498.6 | B-9 | 121 | 117 | 146 | Inv. |
| 2-8 | H-1 | 498.6 | B-10 | 123 | 118 | 145 | Inv. |
| 2-9 | H-1 | 498.6 | B-10 | 121 | 115 | 142 | Inv. |
| 2-10 | H-13 | 1099.4 | B-10 | 122 | 116 | 141 | Inv. |
| 2-11 | H-25 | 638.8 | B-10 | 120 | 111 | 132 | Inv. |
| 2-12 | H-43 | 655.9 | B-10 | 122 | 121 | 135 | Inv. |
| 2-13 | H-9 | 664.8 | B-14 | 120 | 119 | 147 | Inv. |
| 2-14 | H-62 | 914.2 | B-29 | 119 | 120 | 145 | Inv. |

Comp.: Comparative sample,
Inv.: This invention

Table 2 reveals that organic EL element samples 2-4 through 2-14 of the present invention exhibit superior properties in each of emission intensity, external quantum efficiency, and half-life period compared to those of organic EL element samples 2-1 through 2-3 in which comparative compounds are used.

Organic EL element samples 2-1B through 2-12B were prepared in the same manner except that the phosphorescent compound Ir-1 was replaced by Ir-12, and organic EL element samples 2-1R through 2-12R were prepared in the same manner except that Ir-1 was replaced by Ir-9. Each of these organic EL elements exhibited the same properties as those of an organic EL element using Ir-1. Blue emission was observed from the organic EL elements using Ir-12, and red emission was observed from the elements using Ir-9.

<Full Color Display>

(Blue Light Emission Organic EL Element)

Organic EL element 1 to 13B prepared in Example 1 was used.

(Green Light Emission Organic EL Element)

Organic EL element 1-13 prepared in Example 1 was used.

(Red Light Emission Organic EL Element)

Organic EL element 1 to 13R prepared in Example 1 was used.

Above mentioned red, green and blue light emission organic EL elements were provided side by side on the same substrate. Thus, a full color image display according to an active matrix system was obtained which had a structure as shown in FIG. 1. FIG. 2 is a schematic drawing of a display section A of the full color image display prepared above. The displaying section comprises a base plate, and provided thereon, plural pixels 3 (including blue light emission pixels, green light emission pixels, and red light emission pixels) and a wiring section including plural scanning lines 5 and plural data lines 6. The plural scanning lines 5 and plural data lines 6 each are composed of electroconductive material. The plural scanning lines 5 and plural data lines 6 were orthogonally crossed with each other, and connected with the pixels 3 at the crossed points (not illustrated in detail). Each of the plural pixels 3, which contains an organic EL element corresponding to the respective color, a switching transistor as an active element, and a driving transistor, is driven according to an active matrix system. The plural pixels 3, when scanning signal is applied from the scanning lines 5, receives the image data signal from the data lines 6, and emits light corresponding to the image data received. A full color image can be displayed by a red light emission pixel, a green light emission pixel, and a blue light emission pixel, each suitably arranged on the base plate.

A full color clear moving image with a high emission intensity and a long half-life period was obtained by driving the full color image display prepared above.

Example 4

Example of a Illuminator, Using Organic EL Element of White Emission

Figure 6:
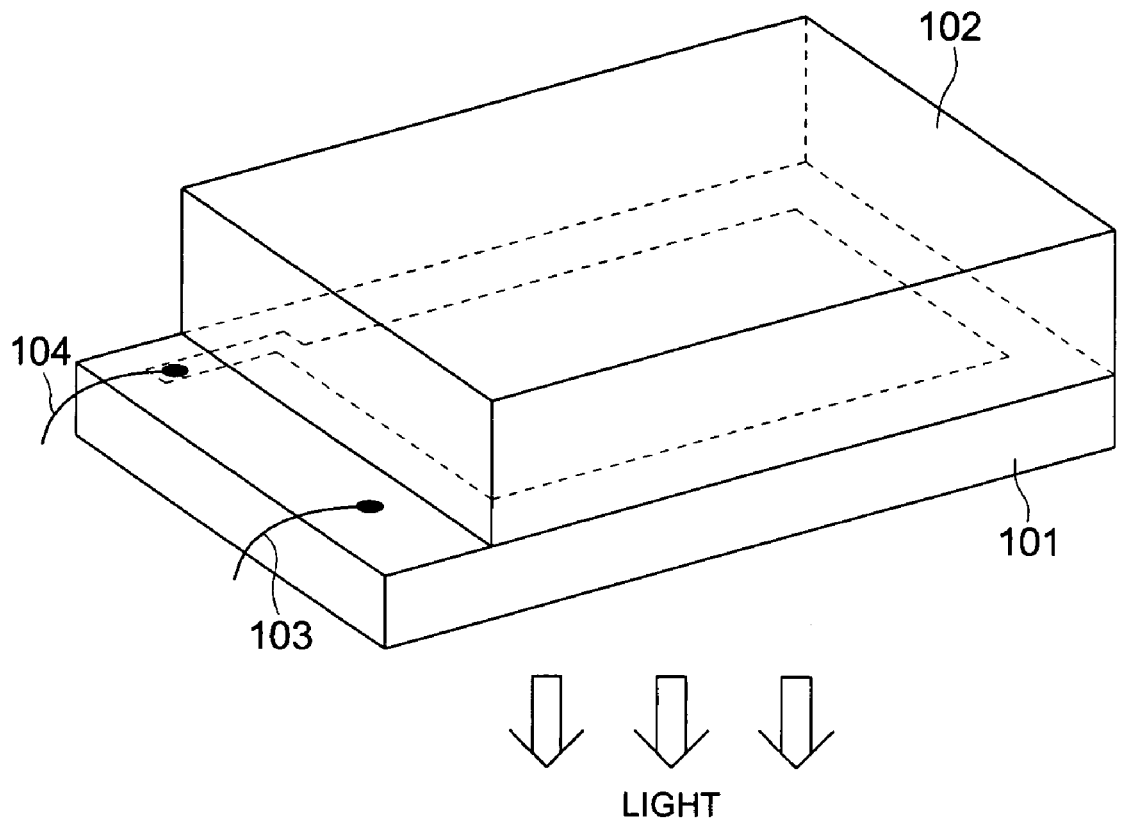
FIG. 6 is a schematic drawing of an illuminator.
Figure 7:
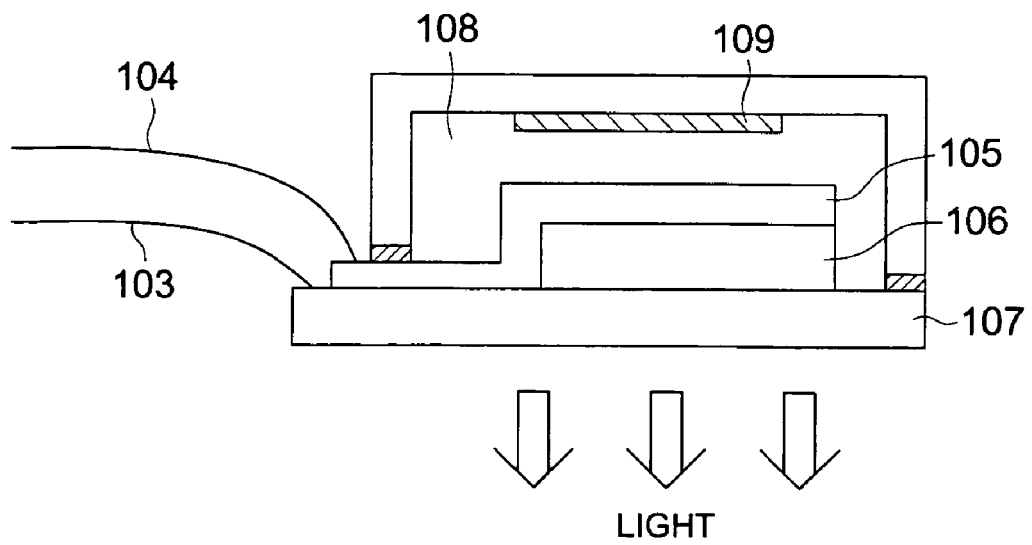
FIG. 7 is a cross-section view of an illuminator.

Organic EL element sample 2-9W was prepared in the same manner except that Ir-1 used in the light emission layer of organic EL element sample 2-9 was replaced by a mixture of Ir-1, Ir-9 and Ir-12. An illuminator was obtained by covering the non-emitting surface of organic EL element sample 2-9W with a glass case. This illuminator was found to be a thin illuminator emitting white light of high emission efficiency and a long life. FIG. 6 is a schematic view of the illuminator, and FIG. 7 is a cross-section of the illuminator. An organic EL element 101 was covered by a glass cover 102, followed by being connected with a lead wire (anode) 103 and a lead wire (cathode) 104. 105 is an anode and 106 is an organic EL layer. Inside of the glass cover was filled with nitrogen gas 108 and a water retention agent 109 is provided.

What is claimed is:

1. An organic electroluminescent element comprising a light emission layer and a hole blocking layer adjacent to the light emission layer, wherein:
   (i) the light emission layer contains a compound having a partial structure represented by Formula (1) and having a molecular weight of not more than 1700; and
   (ii) the hole blocking layer contains a compound represented by a formula selected from the group consisting of Formulas (2)-(10), and compounds 152 and 153, Formula (1)

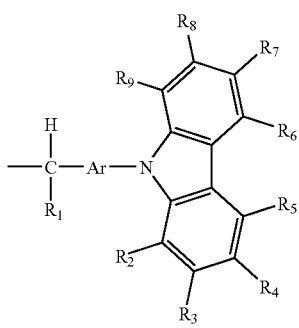

Formula (4)

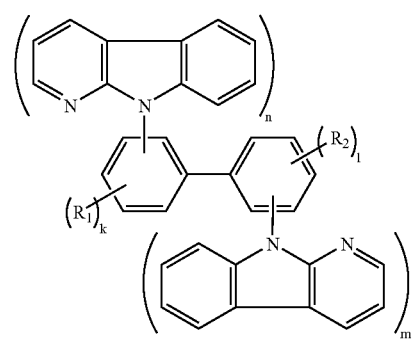

wherein:
Ar represents a divalent group selected from a p-phenylene group which may have a methyl group, a phenyl group or a —F group as a substituent, a naphthalene diyl group, a biphenyl diyl group which may further have a phenyl group as a substituent, a terphenyl diyl group, a pyridine diyl group, a thiophene diyl group or a pyradine diyl group;

$R_2$-$R_9$ independently represent a hydrogen atom or a substituent selected from a methyl group, a methoxy group, a cyano group, a —F group or a phenyl group further having a phenyl group which may have a methyl group or a carbazolyl group as a substituent; and $R_1$ represents a hydrogen atom, a methyl group which may have a phenyl group as a substituent, an ethyl group, an isopropyl group, a trifluoro methyl group or a cyclohexyl group, Formula (2)

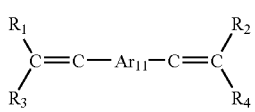

wherein:
$R_1$ and $R_2$ each represent a hydrogen atom; and
n and m each represent 1 and k and l each represent 4, Formula (5)

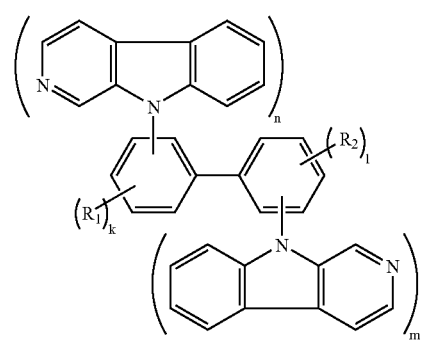

wherein:
$R_1$, $R_2$, $R_3$ and $R_4$ independently represent a phenyl group which may have a methyl group or a methoxy group as a substituent, a biphenyl group or a pyridyl group; and
$Ar_{11}$ represents an arylene group selected from a p-phenylene group or a biphenyl diyl group which may have a methyl group as a substituent, Formula (3)

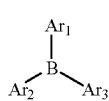

wherein:
$R_1$ and $R_2$ independently represent a hydrogen atom or a phenyl group; and
n and m each represent 1 and k and l each represent 4, Formula (6)

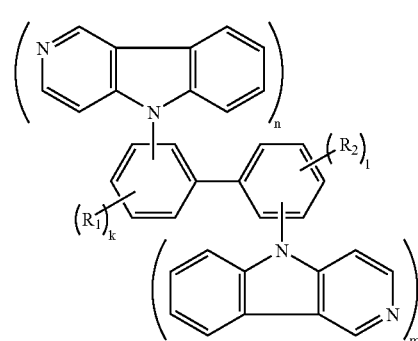

wherein $Ar_1$ to $Ar_3$ independently represent an aryl group selected from a phenyl group having at least a methyl group, a phenyl group or a terphenyl group as a substituent, or a pyridyl group having a methyl group and a biphenyl group as substituents, wherein:
$R_1$ and $R_2$ independently represent a hydrogen atom or a methyl group; and
n and m each represent 1 and k and l each represent 4, Formula (7)

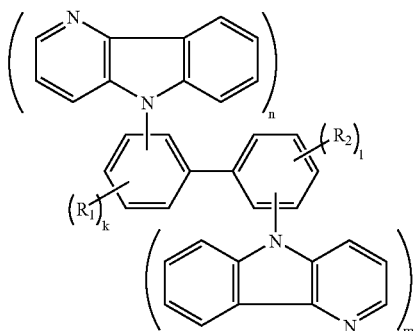

wherein:
$R_1$ and $R_2$ independently represent a hydrogen atom or a substituent selected from a methyl group or a phenyl group; and
n and m each represent 1 and k and l each represent 4, Formula (8)

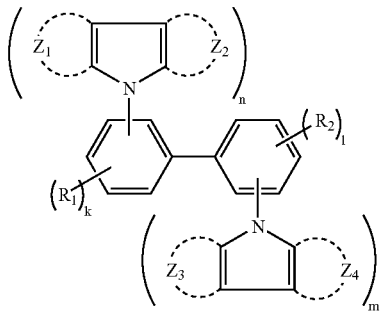

wherein:
$R_1$ and $R_2$ each represent a hydrogen atom;
n and m each represent 1 and k and l each represent 4, and
$Z_1$, $Z_2$, $Z_3$ and $Z_4$ independently represent a group of atoms necessary to form a benzene ring further having a phenyl group as a substitute or a pyridine ring which may have a phenyl group as a substituent, Formula (9)

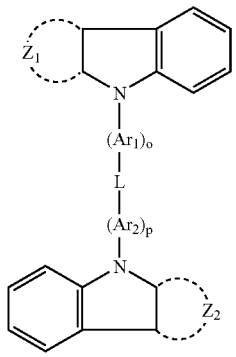

wherein
o and p each represent 1;
$Ar_1$ and $Ar_2$ independently represent a p-phenylene group, a biphenyldiyl group or a 2,5-pyridine diyl group;
$Z_1$ and $Z_2$ independently represent a group of atoms necessary to form a pyridine ring or a pyrimidine ring; and
L represents a divalent connecting group selected from —CH$_2$—, —CH$_2$—CH$_2$—, —CH$_2$-(Ph)-CH$_2$—, —CH$_2$-(Ph)-(Ph)-CH$_2$—, —CH$_2$-(Py)-(Py)-CH$_2$—, —C(CH$_3$)$_2$-(Ph)-(CH$_3$)$_2$—, —C(CF$_3$)$_2$—, or a divalent group representable by L in Formula (9) of any one of compounds B-22, 138, 139, 141, 142, 147 and 148, (Ph) representing a p-phenylene group and (Py) representing a 2,5-pyridine diyl group, Formula (10)

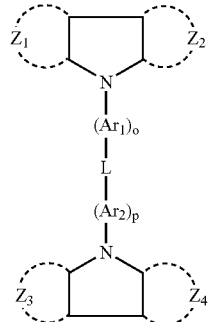

wherein:
o and p each represent 1;
$Ar_1$ and $Ar_2$ independently represent a p-phenylene group, a biphenyldiyl group or a 2,5-pyridine diyl group;
$Z_1$, $Z_2$, $Z_3$ and $Z_4$ each represent a group of atoms necessary to form a pyridine ring; and
L represents a divalent connecting group selected from —CH$_2$—, —CH$_2$—CH$_2$—, —CH$_2$-(Ph)-CH$_2$—, —CH$_2$-(Ph)-(Ph)-CH$_2$—, —CH$_2$-(Py)-(Py)-CH$_2$—, —C(CF$_3$)$_2$—, or a divalent group representable by L in Formula (10) of any one of compounds 137 and 140, (Ph) representing a p-phenylene group and (Py) representing a 2,5-pyridine diyl group,

152

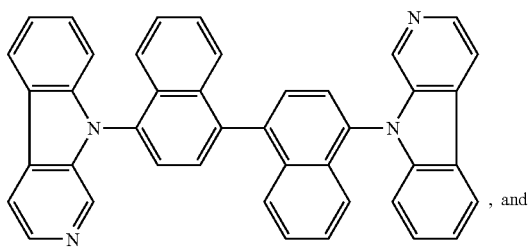

, and

153

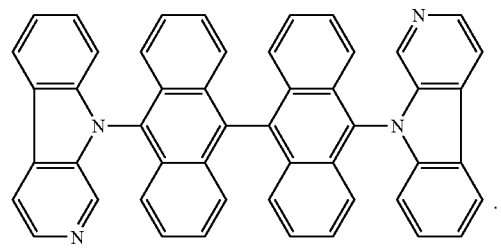

.

2. The organic electroluminescent element of claim 1, wherein Ar in Formula (1) represents a phenyl group.

3. The organic electroluminescent element of claim 1, wherein $R_1$ in Formula (1) represents a hydrogen atom.

4. The organic electroluminescent element of claim 1, wherein the light emitting layer contains a phosphorescent compound.

5. The organic electroluminescent element of claim 4, wherein the phosphorescent compound is a complex of osmium, iridium, rhodium or platinum.

6. The organic electroluminescent element of claim 1, wherein light emitted from the element is a white light.

7. A display comprising the organic electroluminescent element of claim 1.

8. An illuminator comprising the organic electroluminescent element of claim 1.

9. A display comprising the illuminator of claim 8, and a liquid crystal element as a displaying means.

10. The organic electroluminescent element of claim 1, wherein the hole blocking layer contains a carboline derivative in which at least one of carbon atoms of a carboline moiety is replaced by a nitrogen atom, represented by Formula (8).

11. The organic electroluminescent element of claim 1, wherein the hole blocking layer contains a boron derivative represented by Formula (3).

12. An organic electroluminescent element comprising a light emission layer and a hole blocking layer adjacent to the light emission layer, wherein:
   (i) the light emission layer contains a compound having a partial structure represented by following Formula (1a) and having a molecular weight of not more than 1700; and
   (ii) the hole blocking layer contains a compound represented by a formula selected from the group consisting of Formulas (2)-(10), and compounds 152 and 153, Formula (1a)

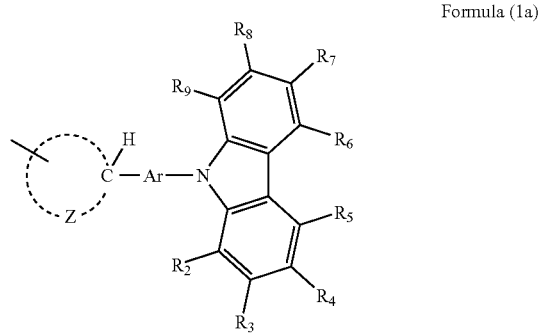

wherein:
Ar represents a p-phenylene group;
$R_2$-$R_9$ each represent a hydrogen atom; and
Z represents an group of atoms which form a cyclohexane ring, Formula (2)

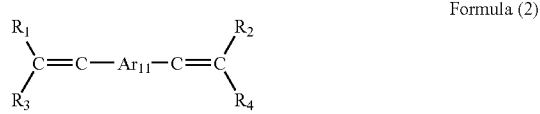

wherein:
$R_1$, $R_2$, $R_3$ and $R_4$ independently represent a phenyl group which may have a methyl group or a methoxy group as a substituent, a biphenyl group or a pyridyl group; and
$Ar_{11}$ represents an arylene group selected from a p-phenylene group or a biphenyl diyl group which may have a methyl group as a substituent, Formula (3)

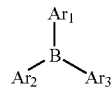

wherein $Ar_1$ to $Ar_3$ independently represent an aryl group selected from a phenyl group having at least a methyl group, a phenyl group or a terphenyl group as a substituent, or a pyridyl group having a methyl group and a biphenyl group as substituents, Formula (4)

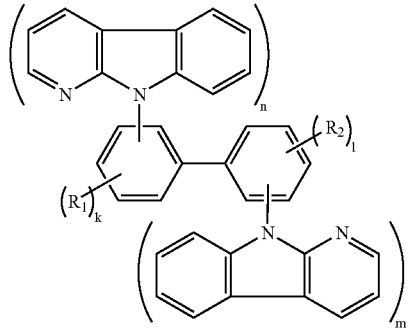

wherein:
$R_1$ and $R_2$ each represent a hydrogen atom; and
n and m each represent 1 and k and l each represent 4, Formula (5)

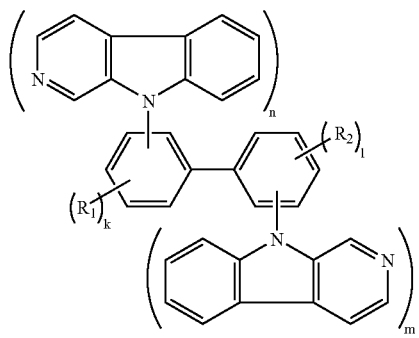

wherein:
$R_1$ and $R_2$ independently represent a hydrogen atom or a phenyl group; and
n and m each represent 1 and k and l each represent 4, Formula (6)

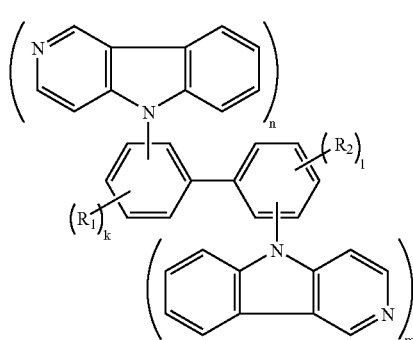

wherein:
$R_1$ and $R_2$ independently represent a hydrogen atom or a methyl group; and
n and m each represent 1 and k and l each represent 4,

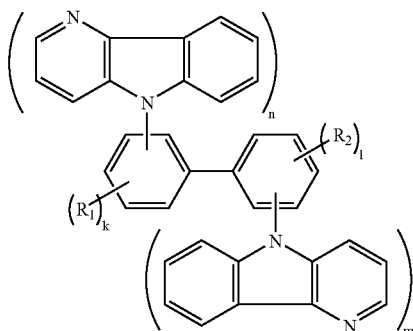

Formula (7)

wherein:
R$_1$ and R$_2$ independently represent a hydrogen atom or a substituent selected from a methyl group or a phenyl group; and
n and m each represent 1 and k and l each represent 4, Formula (8)

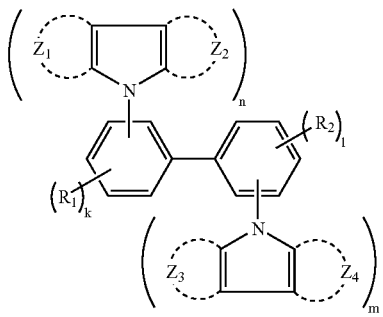

wherein:
R$_1$ and R$_2$ each represent a hydrogen atom;
n and m each represent 1 and k and l each represent 4, and
Z$_1$, Z$_2$, Z$_3$ and Z$_4$ independently represent a group of atoms necessary to form a benzene ring further having a phenyl group as a substitute or a pyridine ring which may have a phenyl group as a substituent, Formula (9)

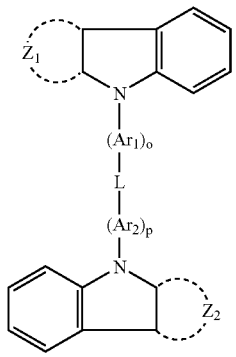

wherein
o and p each represent 1;
Ar$_1$ and Ar$_2$ independently represent a p-phenylene group, a biphenyldiyl group or a 2,5-pyridine diyl group;
Z$_1$ and Z$_2$ independently represent a group of atoms necessary to form a pyridine ring or a pyrimidine ring; and
L represents a divalent connecting group selected from —CH$_2$—, —CH$_2$—CH$_2$—, —CH$_2$-(Ph)-CH$_2$—, —CH$_2$-(Ph)-(Ph)-CH$_2$—, —CH$_2$-(Py)-(Py)-CH$_2$—, —C(CH$_3$)$_2$-(Ph)-(CH$_3$)$_2$—, —C(CF$_3$)$_2$—, or a divalent group representable by L in Formula (9) any one of compounds B-22, 138, 139, 141, 142, 147 and 148, (Ph) representing a p-phenylene group and (Py) representing a 2,5-pyridine diyl group, Formula (10)

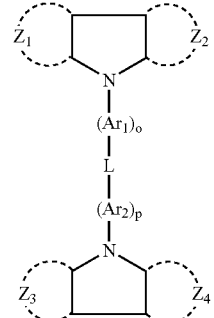

wherein:
o and p each represent 1;
Ar$_1$ and Ar$_2$ independently represent a p-phenylene group, a biphenyldiyl group or a 2,5-pyridine diyl group;
Z$_1$, Z$_2$, Z$_3$ and Z$_4$ each represent a group of atoms necessary to form a pyridine ring; and
L represents a divalent connecting group selected from —CH$_2$—, —CH$_2$—CH$_2$—, —CH$_2$-(Ph)-CH$_2$—, —CH$_2$-(Ph)-(Ph)-CH$_2$—, —CH$_2$-(Py)-(Py)-CH$_2$—, —C(CF$_3$)$_2$—, or a divalent group representable by L in Formula (10) of any one of compounds 137 and 140, (Ph) representing a p-phenylene group and (Py) representing a 2,5-pyridine diyl group,

152

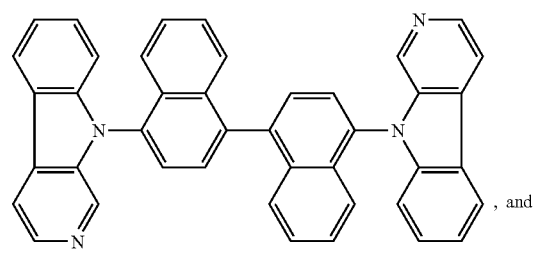

, and

153

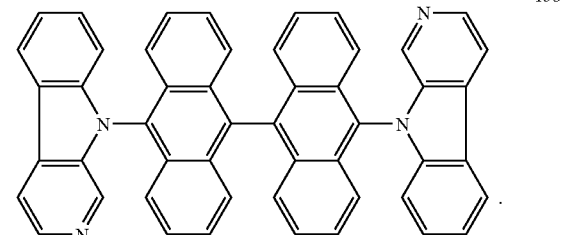

.

13. The organic electroluminescent element of claim 12, wherein the hole blocking layer contains a carboline derivative in which at least one of carbon atoms of a carboline moiety is replaced by a nitrogen atom, represented by Formula (8).

14. The organic electroluminescent element of claim 12, wherein the hole blocking layer contains a boron derivative represented by Formula (3).

* * * * *